(12) United States Patent
Homan et al.

(10) Patent No.: US 10,371,781 B2
(45) Date of Patent: Aug. 6, 2019

(54) GAIN-CORRECTED MEASUREMENTS

(75) Inventors: Dean M. Homan, Sugar Land, TX (US); Emmanuel Legendre, Sevres (FR); Reza Taherian, Sugar Land, TX (US); Jean Seydoux, Houston, TX (US); Eunmi Choi, Sugar Land, TX (US); Gerald N. Minerbo, Missouri City, TX (US); Sergiy Kryukov, Houston, TX (US); Robert C. Smith, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 1025 days.

(21) Appl. No.: 13/695,216

(22) PCT Filed: Apr. 27, 2011

(86) PCT No.: PCT/US2011/034126
§ 371 (c)(1),
(2), (4) Date: Apr. 12, 2013

(87) PCT Pub. No.: WO2011/139761
PCT Pub. Date: Nov. 10, 2011

(65) Prior Publication Data
US 2013/0191028 A1    Jul. 25, 2013

Related U.S. Application Data

(63) Continuation-in-part of application No. 12/434,888, filed on May 4, 2009, and a continuation-in-part of application No. 13/030,780, filed on Feb. 18, 2011.
(Continued)

(51) Int. Cl.
*G01V 3/18* (2006.01)
*G06F 15/00* (2006.01)
(Continued)

(52) U.S. Cl.
CPC ............. *G01R 35/005* (2013.01); *G01V 3/18* (2013.01); *G01V 3/28* (2013.01); *G06F 15/00* (2013.01); *G21F 3/00* (2013.01)

(58) Field of Classification Search
CPC ........ G01V 3/28; G01V 3/30; G01V 2200/00; G01V 1/50; G01V 13/00; G01V 1/28;
(Continued)

(56) References Cited

U.S. PATENT DOCUMENTS 4,357,660 A    11/1982  Hepp
4,536,714 A    8/1985   Clark
(Continued)

FOREIGN PATENT DOCUMENTS

CN    1407350 A      4/2003
CN    201099279 Y    8/2008
(Continued)

OTHER PUBLICATIONS

International Search Report and Written Opinion of PCT Application Serial No. PCT/US11/3412 dated Apr. 13, 2012.
(Continued)

*Primary Examiner* — John E Breene
*Assistant Examiner* — Jeffrey P Aiello

(57) ABSTRACT

A method to obtain gain-corrected measurements. A measurement tool having one or more arrays is provided, wherein the arrays include two co-located triaxial transmitters and two co-located triaxial receivers. Measurements are obtained using the transmitters and the receivers. Impedance matrices are formed from the obtained measurements and the impedance matrices are combined to provide gain-corrected measurements. The apparatus may alternatively be a while-drilling logging tool having one or more arrays, wherein each array comprises a transmitter, a receiver, and a buck, and wherein the signal received by the receiver is (Continued)

subtracted from the signal received by the buck or vice versa. A slotted shield may be incorporated into either embodiment of the tool. The slots may form one or more island elements. A material is disposed in the slots. The islands and shield body have complementary tapered sides that confine the islands within the shield body.

18 Claims, 48 Drawing Sheets

Related U.S. Application Data

(60) Provisional application No. 61/329,425, filed on Apr. 29, 2010.

(51) Int. Cl.
   *G01R 35/00* (2006.01)
   *G01V 3/28* (2006.01)
   *G21F 3/00* (2006.01)

(58) Field of Classification Search
   CPC ........ H01Q 1/04; H01Q 21/24; E21B 47/102; E21B 47/024; G06F 15/00
   USPC ..... 324/338, 339, 343, 333; 702/1, 7, 333, 6
   See application file for complete search history.

(56) References Cited

U.S. PATENT DOCUMENTS

| | | | |
|---|---|---|---|
| 4,675,611 A | 6/1987 | Chapman et al. | |
| 4,899,112 A | 2/1990 | Clark et al. | |
| 4,901,069 A | 2/1990 | Veneruso | |
| 5,278,550 A | 1/1994 | Rhein-Knudsen et al. | |
| 5,280,243 A | 1/1994 | Miller | |
| 5,316,451 A | 5/1994 | Hore et al. | |
| 5,585,790 A | 12/1996 | Luling | |
| 6,008,646 A | 12/1999 | Griffin et al. | |
| 6,181,138 B1 | 1/2001 | Hagiwara et al. | |
| 6,294,917 B1 | 9/2001 | Nichols | |
| 6,304,086 B1* | 10/2001 | Minerbo | G01V 3/28 324/338 |
| 6,373,248 B1 | 4/2002 | Poitzsch et al. | |
| 6,566,881 B2 | 5/2003 | Omeragic et al. | |
| 6,690,170 B2 | 2/2004 | Homan et al. | |
| 6,727,705 B2* | 4/2004 | Frey | E21B 43/086 324/338 |
| 6,788,065 B1 | 9/2004 | Homan et al. | |
| 6,900,640 B2 | 5/2005 | Fanini et al. | |
| 7,038,457 B2 | 5/2006 | Chen et al. | |
| 7,091,877 B2* | 8/2006 | Barber | G01V 3/28 324/338 |
| 7,093,672 B2 | 8/2006 | Seydoux et al. | |
| 7,239,145 B2 | 7/2007 | Homan et al. | |
| 7,414,391 B2* | 8/2008 | Homan | G01V 13/00 324/202 |
| 7,477,162 B2 | 1/2009 | Clark | |
| 7,733,093 B2* | 6/2010 | Homan | G01V 3/28 324/339 |
| 7,759,943 B2 | 7/2010 | Homan et al. | |
| 8,368,403 B2 | 2/2013 | Homan et al. | |
| 8,884,624 B2 | 11/2014 | Homan et al. | |
| 9,110,099 B2 | 8/2015 | Homan et al. | |
| 9,134,449 B2 | 9/2015 | Seydoux et al. | |
| 9,175,699 B2 | 11/2015 | Ishibashi et al. | |
| 2003/0004647 A1* | 1/2003 | Sinclair | G01V 3/28 702/7 |
| 2003/0155923 A1 | 8/2003 | Omeragic et al. | |
| 2004/0059515 A1 | 3/2004 | Kennedy | |
| 2004/0061622 A1 | 4/2004 | Clark | |
| 2004/0113609 A1* | 6/2004 | Homan | G01V 13/00 324/202 |
| 2005/0088181 A1* | 4/2005 | Barber | G01V 3/28 324/346 |
| 2005/0189947 A1* | 9/2005 | Haugland | G01V 3/30 324/338 |
| 2006/0011385 A1* | 1/2006 | Seydoux | G01V 3/28 175/61 |
| 2006/0043973 A1* | 3/2006 | Chen | G01V 3/30 324/339 |
| 2006/0084859 A1* | 4/2006 | Johnson | A61B 5/0507 600/407 |
| 2006/0145700 A1 | 7/2006 | Tabanou et al. | |
| 2006/0235618 A1 | 10/2006 | Wu et al. | |
| 2007/0137854 A1 | 6/2007 | Homan et al. | |
| 2007/0236221 A1 | 10/2007 | Merchant et al. | |
| 2007/0247330 A1 | 10/2007 | Clark | |
| 2008/0074336 A1 | 3/2008 | Signorelli et al. | |
| 2008/0136419 A1* | 6/2008 | Seydoux | G01V 3/28 324/333 |
| 2008/0143336 A1 | 6/2008 | Legendre et al. | |
| 2008/0224705 A1 | 9/2008 | Simon et al. | |
| 2008/0224707 A1 | 9/2008 | Wisler et al. | |
| 2009/0006053 A1* | 1/2009 | Carazzone | G01V 3/12 703/5 |
| 2009/0167309 A1* | 7/2009 | Homan | G01V 3/28 324/339 |
| 2009/0230968 A1* | 9/2009 | Bittar | E21B 47/024 324/338 |
| 2009/0309600 A1* | 12/2009 | Seydoux | G01V 3/30 324/338 |
| 2010/0185393 A1* | 7/2010 | Liang | G01V 3/28 702/7 |
| 2010/0277176 A1* | 11/2010 | Homan | E21B 47/102 324/333 |
| 2011/0133740 A1* | 6/2011 | Seydoux | G01V 3/28 324/338 |
| 2011/0140701 A1* | 6/2011 | Legendre | G01V 3/28 324/339 |
| 2011/0238312 A1* | 9/2011 | Seydoux | G01V 3/22 702/6 |

FOREIGN PATENT DOCUMENTS

| | | |
|---|---|---|
| EP | 1158138 A2 | 11/2001 |
| EP | 1321780 A1 | 6/2003 |
| EP | 1508361 A1 | 2/2005 |
| GB | 2290385 A | 12/1995 |
| GB | 2374936 A | 10/2002 |
| GB | 2404732 A | 2/2005 |
| WO | WO03025342 A2 | 3/2003 |
| WO | WO2008031505 A1 | 3/2008 |
| WO | 2009/02951 A2 | 3/2009 |
| WO | WO2009029517 A2 | 3/2009 |
| WO | WO2013060576 A1 | 5/2013 |

OTHER PUBLICATIONS

Chinese 4th Office Action for corresponding Chinese Patent Application Serial No. 201180025502.4, dated Jan. 4, 2017, 12 pages.
Canadian Examiner's Report for corresponding Canadian Patent Application Serial No. 2,797,683, dated Feb. 23, 2017, 4 pages.
International Preliminary Report on Patentabiltiy issued in International Application PCT/US2011/034126, dated Nov. 8, 2012. 8 pages.
First Office Action and Search Report issued in Chinese Patent Application 201510784206.2 dated Mar. 31, 2017. 14 pages.
Second Office Action and Search Report issued in Chinese Patent Application 201180025502.4 dated Oct. 28, 2015. 11 pages.
Examiner's Report issued in Canadian Patent Application 2701680 dated Apr. 13, 2016. 4 pages.
First Office Action and Search Report issued in Chinese Patent Application 201010170063.3 dated Aug. 2, 2013. 19 pages.
Second Office Action and Search Report issued in Chinese Patent Application 201010170063.3 dated Dec. 19, 2013. 11 pages.
Third Office Action issued in Chinese Patent Application 201010170063.3 dated Apr. 28, 2014. 9 pages.
Extended Search Report Rule 62 EPC issued in European Patent Application 10004420.5 dated Dec. 1, 2011. 12 pages.

(56) References Cited

OTHER PUBLICATIONS

Examination Report 94(3) EPC issued in European Patent Application 10004420.5 dated Dec. 19, 2013. 7 pages.
Examination Report 94(3) EPC issued in European Patent Application 10004420.5 dated Mar. 16, 2015. 6 pages.
Office Action issued in U.S. Appl. No. 12/434,888 dated Mar. 14, 2011. 16 pages.
Office Action issued in U.S. Appl. No. 12/434,888 dated Jul. 14, 2011. 18 pages.
Office Action issued in U.S. Appl. No. 12/434,888 dated Oct. 31, 2011. 20 pages.
Office Action issued in U.S. Appl. No. 13/750,766 dated Aug. 22, 2013. 21 pages.
Office Action 46049 issued in Mexican Patent Application MX/a/2010/004656 dated Jun. 10, 2014. 2 pages.
Search Report Rule 62 issued in European Patent Application 11155294.9 dated Jun. 29, 2017. 8 pages.
Qiming et al., New Directional Electromagnetic tool for Proactive Geosteering and Accurate Formation Evaluation While Drilling. Proceedings of the SPWLA 46th Annual Logging Sumposium. New Orleans, Louisiana. Jun. 29, 2009. pp. 1-16.

* cited by examiner

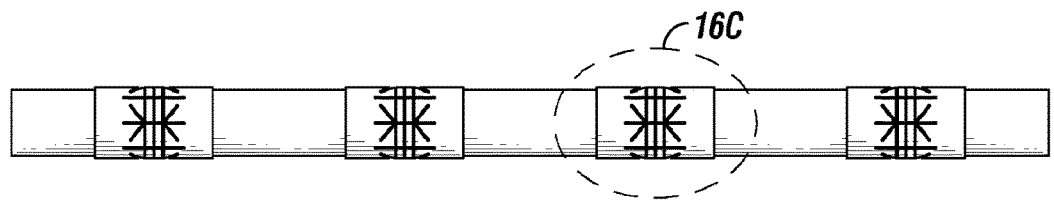
*FIG. 16A*
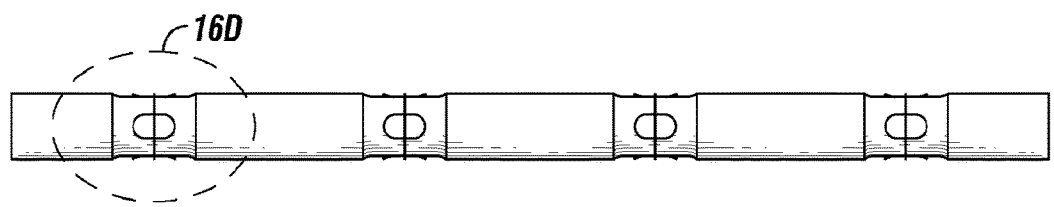
*FIG. 16B*
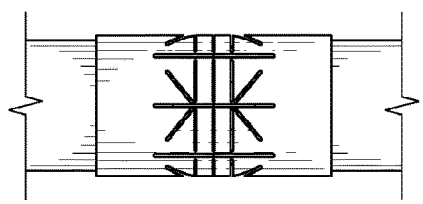   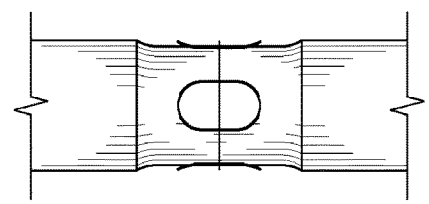
*FIG. 16C*            *FIG. 16D*
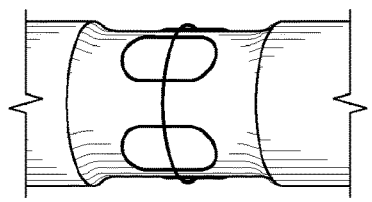
*FIG. 16E*

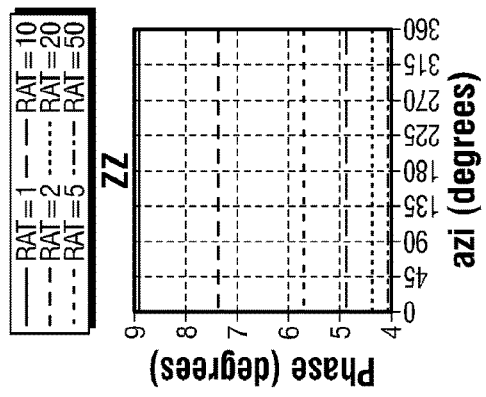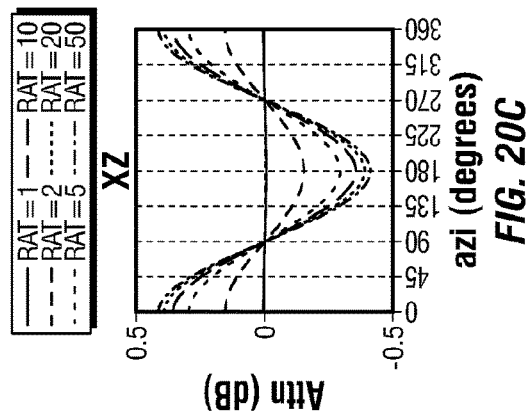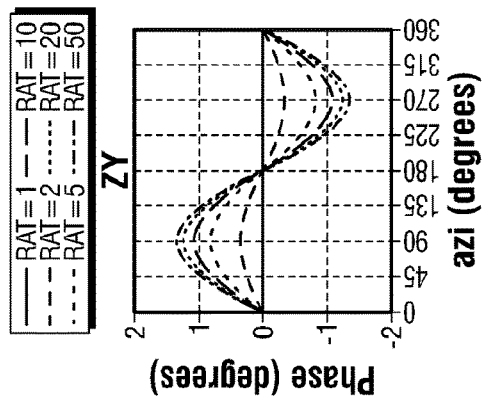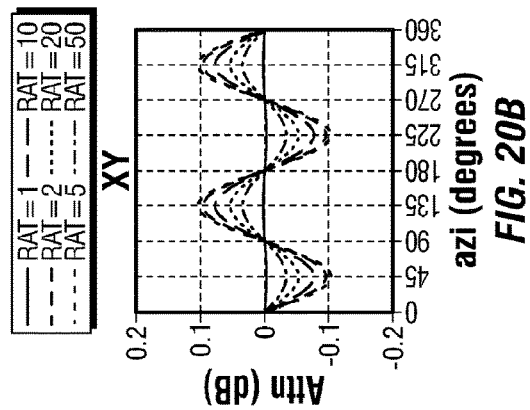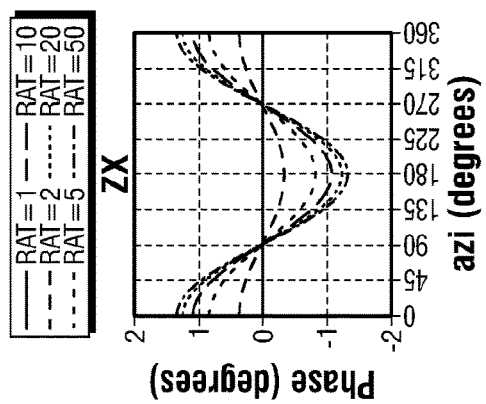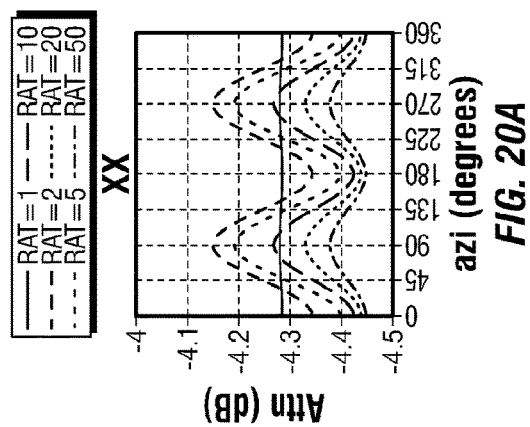

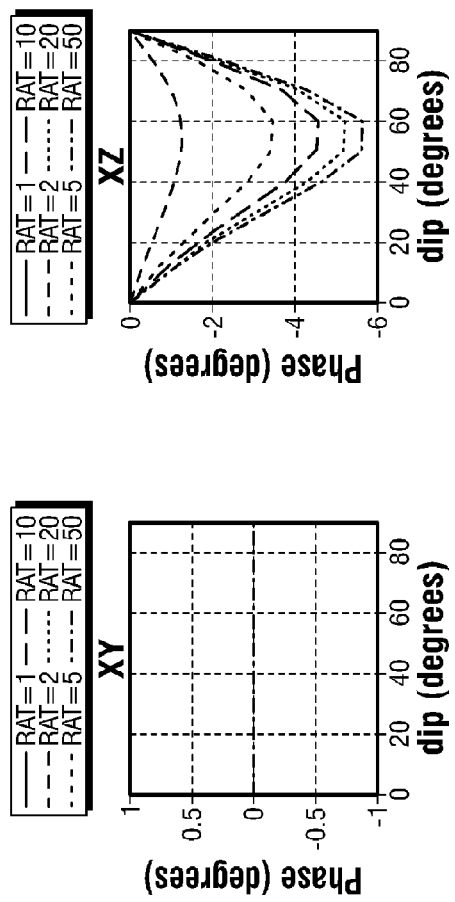
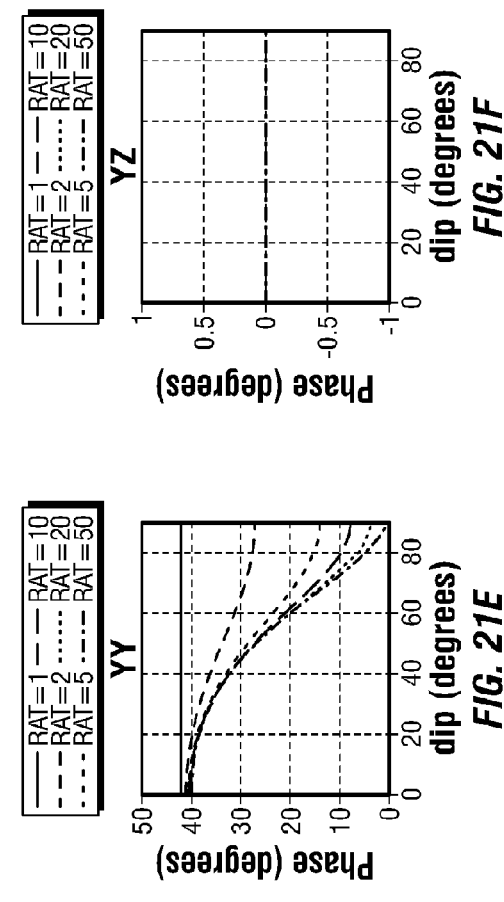
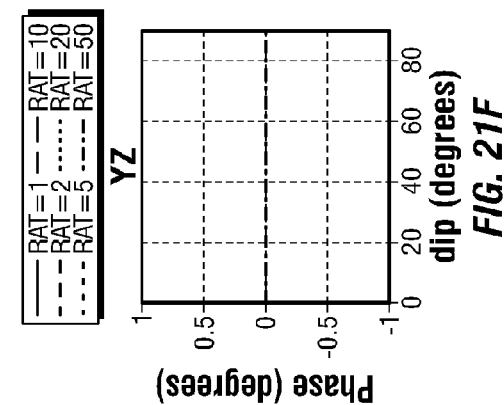
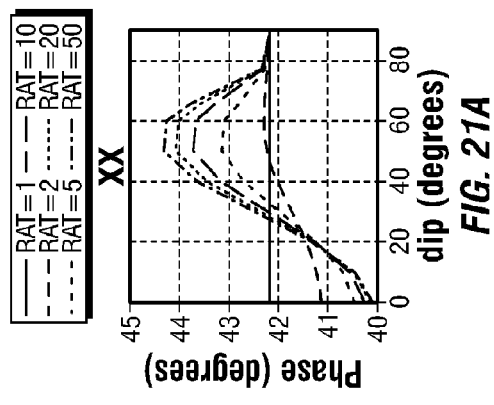
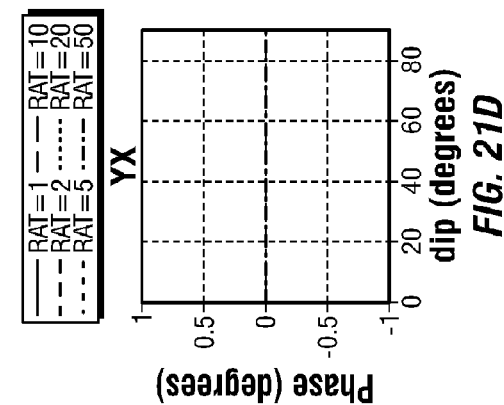
FIG. 21A  FIG. 21B  FIG. 21C  FIG. 21D  FIG. 21E  FIG. 21F

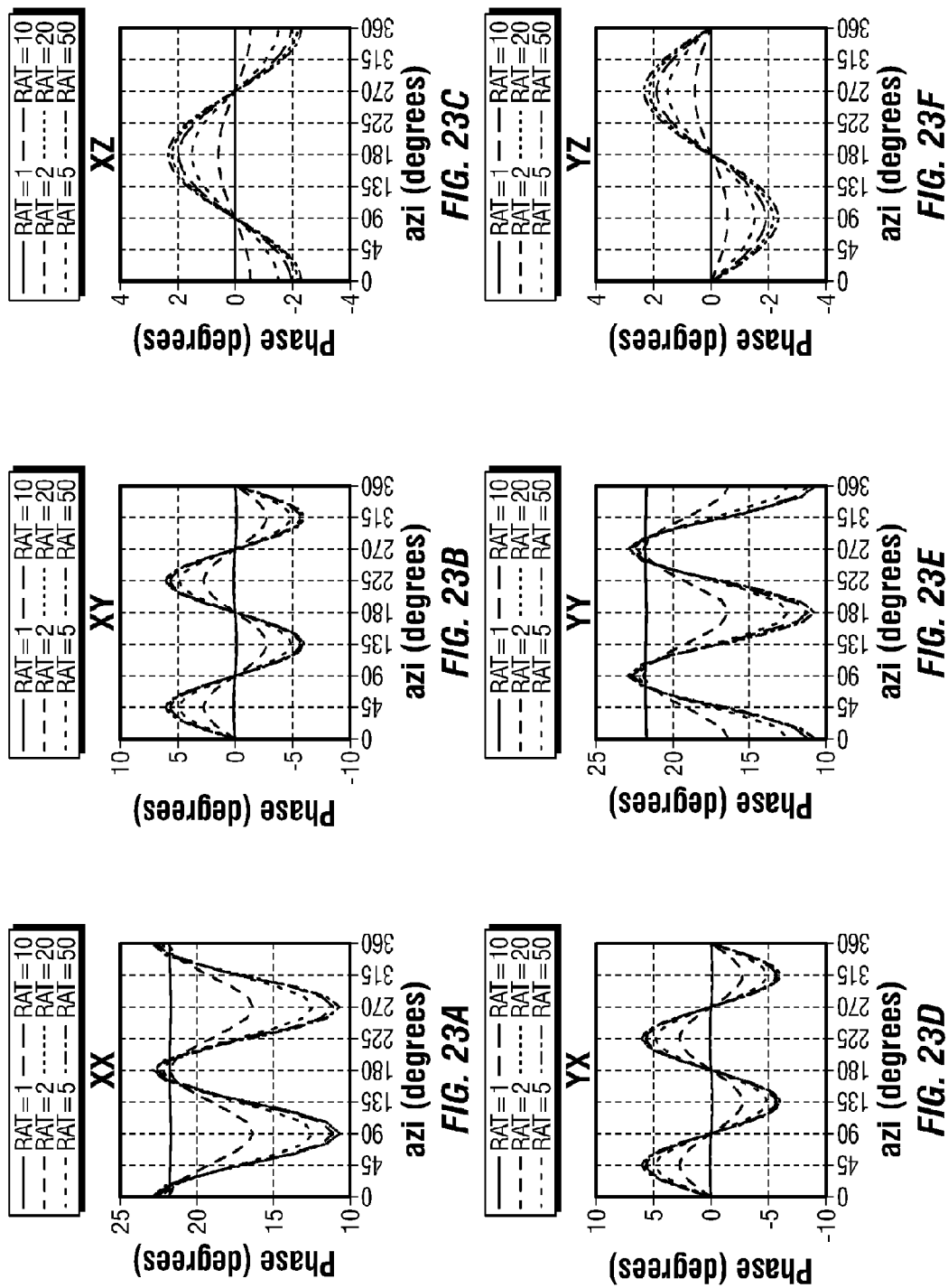

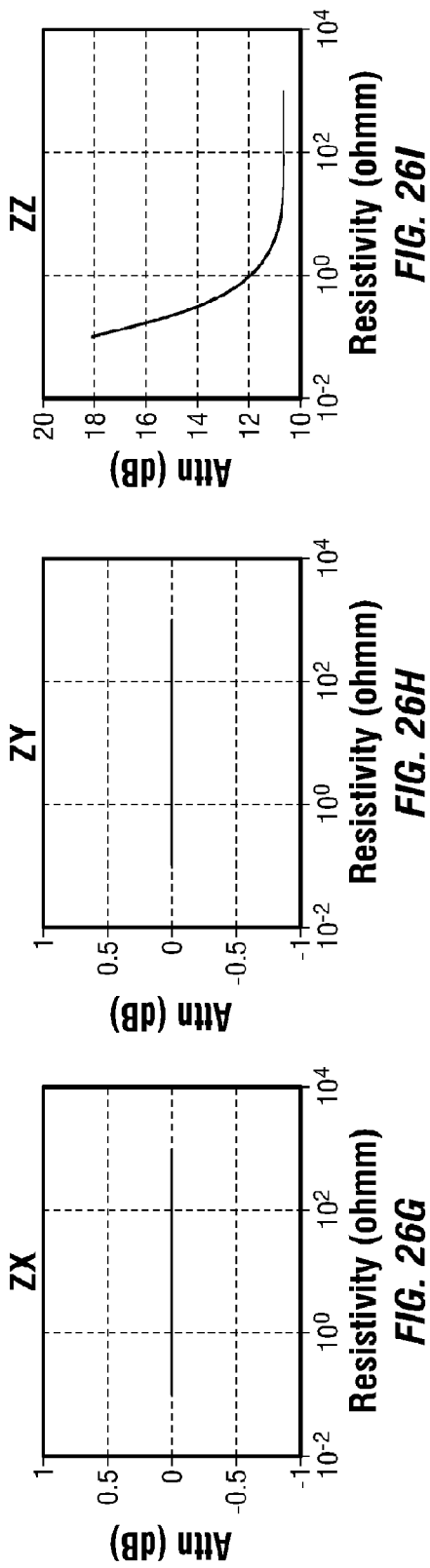
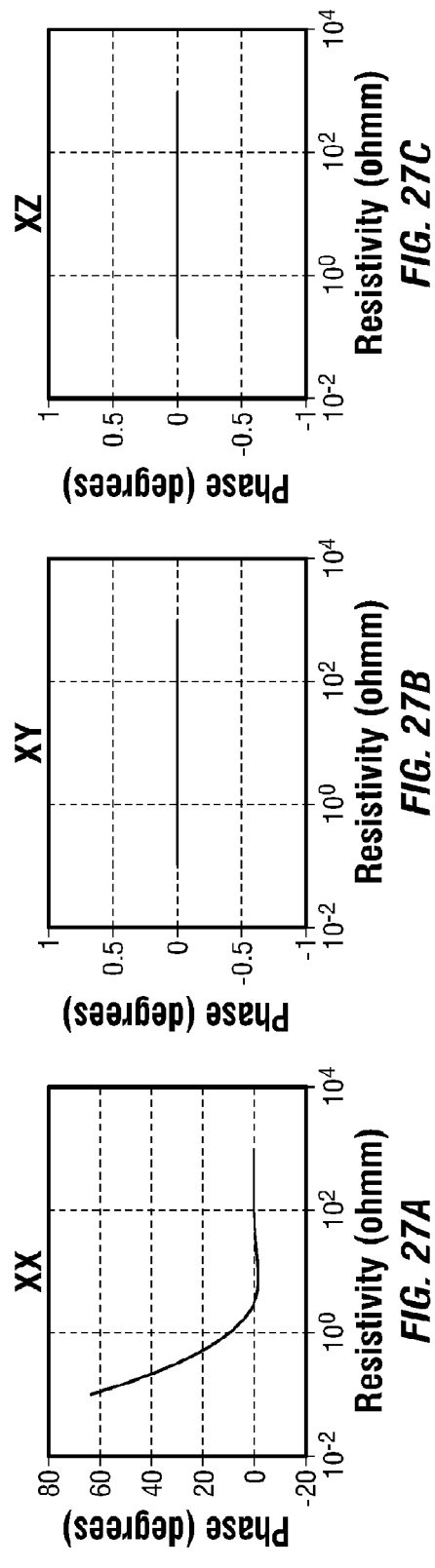
FIG. 26G  FIG. 26H  FIG. 26I
FIG. 27A  FIG. 27B  FIG. 27C

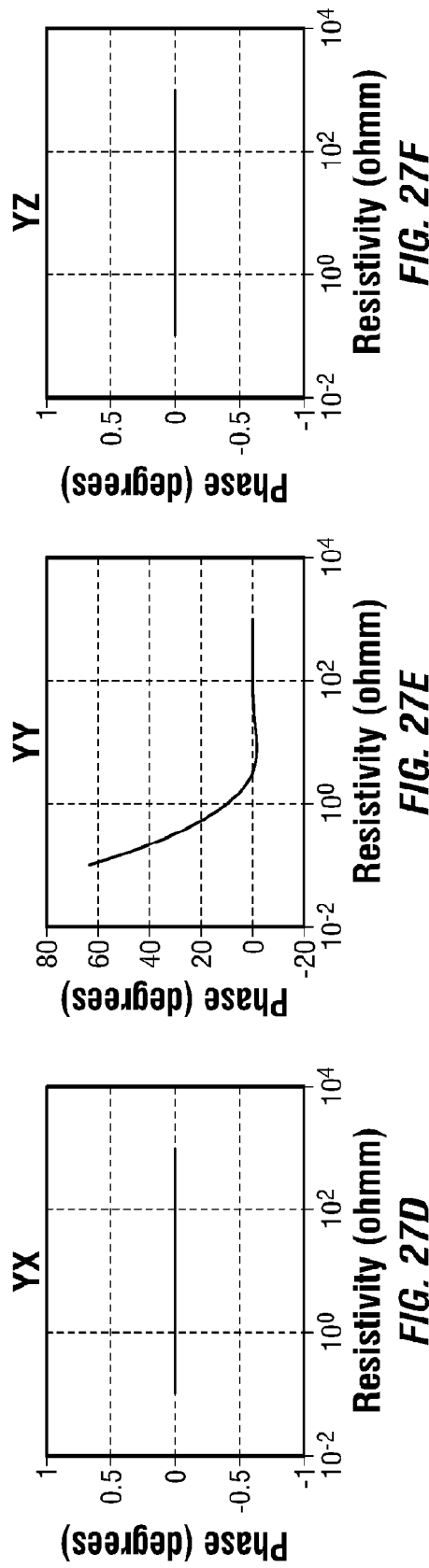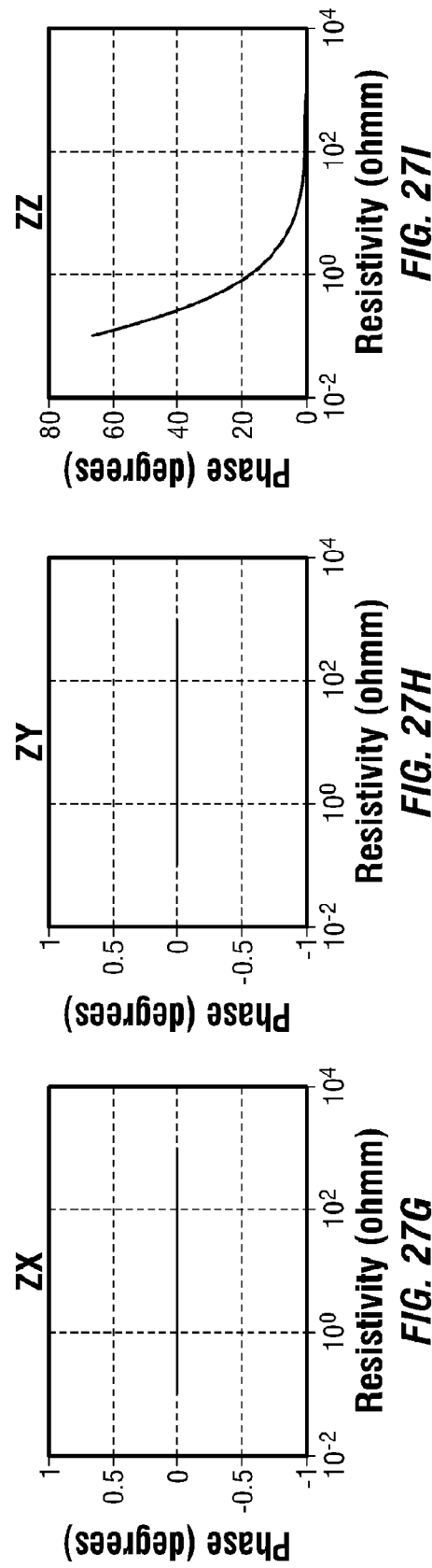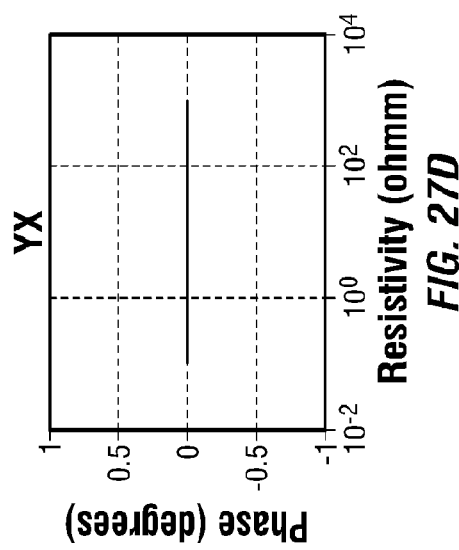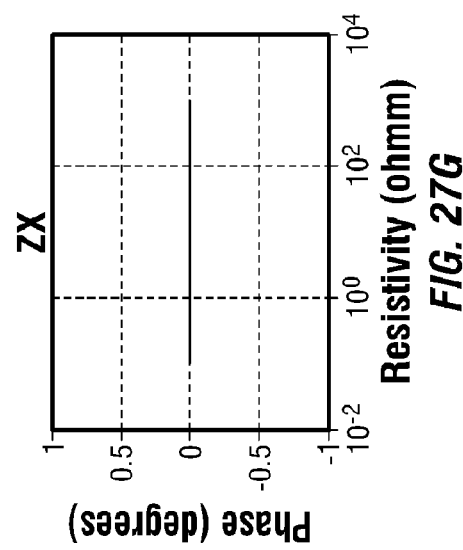
FIG. 27D  FIG. 27E  FIG. 27F
FIG. 27G  FIG. 27H  FIG. 27I

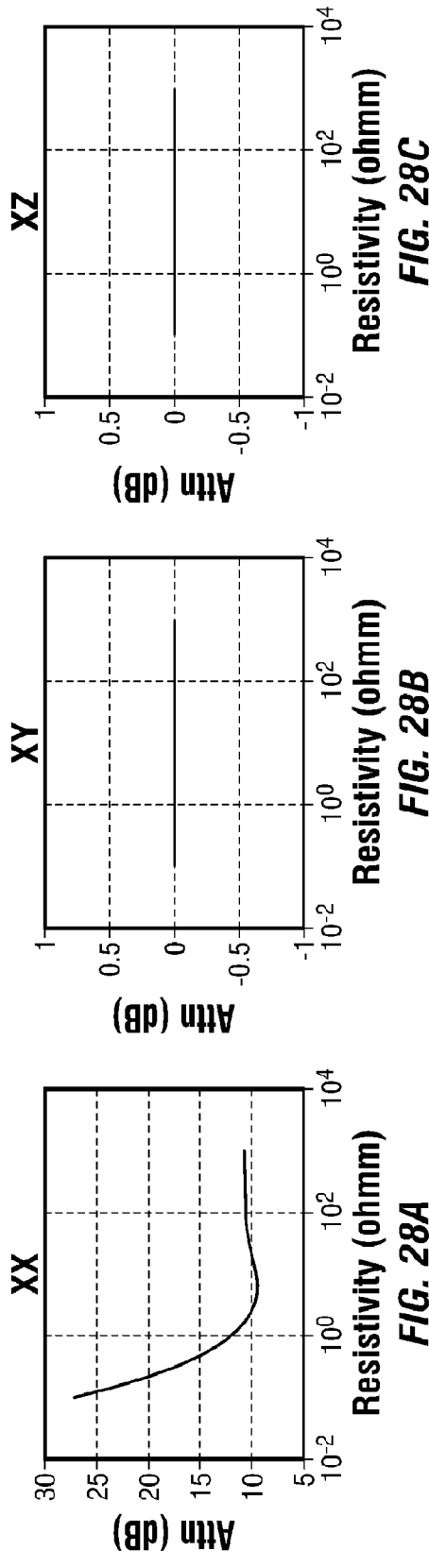
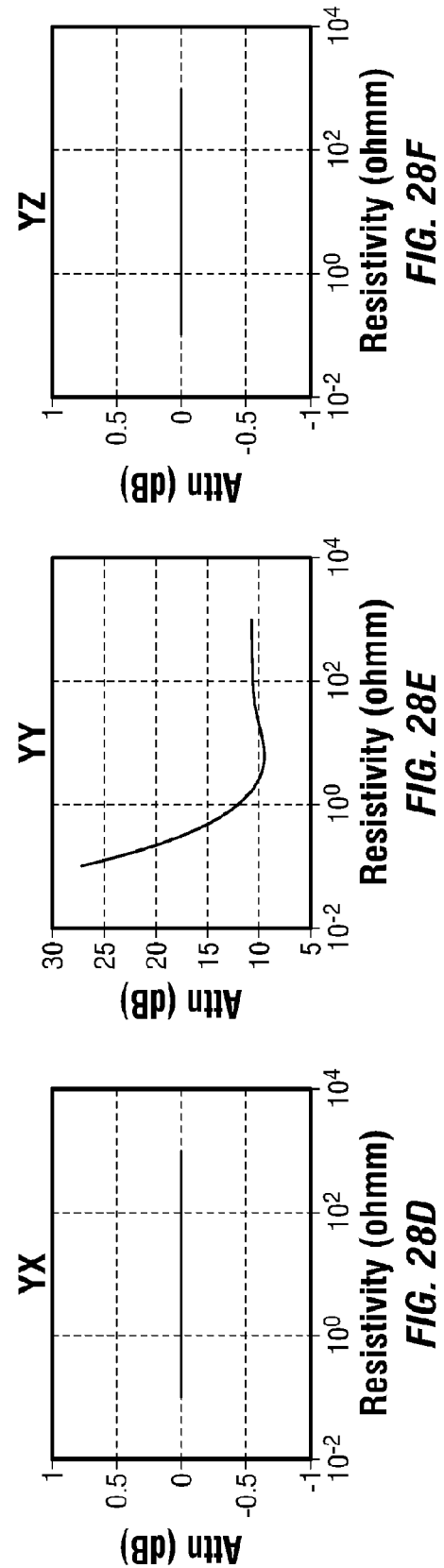
FIG. 28A  FIG. 28B  FIG. 28C
FIG. 28D  FIG. 28E  FIG. 28F

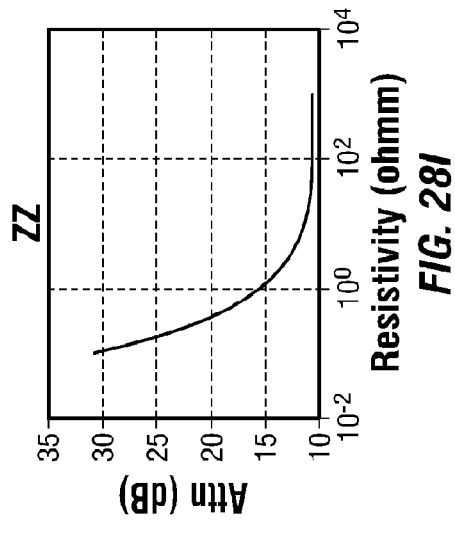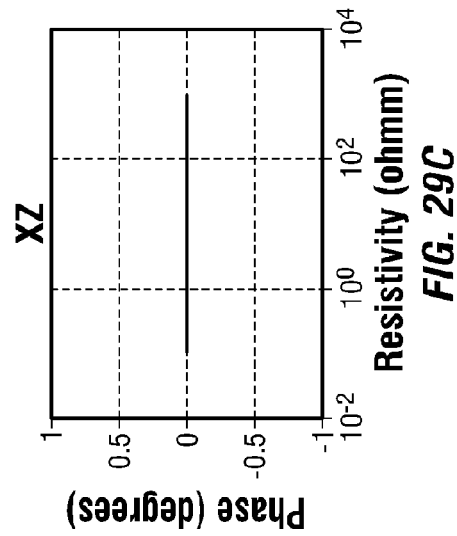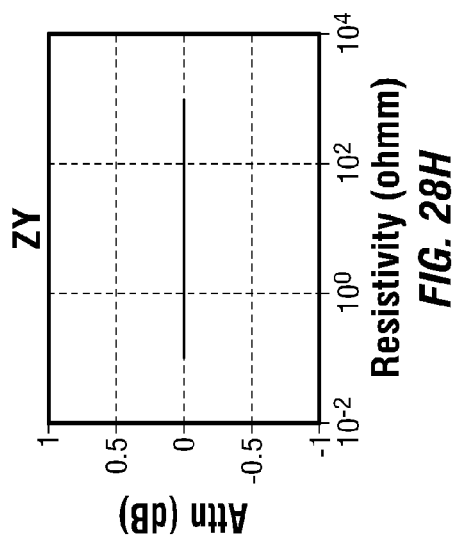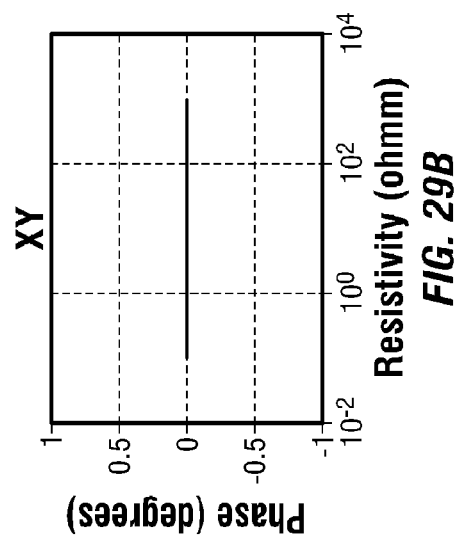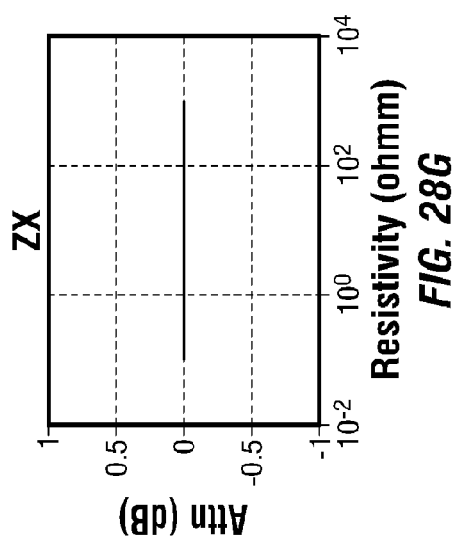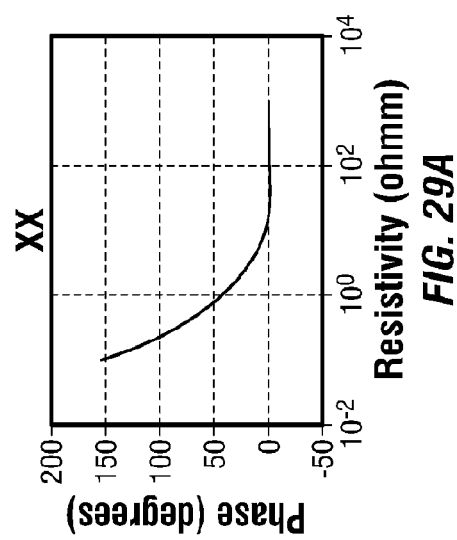
FIG. 28G  FIG. 28H  FIG. 28I
FIG. 29A  FIG. 29B  FIG. 29C

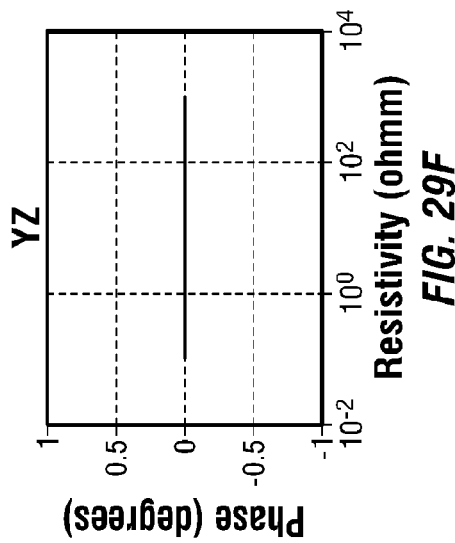
FIG. 29D YX
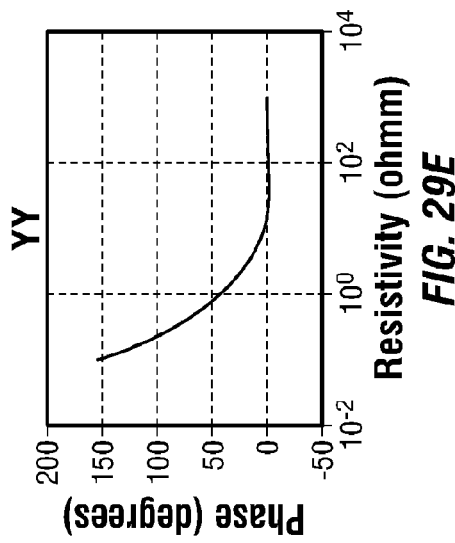
FIG. 29E YY
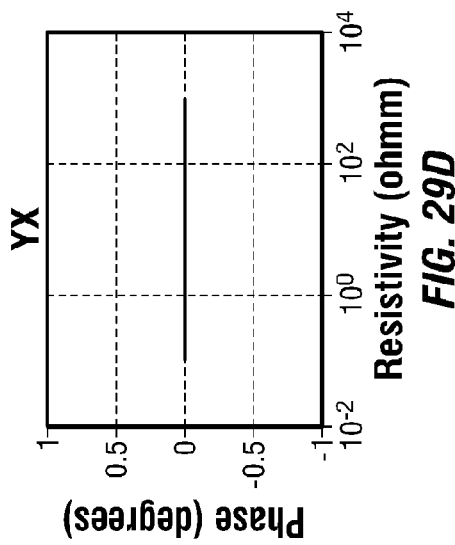
FIG. 29F YZ
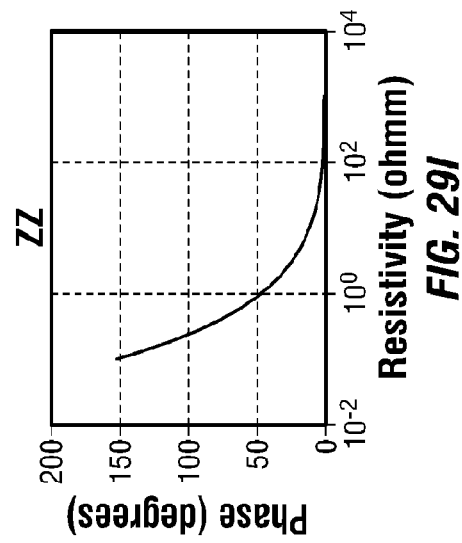
FIG. 29G ZX
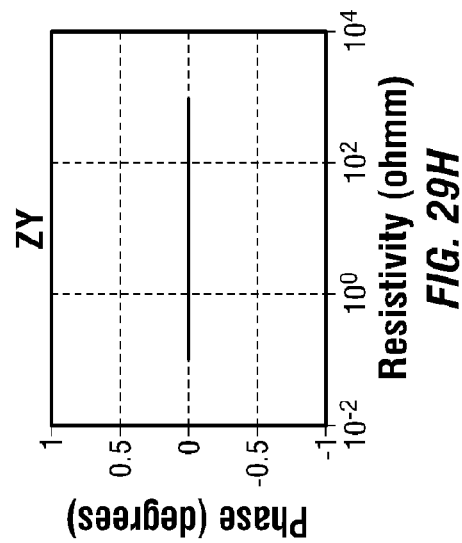
FIG. 29H ZY
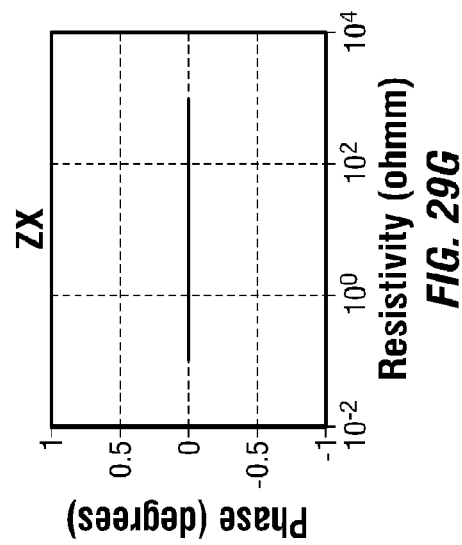
FIG. 29I ZZ

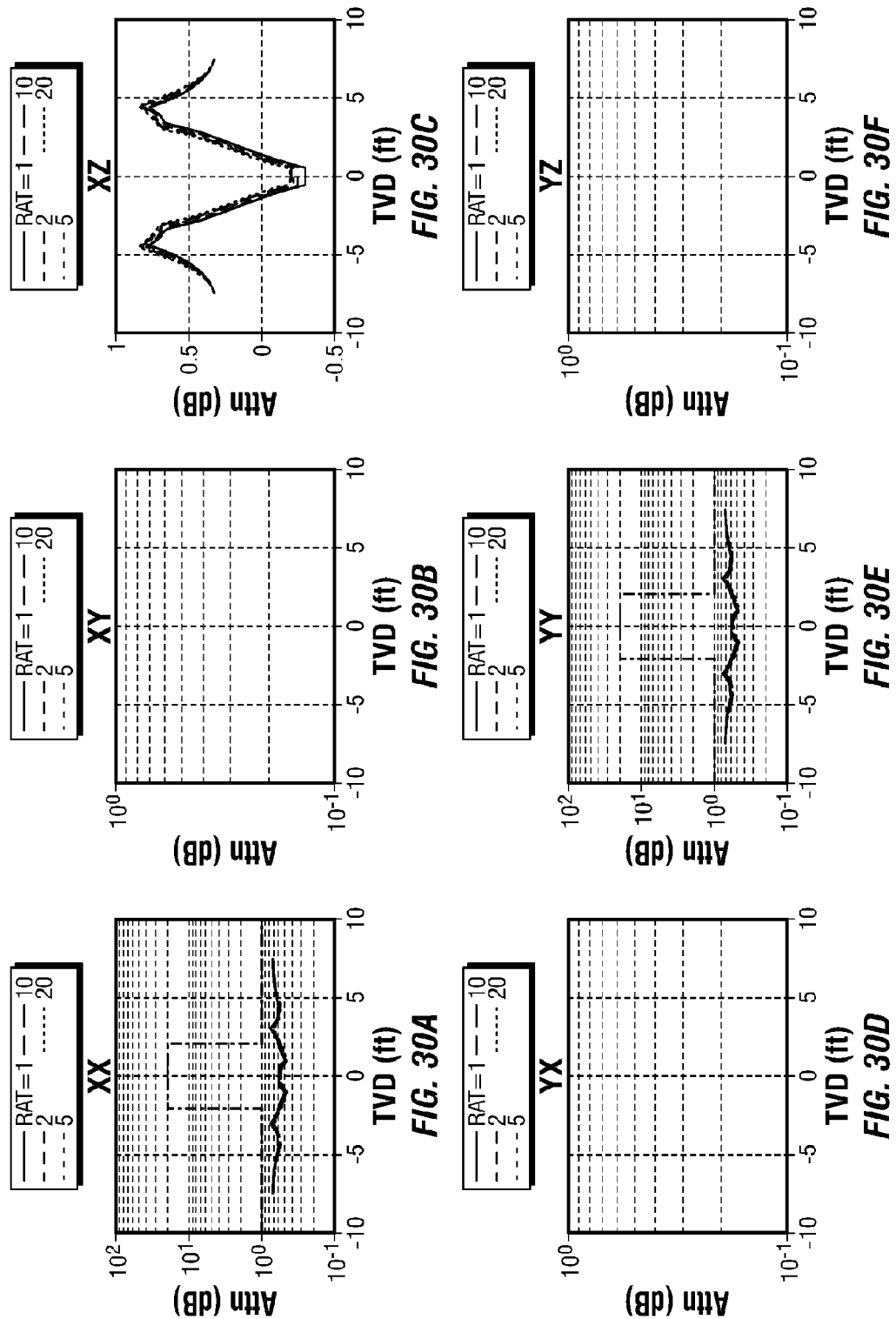

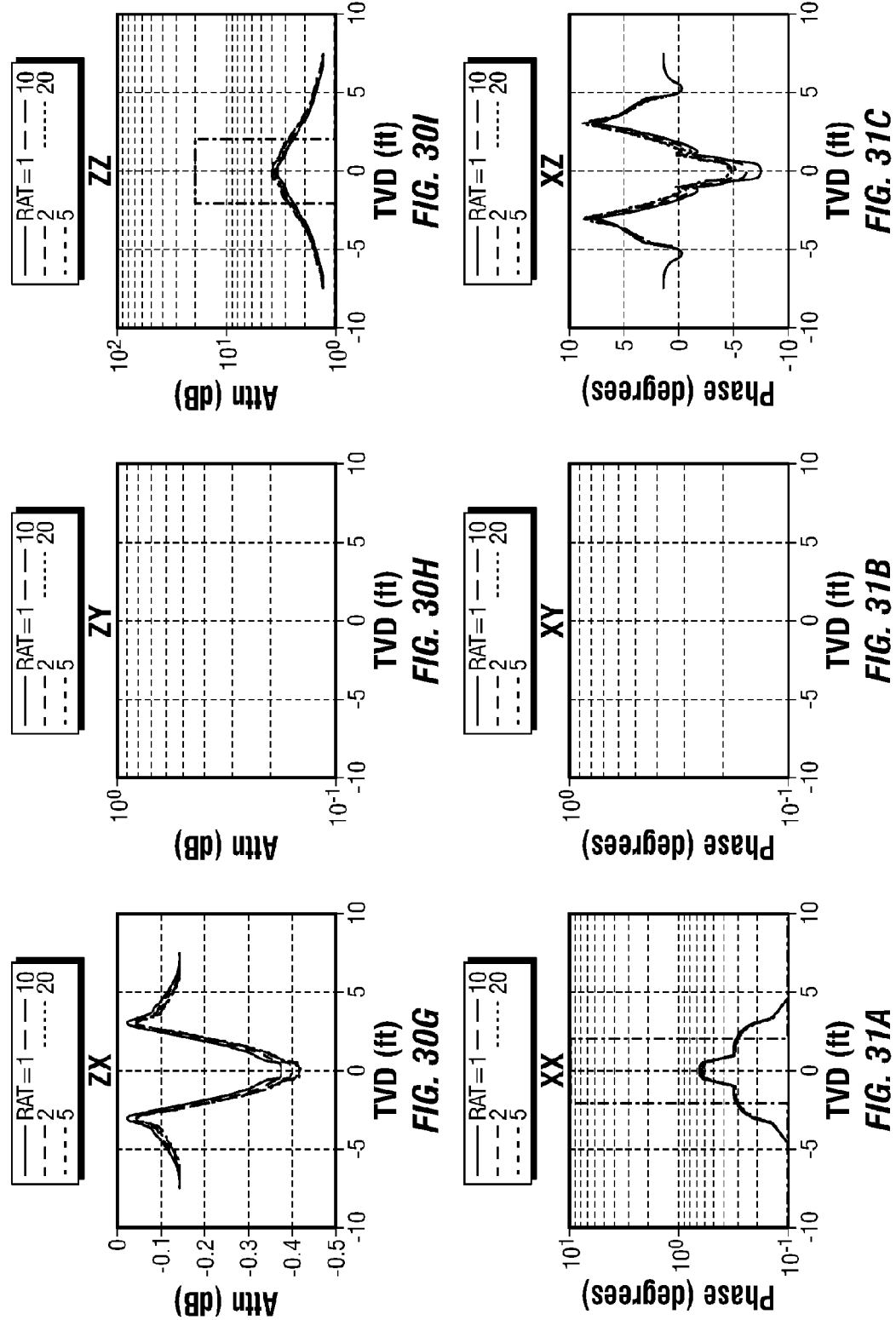

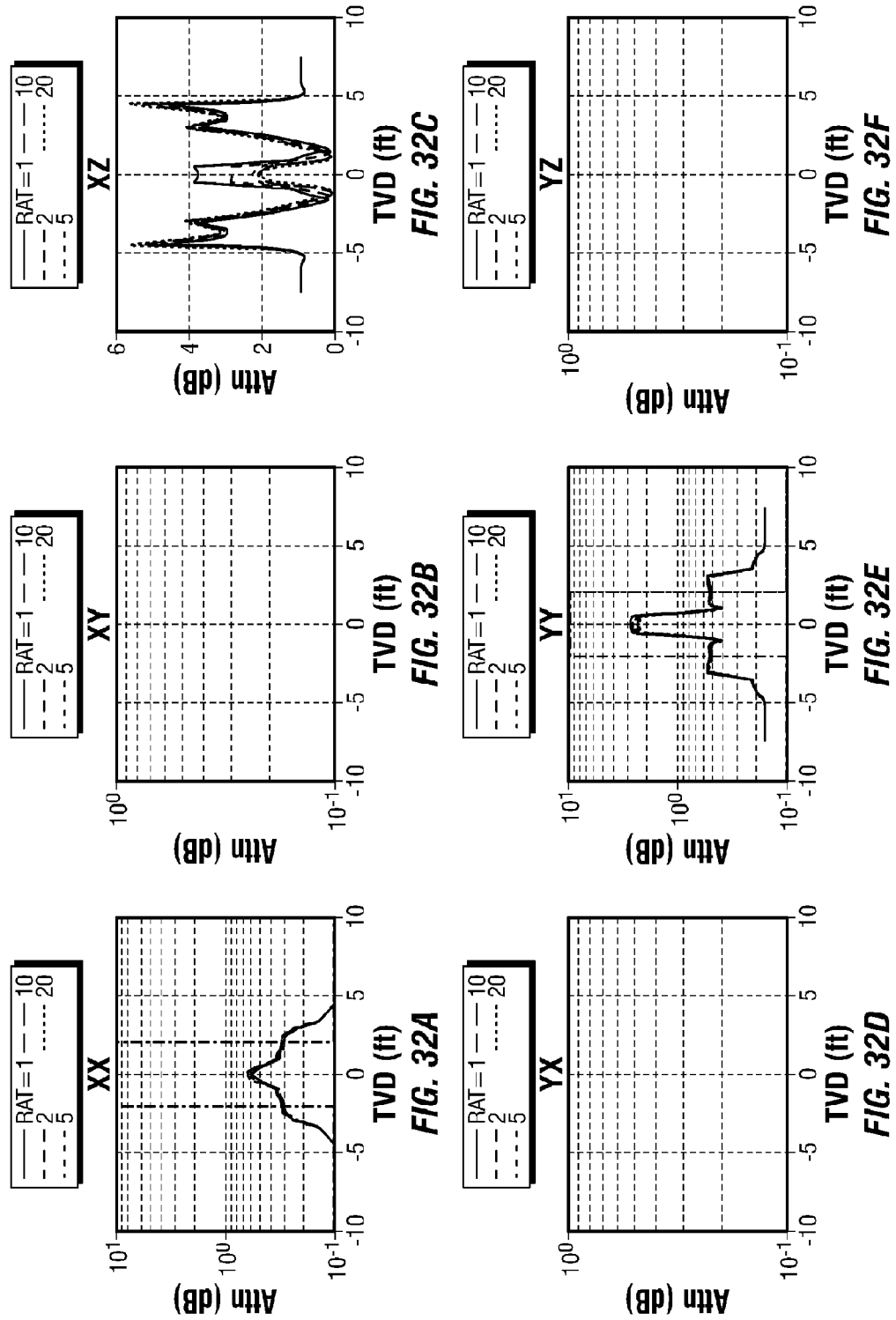

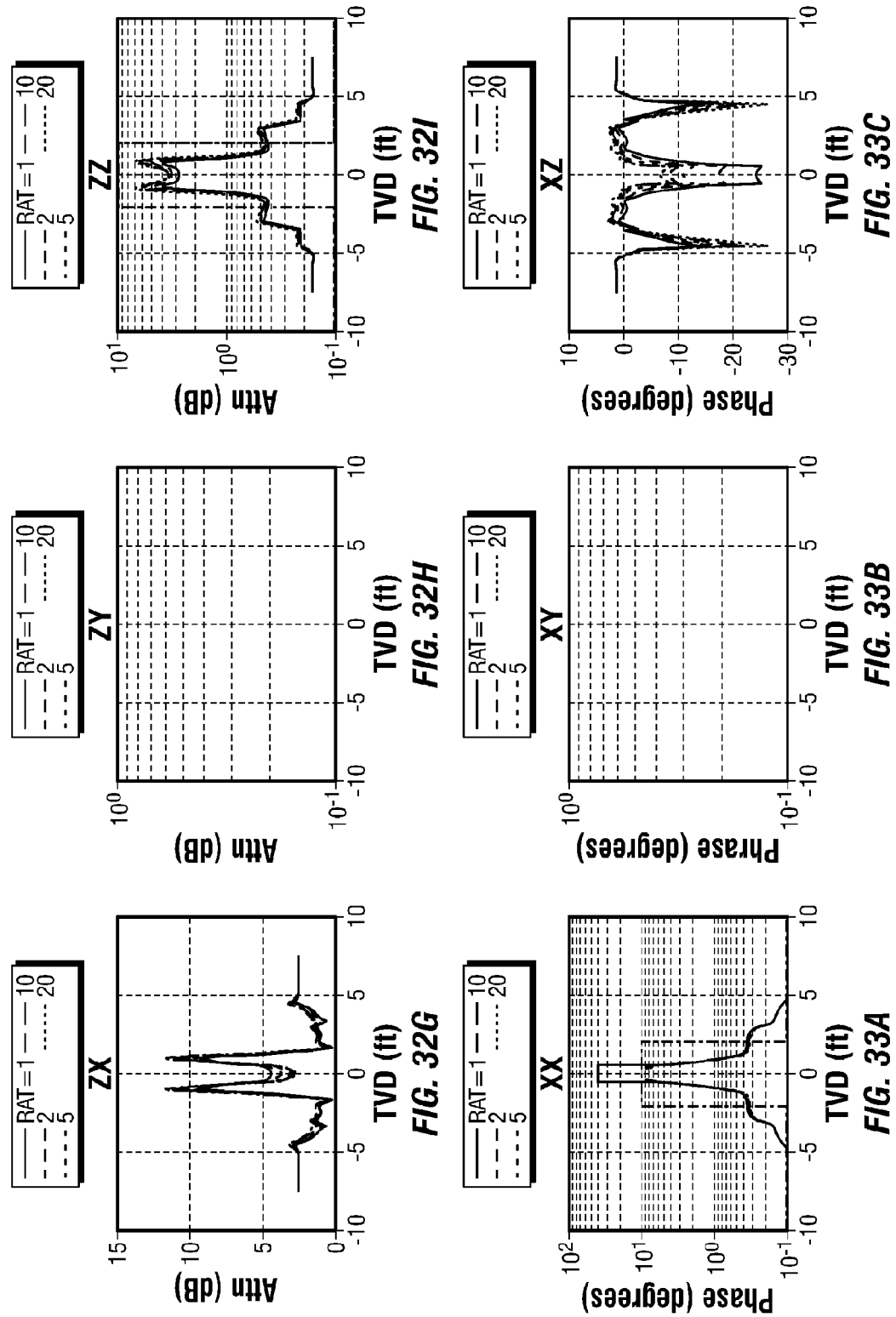

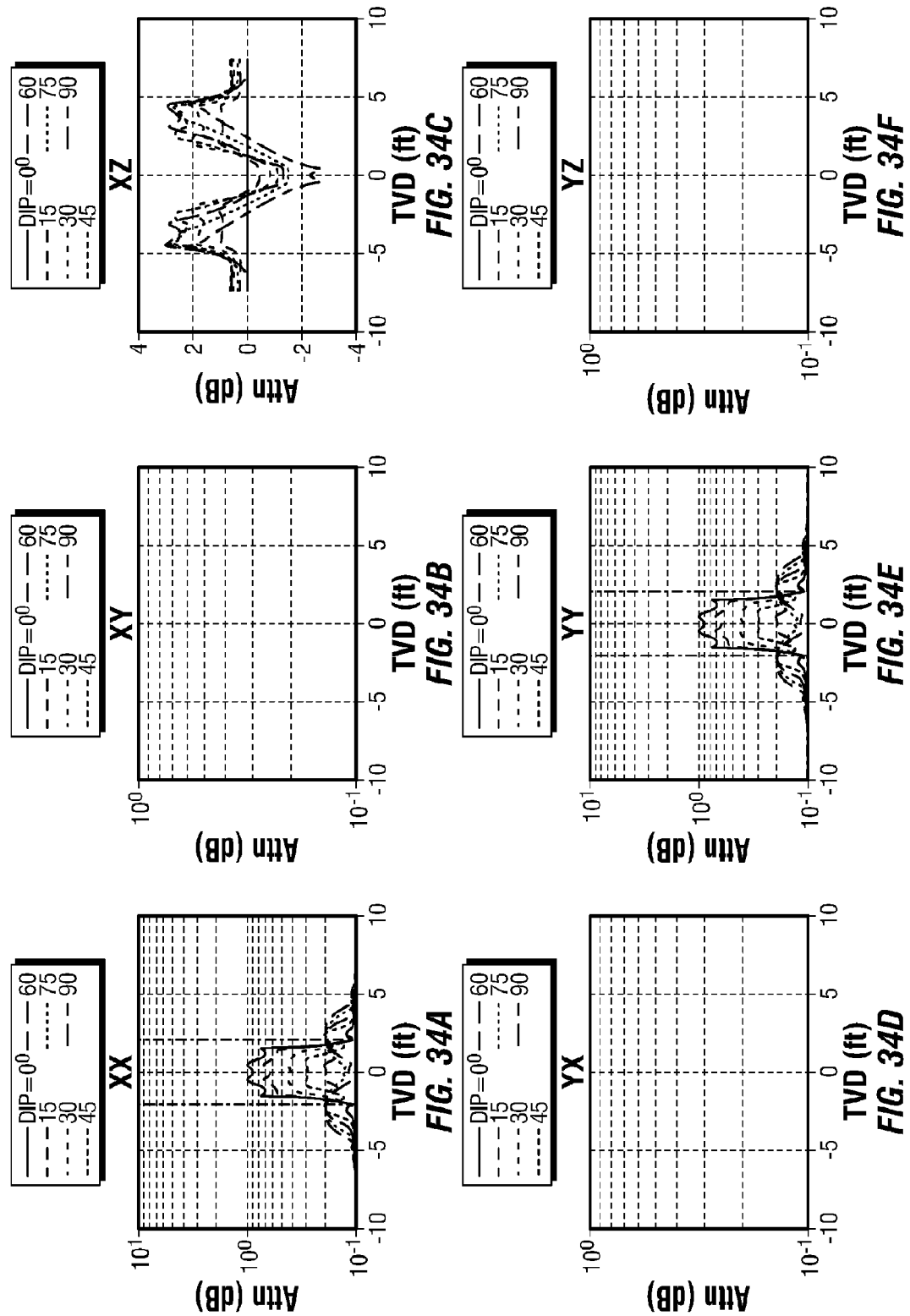

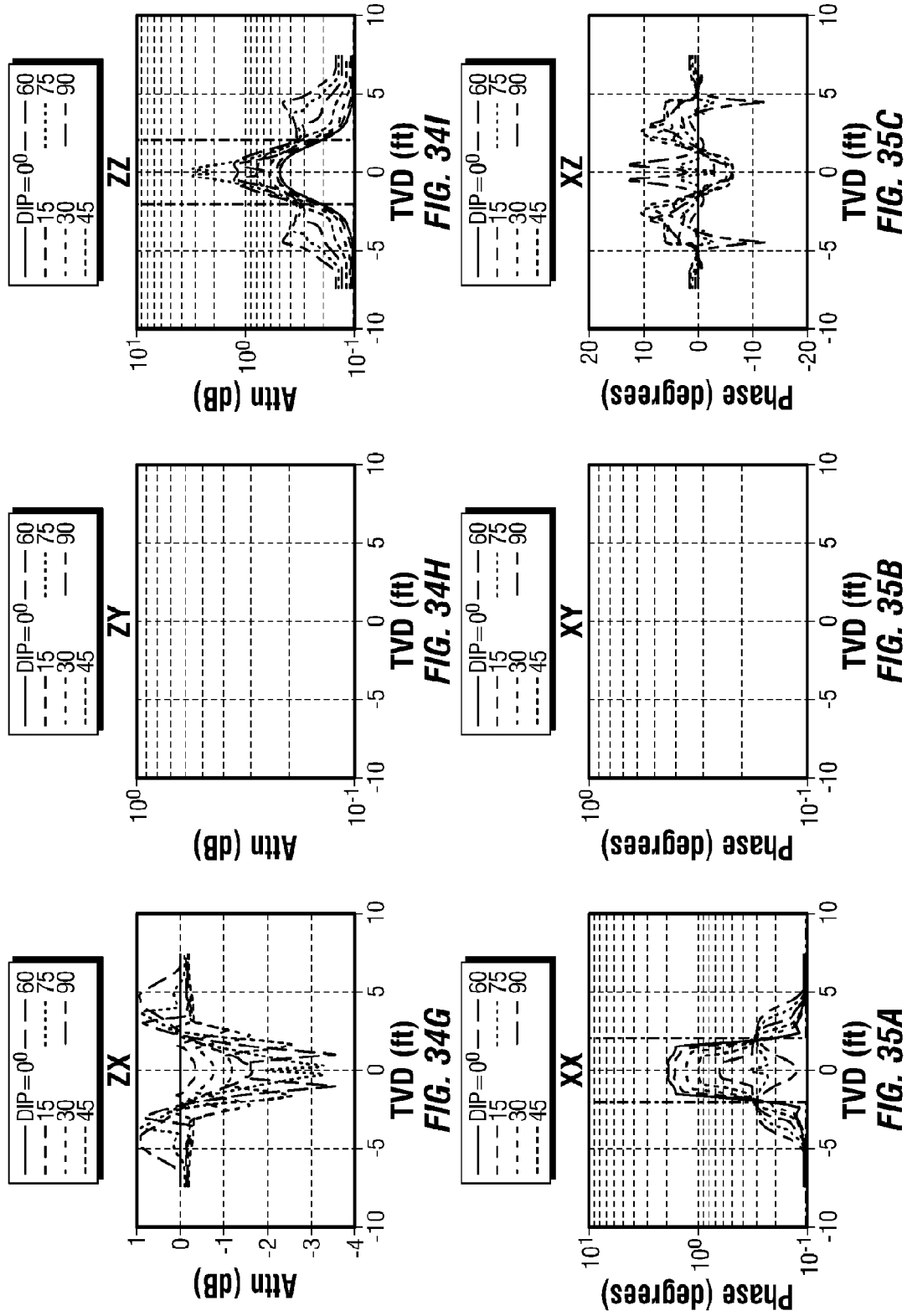

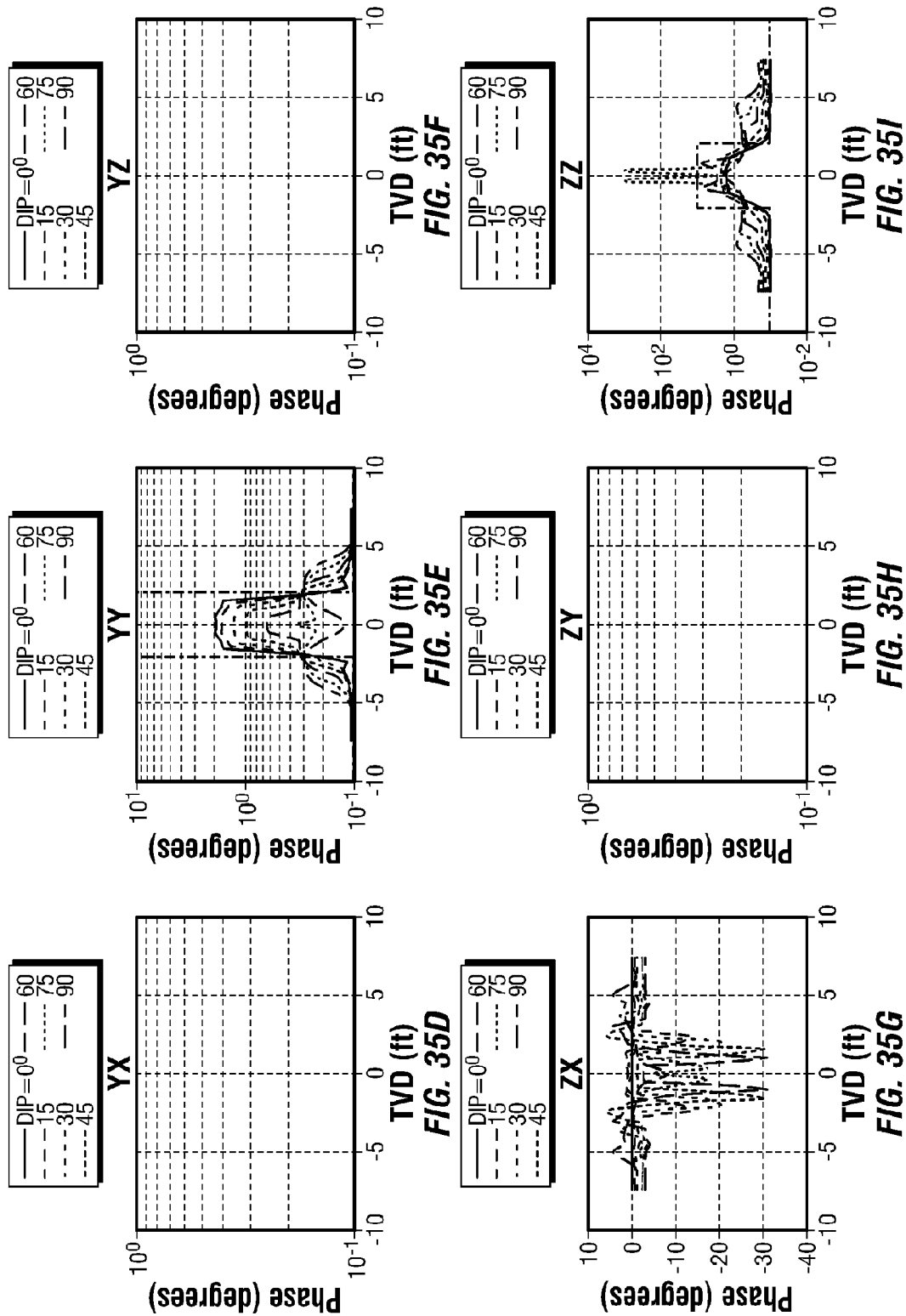

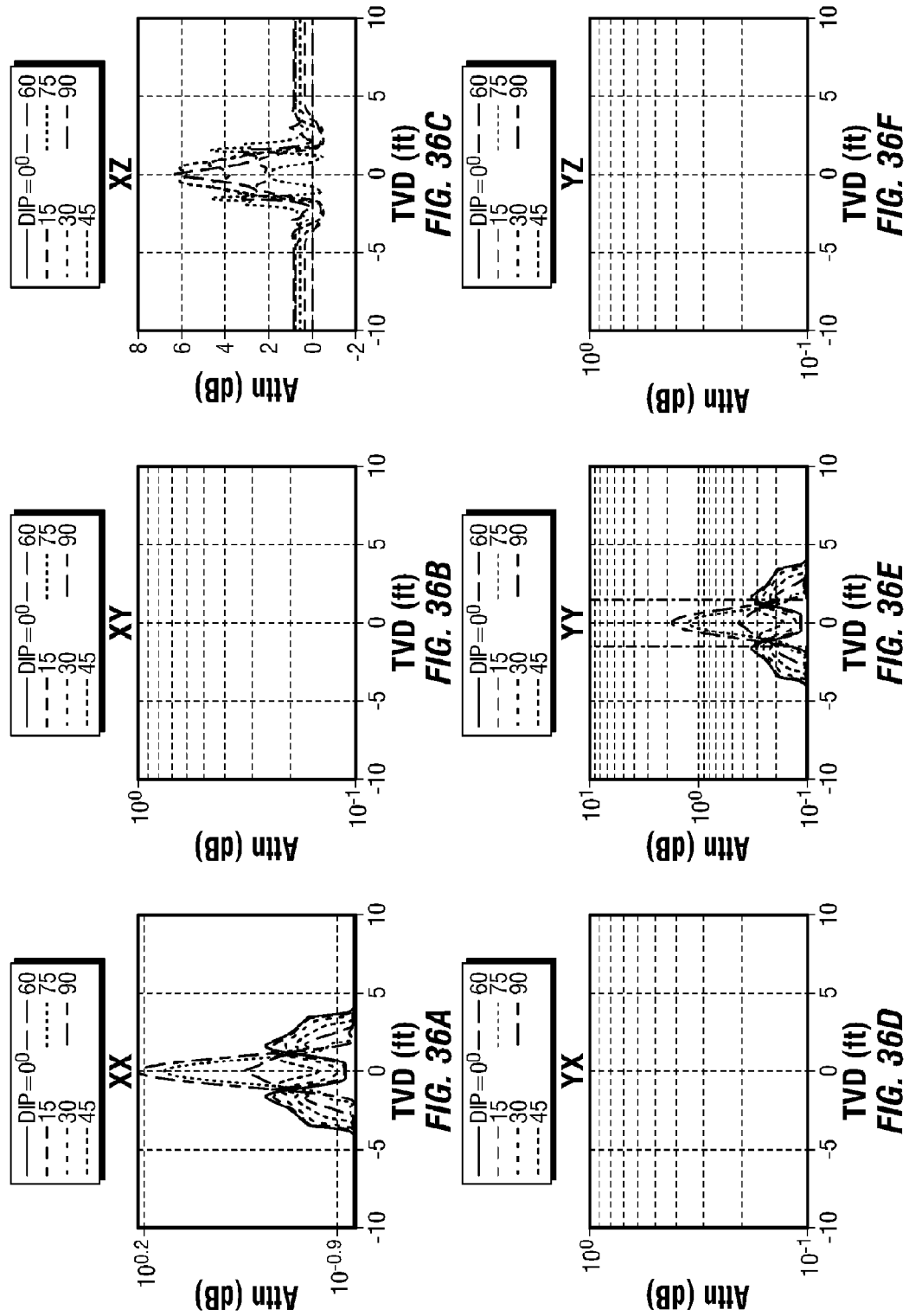

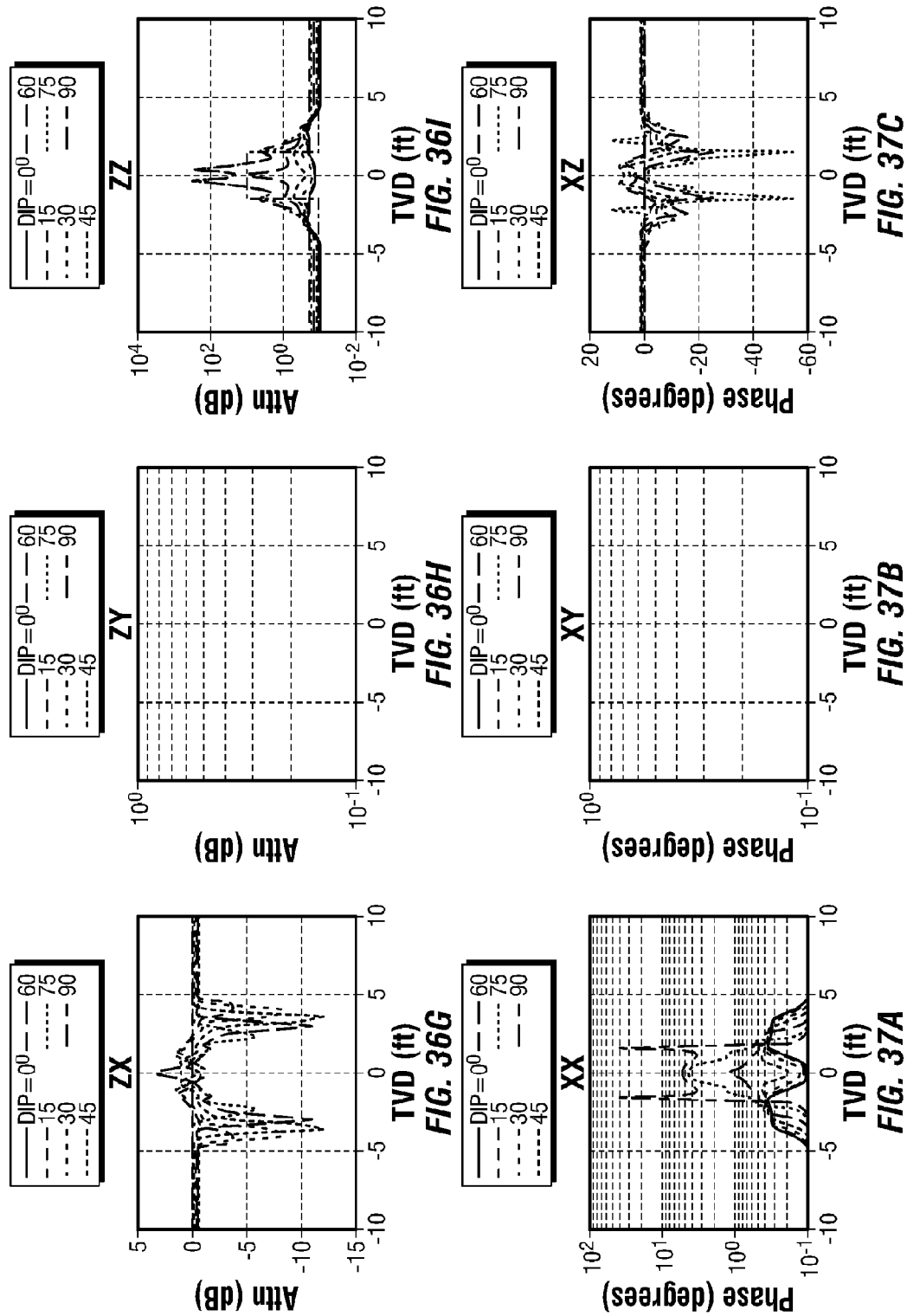

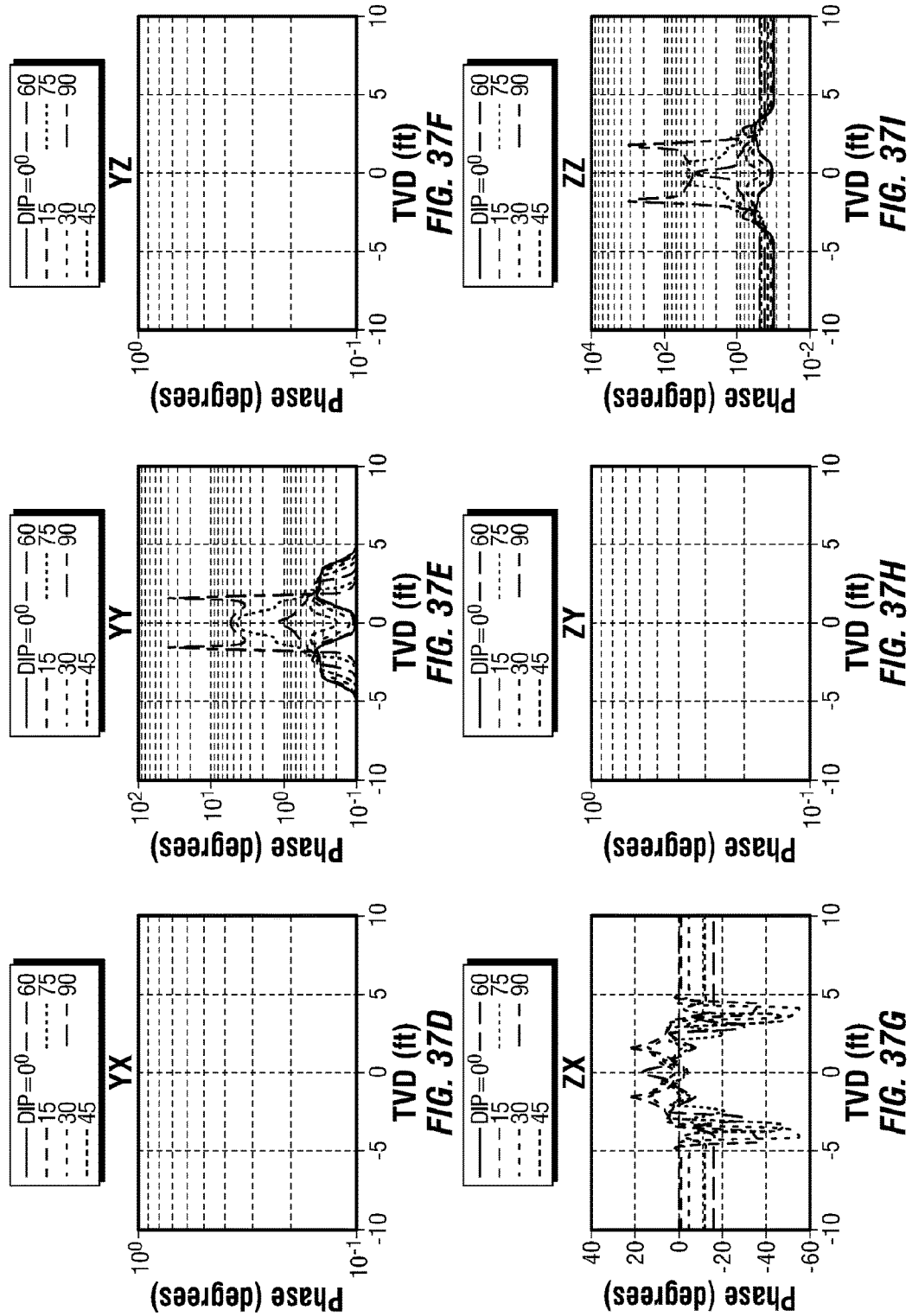

GAIN-CORRECTED MEASUREMENTS

CROSS-REFERENCE TO OTHER APPLICATIONS

This application claims, under 35 U.S.C. 119(e), priority to and the benefit of U.S. Provisional Application No. 61/329,425, filed Apr. 29, 2010. This application is, under 35 U.S.C. 120, a continuation-in-part application of U.S. application Ser. No. 12/434,888 (now U.S. Pat. No. 8,368,403), filed May 4, 2009 and U.S. application Ser. No. 13/030,780 (now U.S. Pat. No. 9,134,449), filed Feb. 18, 2011.

BACKGROUND

Technical Field

The present disclosure relates generally to the logging of subsurface formations surrounding a wellbore using a downhole logging tool, and particularly to obtaining gain-corrected measurements.

Background Art

Logging tools have long been used in wellbores to make, for example, formation evaluation measurements to infer properties of the formations surrounding the borehole and the fluids in the formations. Common logging tools include electromagnetic tools, nuclear tools, and nuclear magnetic resonance (NMR) tools, though various other tool types are also used.

Early logging tools were run into a wellbore on a wireline cable, after the wellbore had been drilled. Modern versions of such wireline tools are still used extensively. However, the need for information while drilling the borehole gave rise to measurement-while-drilling (MWD) tools and logging-while-drilling (LWD) tools. MWD tools typically provide drilling parameter information such as weight on the bit, torque, temperature, pressure, direction, and inclination. LWD tools typically provide formation evaluation measurements such as resistivity, porosity, and NMR distributions. MWD and LWD tools often have components common to wireline tools (e.g., transmitting and receiving antennas), but MWD and LWD tools must be constructed to not only endure but to operate in the harsh environment of drilling.

SUMMARY

A method to obtain gain-corrected measurements. A measurement tool having one or more arrays is provided, wherein the arrays include two co-located triaxial transmitters and two co-located triaxial receivers. Measurements are obtained using the transmitters and the receivers. Impedance matrices are formed from the obtained measurements and the impedance matrices are combined to provide gain-corrected measurements. The apparatus may alternatively be a while-drilling logging tool having one or more arrays, wherein each array comprises a transmitter, a receiver, and a buck, and wherein the signal received by the receiver is subtracted from the signal received by the buck or vice versa. A slotted shield may be incorporated into either embodiment of the tool. The slots may form one or more island elements. A material is disposed in the slots. The islands and shield body have complementary tapered sides that confine the islands within the shield body.

Other aspects and advantages will become apparent from the following description and the attached claims.

BRIEF DESCRIPTION OF THE FIGURES

FIG. 16 shows an exemplary triaxial LWD tool, with and without shields, in accordance with the present disclosure.

FIG. 27 shows a 400 kHz phase response to an infinite homogeneous formation, in accordance with the present disclosure.

FIG. 28 shows a 2 MHz attenuation response to an infinite homogeneous formation, in accordance with the present disclosure.

FIG. 29 shows a 2 MHz phase response to an infinite homogeneous formation, in accordance with the present disclosure.

FIG. 30 shows the attenuation response versus anisotropy ratio operating at 400 kHz in 60° dipping three-layer formation, in accordance with the present disclosure.

FIG. 32 shows the attenuation response versus anisotropy ratio operating at 2 MHz in 60° dipping three-layer formation, in accordance with the present disclosure.

FIG. 34 shows the attenuation response versus dip operating at 400 kHz in a three-layer formation with anisotropy ratio of 2, in accordance with the present disclosure.

FIG. 35 shows the phase response versus dip operating at 400 kHz in a three-layer formation with anisotropy ratio of 2, in accordance with the present disclosure.

FIG. 36 shows the attenuation response versus dip operating at 2 MHz in a three-layer formation with anisotropy ratio of 2, in accordance with the present disclosure.

FIG. 37 shows the phase response versus dip operating at 2 MHz in a three-layer formation with anisotropy ratio of 2, in accordance with the present disclosure.

DETAILED DESCRIPTION

Some embodiments will now be described with reference to the figures. Like elements in the various figures will be referenced with like numbers for consistency. In the following description, numerous details are set forth to provide an understanding of various embodiments and/or features. However, it will be understood by those skilled in the art that some embodiments may be practiced without many of these details and that numerous variations or modifications from the described embodiments are possible. As used here, the terms "above" and "below", "up" and "down", "upper" and "lower", "upwardly" and "downwardly", and other like terms indicating relative positions above or below a given point or element are used in this description to more clearly describe certain embodiments. However, when applied to equipment and methods for use in wells that are deviated or horizontal, such terms may refer to a left to right, right to left, or diagonal relationship as appropriate.

Figure 1:
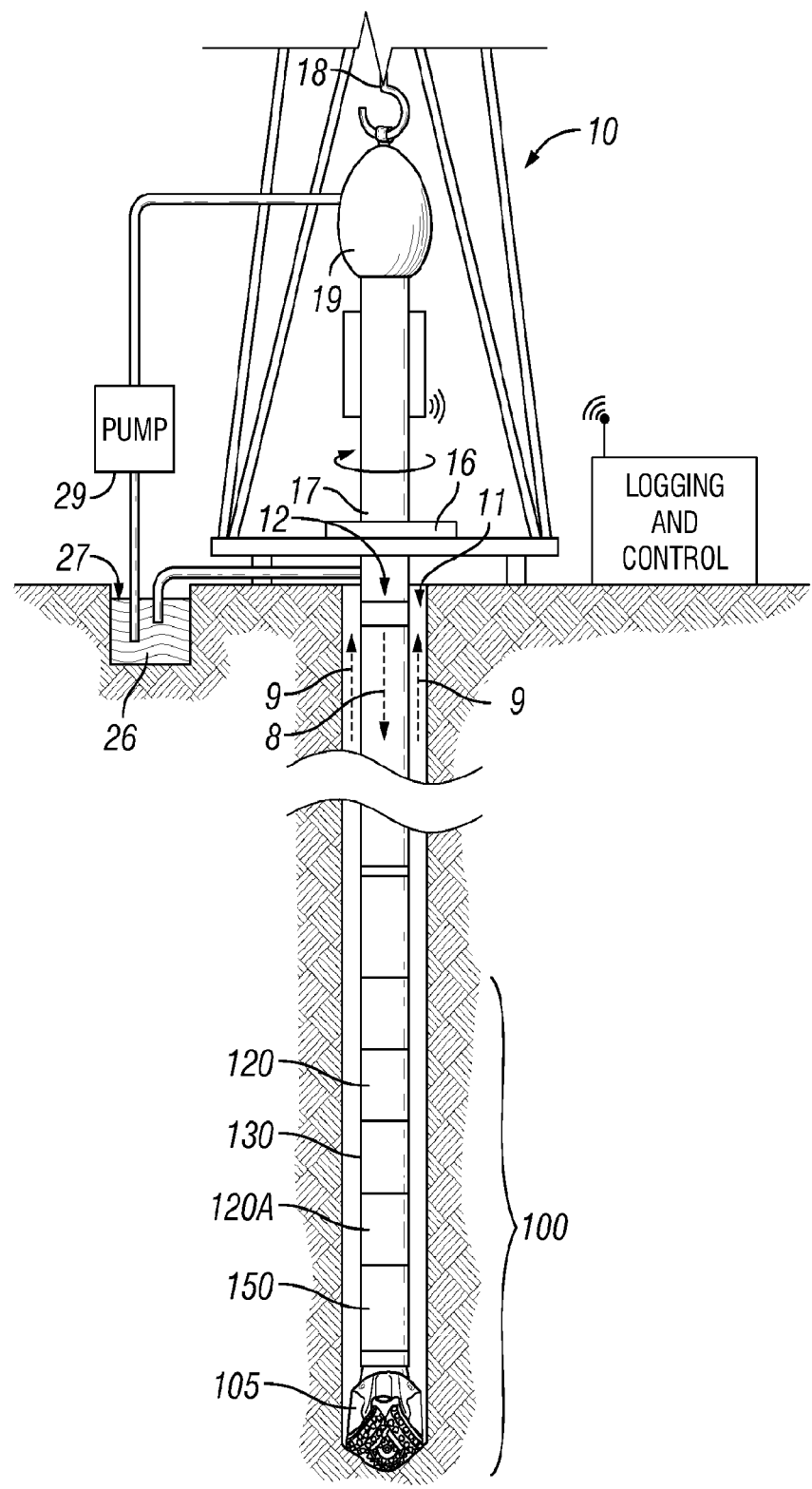
FIG. 1 illustrates an exemplary well site system.

FIG. 1 illustrates a well site system in which various embodiments can be employed. The well site can be onshore or offshore. In this exemplary system, a borehole 11 is formed in subsurface formations by rotary drilling in a manner that is well known. Some embodiments can also use directional drilling, as will be described hereinafter.

A drill string 12 is suspended within the borehole 11 and has a bottom hole assembly 100 which includes a drill bit 105 at its lower end. The surface system includes platform and derrick assembly 10 positioned over the borehole 11, the assembly 10 including a rotary table 16, kelly 17, hook 18 and rotary swivel 19. The drill string 12 is rotated by the rotary table 16, energized by means not shown, which engages the kelly 17 at the upper end of the drill string. The drill string 12 is suspended from a hook 18, attached to a traveling block (also not shown), through the kelly 17 and a rotary swivel 19 which permits rotation of the drill string relative to the hook. As is well known, a top drive system could alternatively be used.

In the example of this embodiment, the surface system further includes drilling fluid or mud 26 stored in a pit 27 formed at the well site. A pump 29 delivers the drilling fluid 26 to the interior of the drill string 12 via a port in the swivel 19, causing the drilling fluid to flow downwardly through the drill string 12 as indicated by the directional arrow 8. The drilling fluid exits the drill string 12 via ports in the drill bit 105, and then circulates upwardly through the annulus region between the outside of the drill string and the wall of the borehole, as indicated by the directional arrows 9. In this well known manner, the drilling fluid lubricates the drill bit 105 and carries formation cuttings up to the surface as it is returned to the pit 27 for recirculation.

The bottom hole assembly 100 of the illustrated embodiment includes a logging-while-drilling (LWD) module 120, a measuring-while-drilling (MWD) module 130, a rotosteerable system and motor, and drill bit 105.

The LWD module 120 is housed in a special type of drill collar, as is known in the art, and can contain one or a plurality of known types of logging tools. It will also be understood that more than one LWD and/or MWD module can be employed, e.g. as represented at 120A. (References, throughout, to a module at the position of 120 can alternatively mean a module at the position of 120A as well.) The LWD module includes capabilities for measuring, processing, and storing information, as well as for communicating with the surface equipment. In the present embodiment, the LWD module includes a resistivity measuring device.

The MWD module 130 is also housed in a special type of drill collar, as is known in the art, and can contain one or more devices for measuring characteristics of the drill string and drill bit. The MWD tool further includes an apparatus (not shown) for generating electrical power to the downhole system. This may typically include a mud turbine generator powered by the flow of the drilling fluid, it being understood that other power and/or battery systems may be employed. In the present embodiment, the MWD module includes one or more of the following types of measuring devices: a weight-on-bit measuring device, a torque measuring device, a vibration measuring device, a shock measuring device, a stick/slip measuring device, a direction measuring device, and an inclination measuring device.

Figure 2:
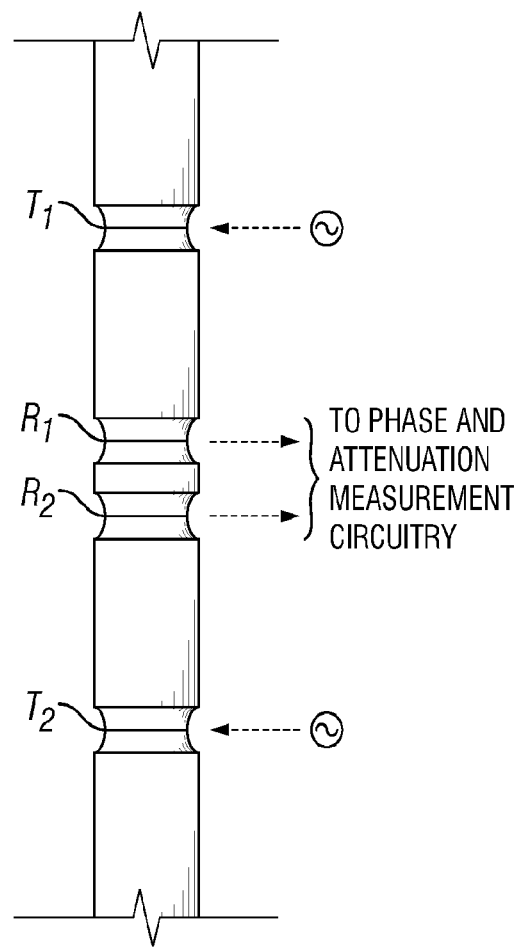
FIG. 2 shows a prior art electromagnetic logging tool.

An example of a tool which can be the LWD tool 120, or can be a part of an LWD tool suite 120A, is shown in FIG. 2. As seen in FIG. 2, upper and lower transmitting antennas, $T_1$ and $T_2$, have upper and lower receiving antennas, $R_1$ and $R_2$, therebetween. The antennas are formed in recesses in a modified drill collar and mounted in insulating material. The phase shift of electromagnetic energy as between the receivers provides an indication of formation resistivity at a relatively shallow depth of investigation, and the attenuation of electromagnetic energy as between the receivers provides an indication of formation resistivity at a relatively deep depth of investigation. U.S. Pat. No. 4,899,112 can be referred to for further details. In operation, attenuation-representative signals and phase-representative signals are coupled to a processor, an output of which is coupleable to a telemetry circuit.

Recent electromagnetic logging tools use one or more tilted or transverse antennas, with or without axial antennas. Those antennas may be transmitters or receivers. A tilted antenna is one whose dipole moment is neither parallel nor perpendicular to the longitudinal axis of the tool. A transverse antenna is one whose dipole moment is substantially perpendicular to the longitudinal axis of the tool, and an axial antenna is one whose dipole moment is substantially parallel to the longitudinal axis of the tool. A triaxial antenna is one in which three antennas (i.e., antenna coils) are arranged to be mutually independent. That is, the dipole moment of any one of the antennas does not lie in the plane formed by the dipole moments of the other two antennas. Three orthogonal antennas, with one antenna axial and the other two transverse, is one example of a triaxial antenna. Two antennas are said to have equal angles if their dipole moment vectors intersect the tool's longitudinal axis at the same angle. For example, two tilted antennas have the same tilt angle if their dipole moment vectors, having their tails conceptually fixed to a point on the tool's longitudinal axis, lie on the surface of a right circular cone centered on the tool's longitudinal axis and having its vertex at that reference point. Transverse antennas obviously have equal angles of 90 degrees, and that is true regardless of their azimuthal orientations relative to the tool.

Figure 3A:
FIG. 3 schematically shows a simple two-coil tool with a tilted transmitter and a co-located, triaxial, orthonormal receiver, in accordance with the present disclosure.
Figure 3B:
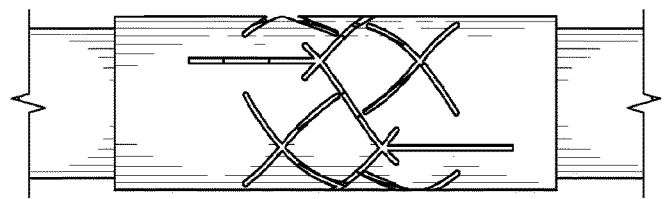
Figure 3C:
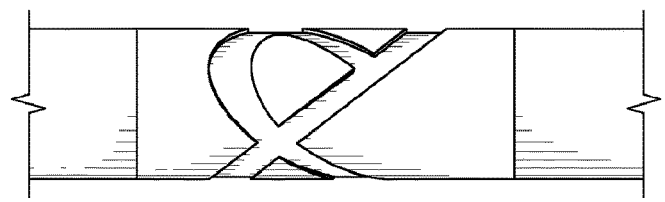
Figure 4:
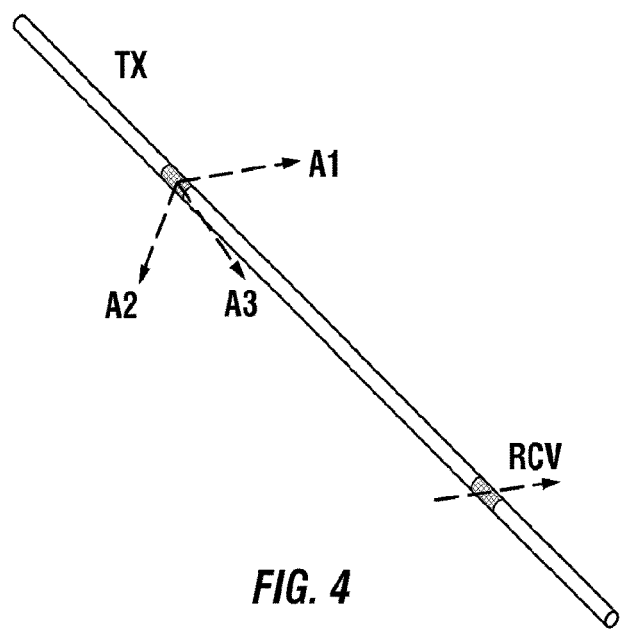
FIG. 4 schematically shows a logging tool with a co-located, triaxial, tilted transmitter and a tilted receiver, in accordance with the present disclosure.
Figure 5A:
FIG. 5 shows a tool with a tilted, triaxial, co-located, orthonormal transmitter and receiver, in accordance with the present disclosure.
Figure 5B:
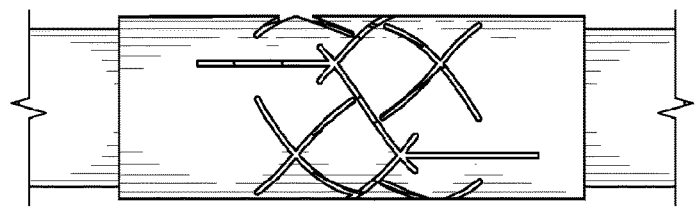
Figure 5C:
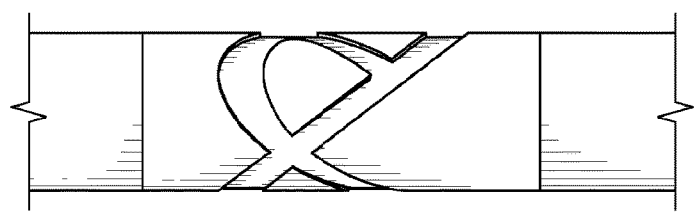

One possible embodiment of antenna design includes multi-component coils. For example, a co-located triaxial tilted antenna used for downhole resistivity measurements may be provided. The tilted coils each comprise a portion of a closed circuit around the collar perimeter, and can be either embedded in a recess about the tool collar or in a nonconductive cylinder that slides over the collar. The design has at least one triaxial antenna that can be used as a transmitter (or a receiver) with at least one additional antenna displaced along the tool axis as a receiver (or a transmitter). Multiple antennas with different spacings and frequencies may be used to cover the desired conductivity ranges and depths of investigation. The effect of farther transmitter-receiver spacing and/or a more conductive formation is compensated by using a lower frequency signal. FIG. 3 shows a tool with a tilted transmitter and a triaxial orthogonal receiver (the three receivers could also be orthonormal to one another). FIG. 4 shows the magnetic dipole equivalent of a logging tool with a co-located triaxial tilted transmitter and a tilted receiver, and FIG. 5 shows another embodiment in which the transmitter and the receiver are both co-located triaxial tilted antennas.

Figure 6:
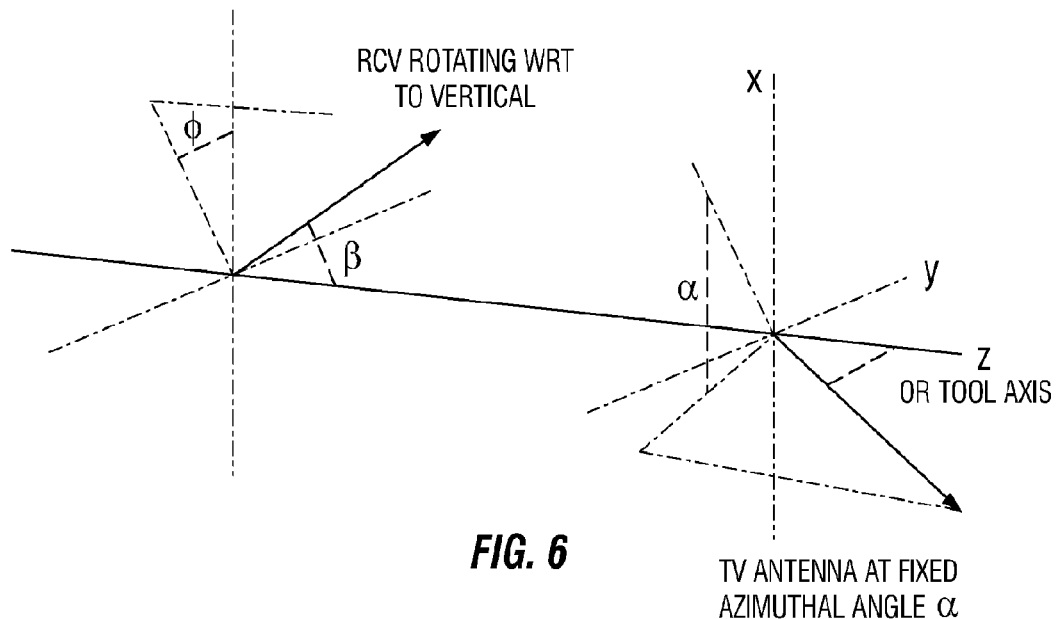
FIG. 6 shows the general geometry of two magnetic dipoles, in accordance with the present disclosure.

It can be shown that the square of the norm of raw measurements between a transmitter, T, and a receiver, R, is a function of the instantaneous tool face angle, and that it can be decomposed into a finite set of Fourier coefficients. Below is the general formula of the coupling between two magnetic dipoles with known orientations, as depicted in FIG. 6. FIG. 6 shows a T and an R antenna both tilted so that their equivalent magnetic dipole moments are at an angle β relative to the tool axis (45 degrees for FIG. 6). However, as shown, the antennas may have different azimuthal orientations. The azimuthal orientation of T relative to R is denoted by an angle α. That is, α is the angle between the projection of the receiver dipole moment onto the tool-fixed xy-plane and the projection of the transmitter dipole moment onto the same (or a parallel) plane. During drilling, if the tool rotates, for example, by a tool face angle φ, the T and R magnetic moments will rotate along with the tool while measurements are performed.

The voltage measured at the receiver is then:

$$V_{TR}(\phi) = \frac{1}{2}(\cos\alpha, \sin\alpha, 1) \cdot \begin{bmatrix} \cos\phi & \sin\phi & 0 \\ -\sin\phi & \cos\phi & 0 \\ 0 & 0 & 1 \end{bmatrix} \cdot \begin{bmatrix} (xx) & (xy) & (xz) \\ (yx) & (yy) & (yz) \\ (zx) & (zy) & (zz) \end{bmatrix} \cdot \begin{bmatrix} \cos\phi & -\sin\phi & 0 \\ \sin\phi & \cos\phi & 0 \\ 0 & 0 & 1 \end{bmatrix} \cdot \begin{pmatrix} 1 \\ 0 \\ 1 \end{pmatrix}$$

where the components of the coupling matrix (in the middle) (ij) are the elementary measurements in the absence of rotation when a transmitter in the i direction and a receiver in the j direction are used. The two matrices multiplying the coupling matrix are the rotation matrices that account for tool face angle. Finally, the vector on the right hand side is the orientation of the R dipole moment, while the one on the left hand side is that of the T antenna. The three matrixes in the middle can be re-written as M leading to:

$$V_{TR}(\phi) = m_T^t \cdot M(\phi) \cdot m_R$$

where M is given by:

$$M(\phi) = \begin{bmatrix} \frac{(xx)+(yy)}{2} + \frac{(xy)+(yx)}{2}\sin(2\phi) + & \frac{(xy)-(yx)}{2} + \frac{(yy)-(xx)}{2}\sin(2\phi) + & (xz)\cos(\phi) + (yz)\sin(\phi) \\ \frac{(xx)-(yy)}{2}\cos(2\phi) & \frac{(xy)+(yx)}{2}\cos(2\phi) & \\ \frac{(yx)-(xy)}{2} + \frac{(yy)-(xx)}{2}\sin(2\phi) + & \frac{(xx)+(yy)}{2} - \frac{(xy)+(yx)}{2}\sin(2\phi) - & (yz)\cos(\phi) - (xz)\sin(\phi) \\ \frac{(xy)+(yx)}{2}\cos(2\phi) & \frac{(xx)-(yy)}{2}\cos(2\phi) & \\ (zx)\cos(\phi) + (zy)\sin(\phi) & (zy)\cos(\phi) - (zx)\sin(\phi) & (zz) \end{bmatrix}$$

From the preceding equations, it is apparent that voltages measured at receivers will be periodic functions of the tool face angle $\phi$ and $2\phi$. The measured voltage can be represented as the second order Fourier expansion given by:

$$V_{TR}(\phi) = a + b \cdot \cos(\phi) + c \cdot \sin(\phi) + d \cdot \cos(2\phi) + e \cdot \sin(2\phi) \qquad 5$$

Those coefficients are simple linear combinations of individual terms of the coupling tensor. The relationships between the Fourier coefficients and the tensor coefficients are given by the next set of equations (after normalization by a factor of two):

$$\begin{cases} \text{DC Term} = a = (zz) + \cos(\alpha)\dfrac{(xx)+(yy)}{2} + \sin(\alpha)\dfrac{(yx)-(xy)}{2} & (1) \\ \cos\text{Term} = b = (zx) + \cos(\alpha)(xz) + \sin(\alpha)(yz) \\ \sin\text{Term} = c = (zy) - \sin(\alpha)(xz) + \cos(\alpha)(yz) \\ \cos2\text{Term} = d = \cos(\alpha)\dfrac{(xx)-(yy)}{2} + \sin(\alpha)\dfrac{(xy)+(yx)}{2} \\ \sin2\text{Term} = e = -\sin(\alpha)\dfrac{(xx)-(yy)}{2} + \cos(\alpha)\dfrac{(xy)+(yx)}{2} \end{cases}$$

The extraction of Fourier coefficients is actually a linear problem, since the measured voltage at the receiver is a linear function of the unknown vector $x = [a, b, c, d, e]$ with a known vector $w$ expressed as:

$$w = [1, \cos(\phi), \sin(\phi), \cos(2\phi), \sin(2\phi)]^T$$

Once at least five measurements are performed at different angles, the vector of Fourier coefficients can be computed by a Least-Square fit:

$$V = \begin{bmatrix} V_1 \\ \vdots \\ V_N \end{bmatrix} = \begin{bmatrix} 1 & \cos(\phi_1) & \sin(\phi_1) & \cos(2\phi_1) & \sin(2\phi_1) \\ \vdots & \vdots & \vdots & \vdots & \vdots \\ 1 & \cos(\phi_N) & \sin(\phi_N) & \cos(2\phi_N) & \sin(2\phi_N) \end{bmatrix} \cdot \begin{bmatrix} a \\ b \\ c \\ d \\ e \end{bmatrix} = K \cdot u$$

So $u = M^T(M^T \cdot M)^{-1} V$. It is also possible to have an on-line estimation of the same quantities by applying a Recursive Least-Square with the following goal function:

$$J_{LS}(n) = \sum_{i=1}^{n} \lambda^{n-i}(V(i) - w(i)^T \cdot x(i))$$

To reduce the effect of outliers that could appear in the data, we transform this problem goal function into:

$$J_M(n) = \sum_{i=1}^{n} \lambda^{n-i} \rho(e(i)) = \sum_{i=1}^{n} \lambda^{n-i} \rho(y(i) - w^T(i)x(i))$$

with $$\rho(e) = \begin{cases} \dfrac{e^2}{2}, & 0 < |e| < \xi \\ \dfrac{\xi^2}{2}, & \text{otherwise} \end{cases}$$

which is the classic Huber function.

The symbol $\xi$ corresponds to a good estimate of noise standard deviation. To estimate $\xi$, the standard deviation of noise, we compute residuals on a sliding window of past points versus prediction based on computed Fourier coefficients by applying the following algorithm:

$$\hat{\sigma}(n) = \lambda_\sigma \hat{\sigma}(n-1) + (1-\lambda_\sigma) c_1 \text{med}(\{e^2(n), e^2(n-1), \ldots, e^2(n-N_w-1)\})$$

This estimate is robust through the usage of median filtering on a set of past observed values, and is made adaptive by the exponential weight used in the update formula.

Once the Fourier coefficients are estimated, calibrated measurements can be constructed. The following shows how different kinds of measurements can be computed. The descriptions are split based on harmonics, because each harmonic leads to a measurement having a different azimuthal sensitivity. DC terms lead to measurements that do not depend on azimuth, first harmonic terms lead to measurements having a $\cos(\phi)$ sensitivity, and second harmonic terms lead to measurements having a $\cos(2\phi)$ sensitivity.

Using equation set (1) with lines 1, 2 and 3, and defining $$M_\alpha = \frac{1^{rst}H\,\text{Cos}}{DC} \quad \& \quad N_\alpha = \frac{1^{rst}H\,\text{Sin}}{DC},$$

we have the first harmonic equations:

$$\begin{cases} -M_\alpha \cos(\alpha)\dfrac{(xx)+(yy)}{2(zz)} - M_\alpha \sin(\alpha)\dfrac{(xy)-(yx)}{2(zz)} + \dfrac{(xz)}{(zz)} + \cos(\alpha)\dfrac{(zx)}{(zz)} + \sin(\alpha)\dfrac{(zy)}{(zz)} = M_\alpha \\ -N_\alpha \cos(\alpha)\dfrac{(xx)+(yy)}{2(zz)} - N_\alpha \sin(\alpha)\dfrac{(xy)-(yx)}{2(zz)} + \dfrac{(yz)}{(zz)} - \sin(\alpha)\dfrac{(zx)}{(zz)} + \cos(\alpha)\dfrac{(zy)}{(zz)} = N_\alpha \end{cases}$$

Since we have three transmitting antennas, we have a sufficient system of equations:

$$\begin{cases} -M_{\beta 1}\cos(\beta 1)\dfrac{(xx)+(yy)}{2(zz)} - M_{\beta 1}\sin(\beta 1)\dfrac{(xy)-(yx)}{2(zz)} + \dfrac{(xz)}{(zz)} + \cos(\beta 1)\dfrac{(zx)}{(zz)} + \sin(\beta 1)\dfrac{(zy)}{(zz)} = M_{\beta 1} \\ -N_{\beta 1}\cos(\beta 1)\dfrac{(xx)+(yy)}{2(zz)} - N_{\beta 1}\sin(\beta 1)\dfrac{(xy)-(yx)}{2(zz)} + \dfrac{(yz)}{(zz)} - \sin(\beta 1)\dfrac{(zx)}{(zz)} + \cos(\beta 1)\dfrac{(zy)}{(zz)} = N_{\beta 1} \\ -M_{\beta 2}\cos(\beta 2)\dfrac{(xx)+(yy)}{2(zz)} - M_{\beta 2}\sin(\beta 2)\dfrac{(xy)-(yx)}{2(zz)} + \dfrac{(xz)}{(zz)} + \cos(\beta 2)\dfrac{(zx)}{(zz)} + \sin(\beta 2)\dfrac{(zy)}{(zz)} = M_{\beta 2} \\ -N_{\beta 2}\cos(\beta 2)\dfrac{(xx)+(yy)}{2(zz)} - N_{\beta 2}\sin(\beta 2)\dfrac{(xy)-(yx)}{2(zz)} + \dfrac{(yz)}{(zz)} - \sin(\beta 2)\dfrac{(zx)}{(zz)} + \cos(\beta 2)\dfrac{(zy)}{(zz)} = N_{\beta 2} \\ -M_{\beta 3}\cos(\beta 3)\dfrac{(xx)+(yy)}{2(zz)} - M_{\beta 3}\sin(\beta 3)\dfrac{(xy)-(yx)}{2(zz)} + \dfrac{(xz)}{(zz)} + \cos(\beta 3)\dfrac{(zx)}{(zz)} + \sin(\beta 3)\dfrac{(zy)}{(zz)} = M_{\beta 3} \\ -N_{\beta 3}\cos(\beta 3)\dfrac{(xx)+(yy)}{2(zz)} - N_{\beta 3}\sin(\beta 3)\dfrac{(xy)-(yx)}{2(zz)} + \dfrac{(yz)}{(zz)} - \sin(\beta 3)\dfrac{(zx)}{(zz)} + \cos(\beta 3)\dfrac{(zy)}{(zz)} = N_{\beta 3} \end{cases}$$

Solving this system in the Least-Square sense yields:

$$\frac{(zx)}{(zz)}, \frac{(zy)}{(zz)}, \frac{(xz)}{(zz)}, \frac{(yz)}{(zz)} \qquad 5$$

and the following calibrated measurements are created:

$$\begin{cases} SDA = -20 * \log 10 \left\| \frac{1 + \frac{(zx)}{(zz)}}{1 - \frac{(zx)}{(zz)}} \cdot \frac{1 - \frac{(xz)}{(zz)}}{1 + \frac{(xz)}{(zz)}} \right\| \\ SDP = 180 * \text{angle}\left( \frac{1 + \frac{(zx)}{(zz)}}{1 - \frac{(zx)}{(zz)}} \cdot \frac{1 - \frac{(xz)}{(zz)}}{1 + \frac{(xz)}{(zz)}} \right) / \pi \end{cases} \qquad 10$$

Using equation set (1) with lines 1, 4 and 5 yields:

$$\begin{cases} -O_\beta \cos(\beta)\frac{(xx)+(yy)}{2(zz)} - O_\beta \sin(\beta)\frac{(xy)-(yx)}{2(zz)} + \cos(\beta)\frac{(xx)-(yy)}{2(zz)} + \sin(\beta)\frac{(xy)+(yx)}{2(zz)} = O_\beta \\ -P_\beta \cos(\beta)\frac{(xx)+(yy)}{2(zz)} - P_\beta \sin(\beta)\frac{(xy)-(yx)}{2(zz)} - \sin(\beta)\frac{(xx)-(yy)}{2(zz)} + \cos(\beta)\frac{(xy)+(yx)}{2(zz)} = P_\beta \end{cases}$$

with $$O_\alpha = \frac{2^{nd}H \; \text{Cos}}{DC} \; \& \; P_\alpha = \frac{2^{nd}H \; \text{Sin}}{DC}.$$

Because we have three transmitting antennas, we have a sufficient system of equation:

$$\begin{cases} -O_{\beta 1}\cos(\beta 1)\frac{(xx)+(yy)}{2(zz)} - O_{\beta 1}\sin(\beta 1)\frac{(xy)-(yx)}{2(zz)} + \cos(\beta 1)\frac{(xx)-(yy)}{2(zz)} + \sin(\beta 1)\frac{(xy)+(yx)}{2(zz)} = O_{\beta 1} \\ -P_{\beta 1}\cos(\beta 1)\frac{(xx)+(yy)}{2(zz)} - P_{\beta 1}\sin(\beta 1)\frac{(xy)-(yx)}{2(zz)} - \sin(\beta 1)\frac{(xx)-(yy)}{2(zz)} + \cos(\beta 1)\frac{(xy)+(yx)}{2(zz)} = P_{\beta 1} \\ -O_{\beta 2}\cos(\beta 2)\frac{(xx)+(yy)}{2(zz)} - O_{\beta 2}\sin(\beta 2)\frac{(xy)-(yx)}{2(zz)} + \cos(\beta 2)\frac{(xx)-(yy)}{2(zz)} + \sin(\beta 2)\frac{(xy)+(yx)}{2(zz)} = O_{\beta 2} \\ -P_{\beta 2}\cos(\beta 2)\frac{(xx)+(yy)}{2(zz)} - P_{\beta 2}\sin(\beta 2)\frac{(xy)-(yx)}{2(zz)} - \sin(\beta 2)\frac{(xx)-(yy)}{2(zz)} + \cos(\beta 2)\frac{(xy)+(yz)}{2(zz)} = P_{\beta 2} \\ -O_{\beta 3}\cos(\beta 3)\frac{(xx)+(yy)}{2(zz)} - O_{\beta 3}\sin(\beta 3)\frac{(xy)-(yx)}{2(zz)} + \cos(\beta 3)\frac{(xx)-(yy)}{2(zz)} + \sin(\beta 3)\frac{(xy)+(yx)}{2(zz)} = O_{\beta 3} \\ -P_{\beta 3}\cos(\beta 3)\frac{(xx)+(yy)}{2(zz)} - P_{\beta 3}\sin(\beta 3)\frac{(xy)-(yx)}{2(zz)} - \sin(\beta 3)\frac{(xx)-(yy)}{2(zz)} + \cos(\beta 3)\frac{(xy)+(yx)}{2(zz)} = P_{\beta 3} \end{cases}$$

Solving this system in the Least-Square sense yields:

$$\frac{(xx)-(yy)}{2(zz)}, \frac{(xx)+(yy)}{2(zz)}$$

We can construct the calibrated measurements:

$$\begin{cases} SHA = -20 * \log 10 \left\| \frac{(xx)}{(yy)} \right\| \\ SHP = 180 * \text{angle}\left( \frac{(xx)}{(yy)} \right) / \pi. \end{cases}$$

For the DC terms, assuming the knowledge of the currents, we have three impedances:

$$L_{\beta i} = \frac{DC}{Current_i}$$

So the system of equations becomes:

$$\begin{cases} L_{\beta 1} = (zz) + \cos(\beta 1)\frac{(xx)+(yy)}{2} + \sin(\beta 1)\frac{(xy)-(yx)}{2} \\ L_{\beta 2} = (zz) + \cos(\beta 2)\frac{(xx)+(yy)}{2} + \sin(\beta 2)\frac{(xy)-(yx)}{2} \\ L_{\beta 3} = (zz) + \cos(\beta 3)\frac{(xx)+(yy)}{2} + \sin(\beta 3)\frac{(xy)-(yx)}{2} \end{cases}$$

for which we solve for $$(zz), \frac{(xx)+(yy)}{2}, \frac{(xy)-(yx)}{2},$$

and the created calibrated measurements are:

$$\begin{cases} HRA = 20*\log 10 \left\| \frac{(xx)+(yy)}{2(zz)} \right\| \\ SHP = 180*\text{angle}\left(\frac{(xx)+(yy)}{2(zz)}\right)/\pi. \end{cases}$$

Figure 8:
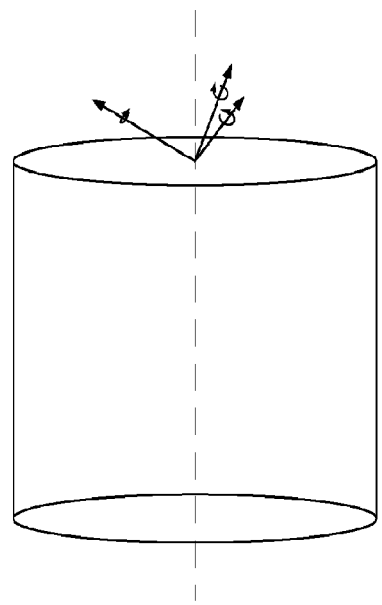
FIG. 8 schematically shows triaxial magnetic moments m1, m2, and m3 about a collar, where the coils are oriented 120 degrees apart azimuthally and dipping at an angle 54.74 degrees off the tool axis, in accordance with the present disclosure.

A triaxial co-located orthonormal antenna, where the magnetic moments shown in FIG. 8 are oriented about the axis of the metal collar, is suitable for LWD use. These moments can be skewed or non-orthogonal. The most convenient construction is where the magnetic moments m1, m2, and m3 are orthonormal, separated by 120 degrees about the z-axis, and tilted at an angle of arctan(sqrt(2)) (54.74 degrees). The coils are assumed to be imbedded in a non-conductor within a recess in the collar. This assembly of orthonormal co-located coils is then protected by a slotted metal shield. The coils can be recessed in the collar with a shield fixed over them, or the coils can be embedded in a non-conductive tube that is inserted into the shield itself. A method of designing such shield and antenna configurations is described below.

Figure 7:
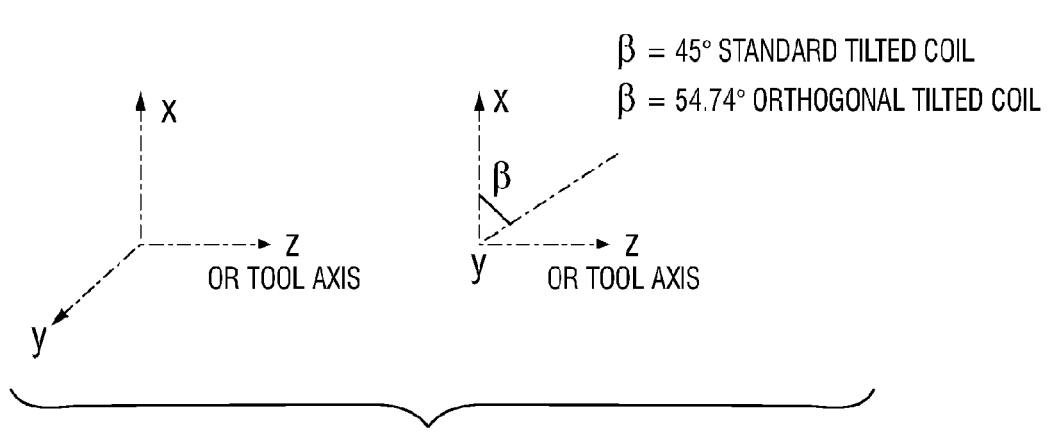
FIG. 7 shows tilted coil coordinates, in accordance with the present disclosure.

For the purpose of these discussions, we will concentrate on the magnetic dipole equivalent of a tilted coil. For convenience, it we assume the windings of a tilted coil are in a plane, it can be characterized by two angles. In the description here, the tilt angle is defined as the angle between the normal to the plane and a transverse axis (x or y for example). As such the tilt angle relative to the z axis is $90-\beta$, as shown in FIG. 7. Note that the normal to the antenna plane is the equivalent magnetic dipole of the antenna. The second angle is the standard azimuthal angle, $\varphi$, used in the polar coordinate system and is the angle between the x axis and the projection of the normal onto the xy-plane. With these definitions, the trajectory or equations of a tilted coil winding are:

$$x = R \cdot \cos \varphi$$

$$y = R \cdot \sin \varphi$$

$$z = R \cdot \tan \beta \cdot \cos \varphi,$$

where $90-\beta$ is the tilt angle of the coil with respect to the z axis, R is the radius of the coil, and $\varphi$ is the azimuthal angle.

Figure 9:
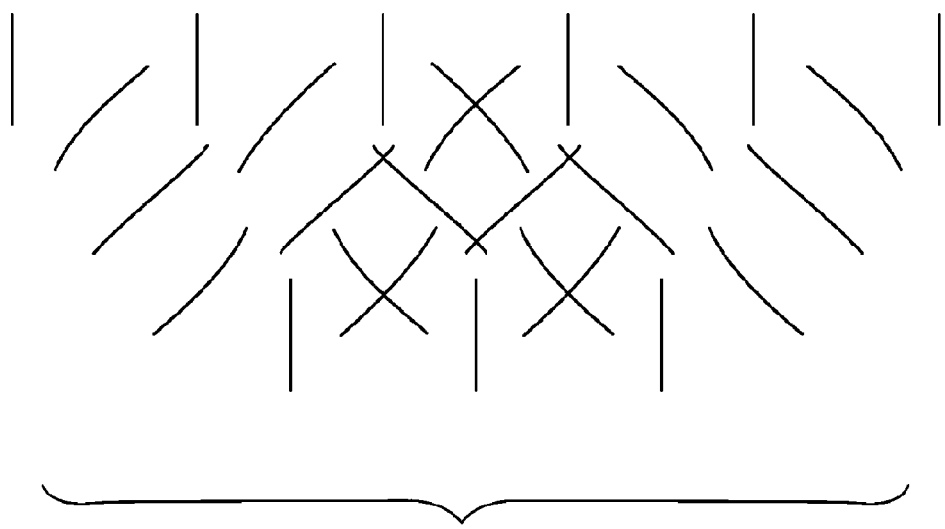
FIG. 9 is a diagram of an exemplary slot pattern of an unwrapped shield for a set of co-located triaxial coils, in accordance with the present disclosure.

The shield is a cylindrical structure that encompasses the tilted coil. It contains a series of cut outs or slots to allow electromagnetic radiation to pass through the metallic shield, as shown in FIG. 9. The location of the slots may be equally spaced along the trajectory of the coil. That would functionally make the arc length between any two slots equal to:

$$s_i = \int_{\varphi_i}^{\varphi_{i+1}} \sqrt{1+R^2 \tan^2\beta \sin^2\omega}\, d\omega = C_{coil}/N_{slot},$$

where $\beta$ is the tilt angle, $\varphi_i$ is the angle where the slot and coil intersect, $$C_{coil} \int_0^{2\pi} \sqrt{1+R^2\tan^2\beta\sin^2\omega}\, d\omega$$

is the coil circumference, and $N_{slot}$ is the number of slots.

The slots are orthogonal to the coil trajectory so that:

$$z_i(\varphi_i) = \int_0^{\varphi_i} \frac{d\varphi}{-\frac{dz}{d\varphi}} + C = \frac{R}{\tan\beta}\ln\left|\tan\left(\frac{\varphi}{2}\right)\right| + C,$$

where $$C = z(\varphi_i) - \frac{R}{\tan\beta}\ln\left|\tan\left(\frac{\varphi_i}{2}\right)\right|.$$

The trajectory of the i-th slot is now given as:

$$z(\varphi) = z_i(\varphi) - z(\varphi_i) = \frac{R}{\tan\beta}\ln\left|\tan\left(\frac{\varphi}{2}\right)/\tan\left(\frac{\varphi_i}{2}\right)\right|,$$

where $$\varphi_{min} = 2\tan^{-1}\left(\tan\left(\frac{\varphi_i}{2}\right)e^{-h_s \cdot \tan\beta}/2R\right)$$

and $$\varphi_{max} = 2\tan^{-1}\left(\tan\left(\frac{\varphi_i}{2}\right)e^{h_s \cdot \tan\beta}/2R\right).$$

Here the projection of the slot height or length along the tool axis is set equal to $h_s$.

Figure 10:
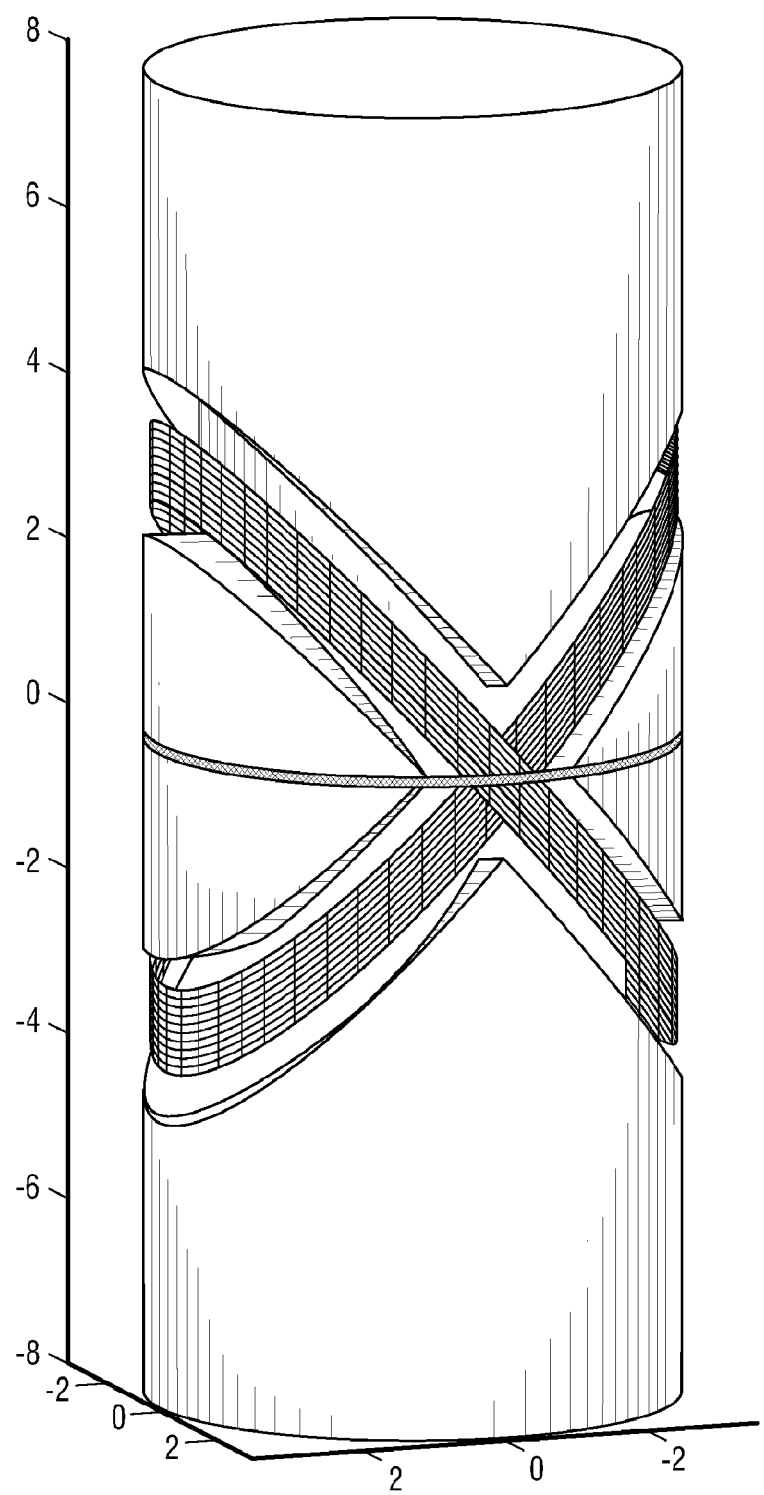
FIG. 10 schematically shows biaxial, co-located antennas with 45 degree tilt angles, in accordance with the present disclosure. The black center ring represents a calibration coil.
Figure 11:
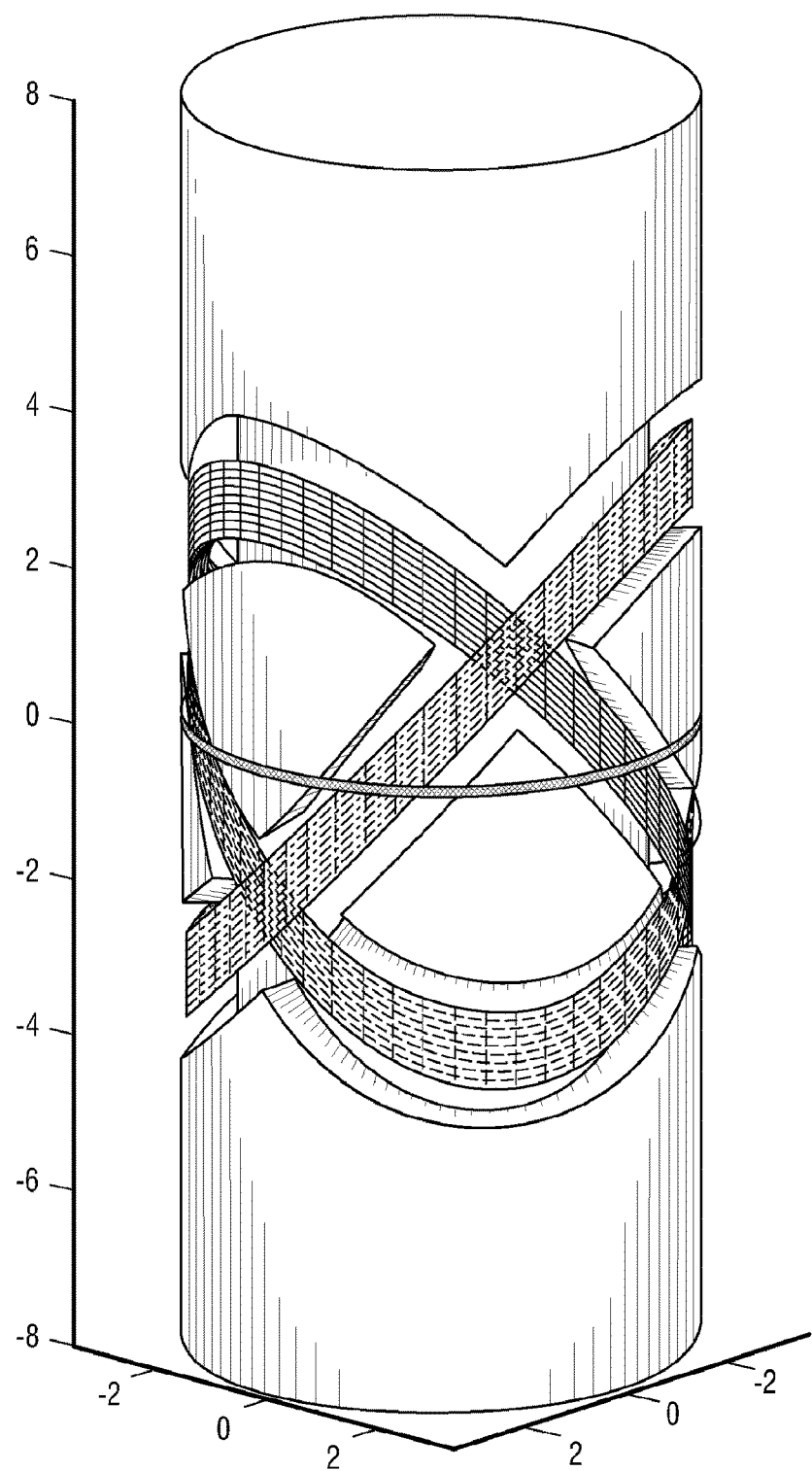
FIG. 11 schematically shows co-located antennas with 45 degree tilt angles, in accordance with the present disclosure. The black center ring represents a calibration coil.

As shown in the embodiment of FIG. 10, biaxial co-located antennas tilted 45 degrees with respect to the tool axis may be wrapped on a recessed metal collar. The two coils are azimuthally offset by 180 degrees from each other, but the azimuthal offset is not limited to 180 degrees. FIG. 11 shows triaxial co-located tilted antennas that are azimuthally offset by 120 degree from each other. The supporting metal collar is preferably recessed as shown in FIG. 11. To have a signal loss less than 2 dB, the recess width is preferably about 8 times greater than the recess height.

FIG. 11 also shows a calibration coil. The calibration coil provides a simple way to calibrate the antennas simultaneously. A small current sent to the calibration coil generates a magnetic field. The co-located antennas receive this magnetic field and generate induced currents that are proportional to their efficiencies. Thus, the induced currents provide calibration factors for the tilted coils.

As mentioned above, shields are cylindrical structures with slots. If the structure is conductive (metallic), then the slots are non-conductive and vice versa. For a metallic shield enclosing a coil, the slots are distributed around the circumference of the shield and they are cut to be perpendicular to the coil wire. The number of slots is a design variable. Increasing the number of slots reduces the attenuation of the radiation through the slots, but as the number of slots increases, the mechanical integrity of the shield is reduced and, above four or five slots, the gain in attenuation is not as great.

Figure 12A:
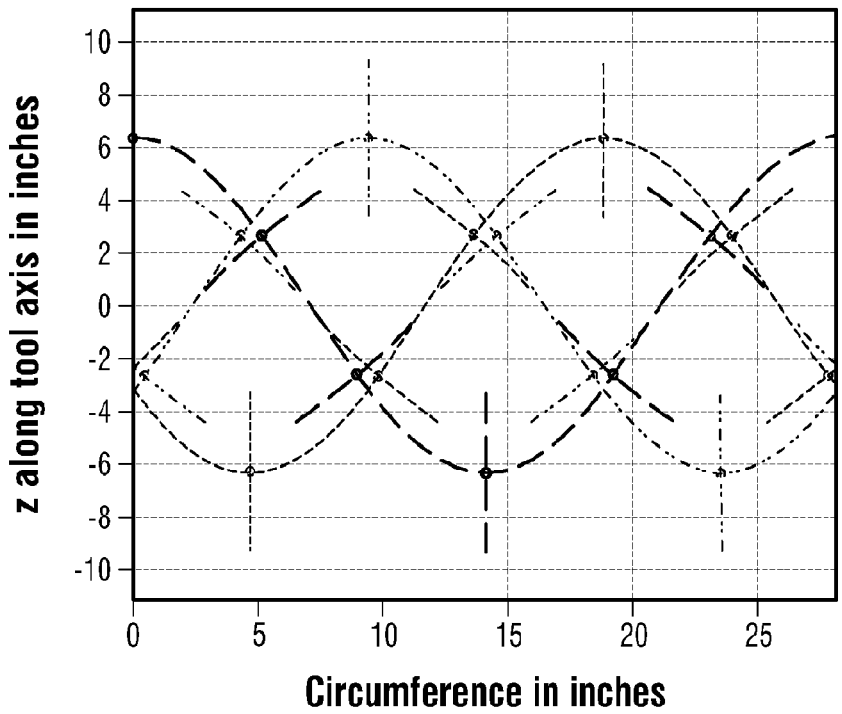
FIGS. 12a, 12b, and 12c show slot configurations of six, ten, and twelve slots, respectively, in accordance with the present disclosure.
Figure 12B:
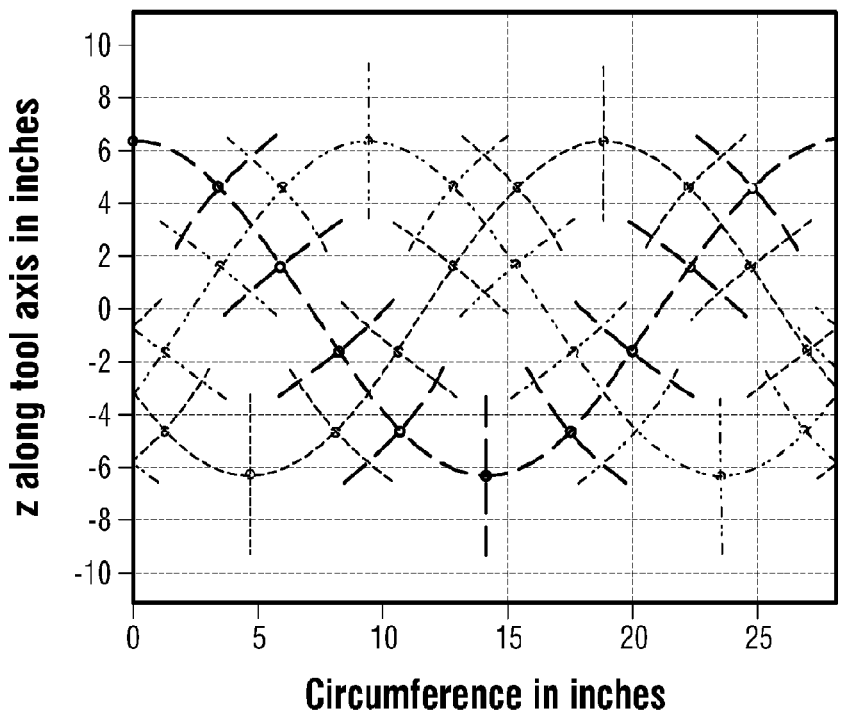
Figure 12C:
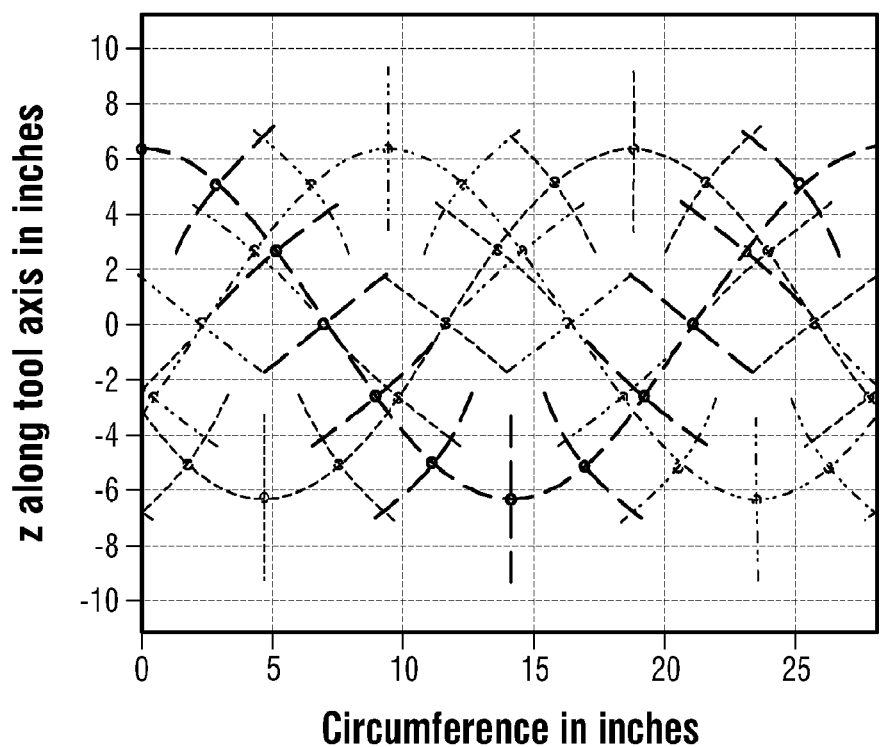
Figure 13:
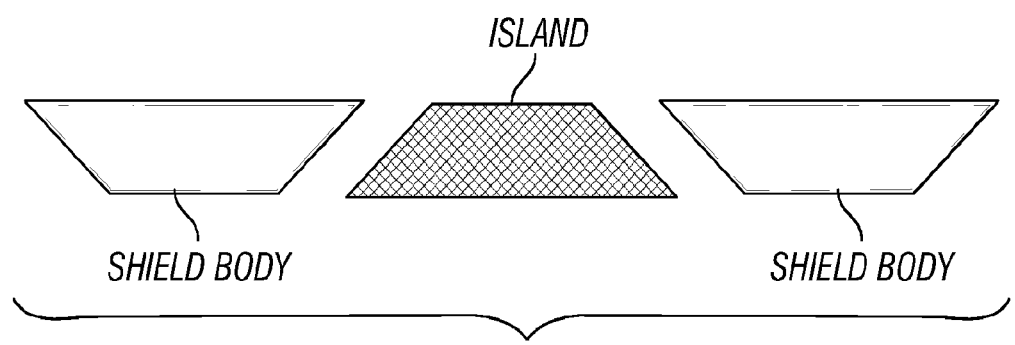
FIG. 13 illustrates a method for attaching island pieces to the shield, in accordance with the present disclosure.

FIGS. 12a-12c show the effect of varying the number of slots for three co-located coils that are tilted at 54.74 degrees relative to the tool axis (which gives a set of three orthogonally aligned antennas) and are distributed 120 degrees azimuthally. In FIGS. 12a-12c the three coils are shown as sinusoidal curves with their corresponding slots. With six slots (FIG. 12a), only two slots intersect and the shield has good mechanical integrity. When the number of slots is increased to ten, as in FIG. 12b, up to four slots can intersect and create a diamond shape that is not physically connected to the remainder of the metal structure. In FIG. 12b, there are six diamond shaped cut outs that we call "islands". These cut out islands need to be kept in the shield structure for both electrical and mechanical reasons. A method of achieving this is to taper the edges of the island piece and the associated shield so that the island's outer surface dimensions are smaller than the shield opening while the island's inner surface dimensions are larger than the shield opening. FIG. 13 shows a cross sectional view of this arrangement. Since the slots are filled with non-conductive material such as epoxy, the pieces are held together. FIG. 12c shows twelve slots which not only create islands, but also a complete cut around the circumference of the shield, which can be detrimental to the mechanical structure of the shield.

Figure 14A:
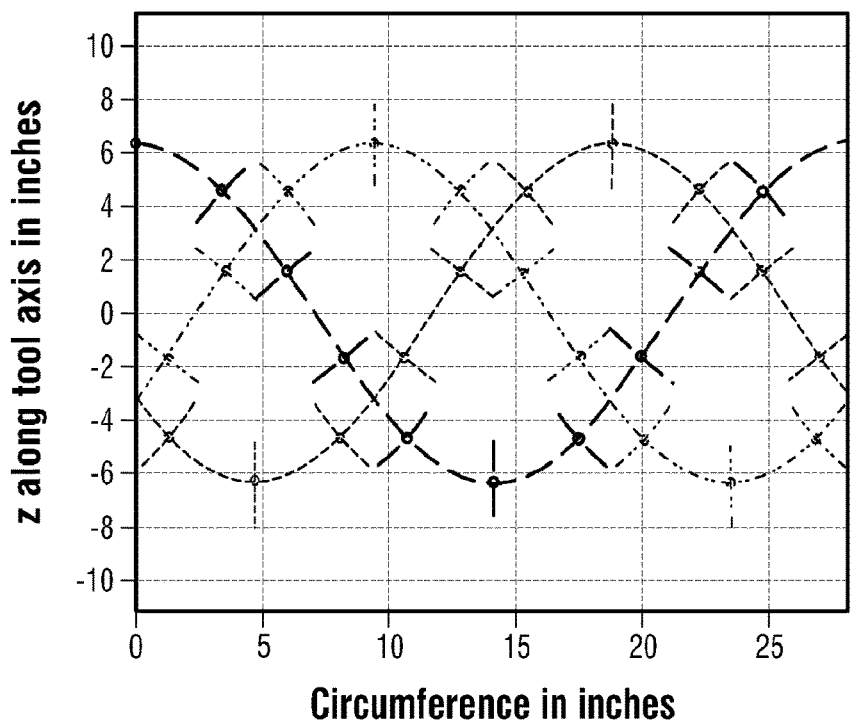
FIGS. 14a, 14b, and 14c show slot configurations of ten slots having slot lengths of three, four, and six inches, respectively, in accordance with the present disclosure.
Figure 14B:
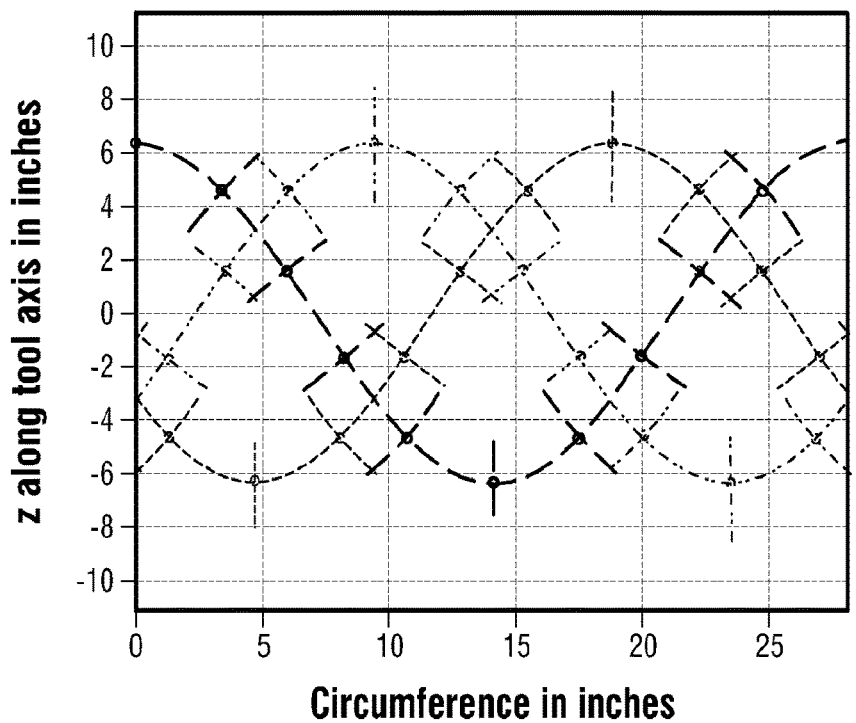
Figure 14C:
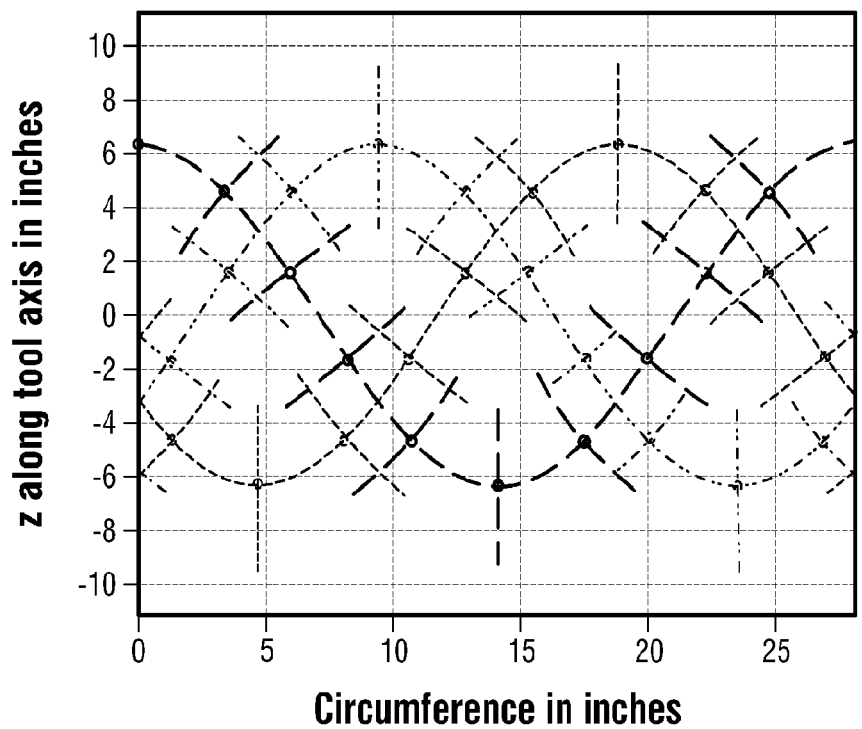

Another design parameter is the length of the slots. Increasing the length of the slots improves the efficiency of the antenna. However, above certain slot lengths the improvement is marginal at best. As with the higher number of slots, the longer slot length reduces the mechanical integrity of the shield and can lead to islands. FIGS. 14a-14c show the effect of varying the slot length for three co-located antennas with 54.74 degree tilt relative to the tool axis and 120 degree azimuthal offsets. As FIG. 14a shows, with slot lengths of 3 inches, some of the slots intersect, but only in pairs, so that there are no islands. When the slot length is increased to four inches, as in FIG. 14b, the structure comes very close to forming islands without actually doing so. However, the connections may not be strong enough for mechanical reasons and provisions such as that shown in FIG. 13 may be used to enhance the mechanical integrity of the shield. As the slot length increases to 6 inches, as in FIG. 14c, formation of islands is unavoidable.

Figure 15:
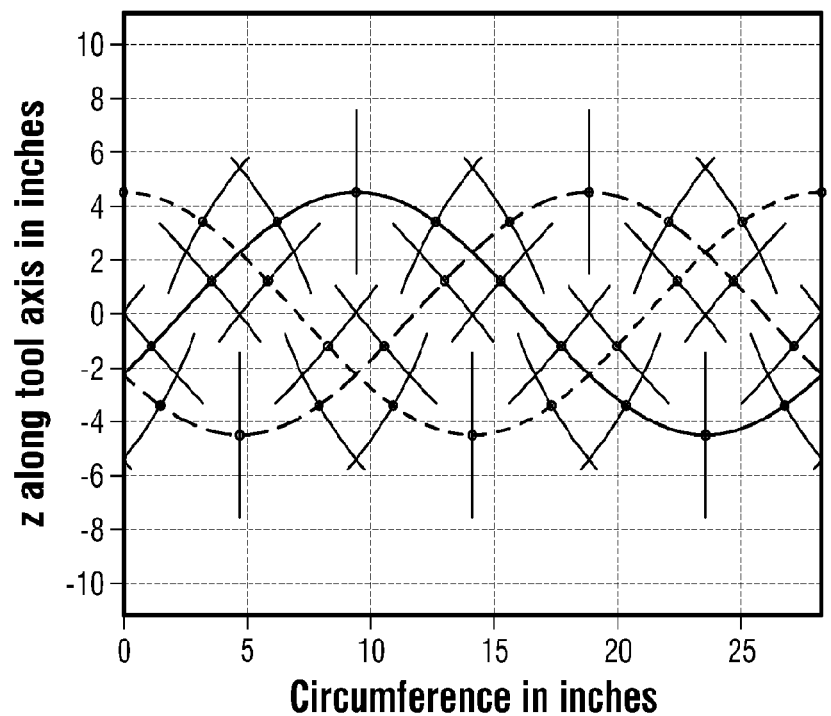
FIG. 15 shows a slot configuration of ten slots having slot lengths of six inches and antennas with tilt angles of 45 degrees, in accordance with the present disclosure.
Figure 17A:
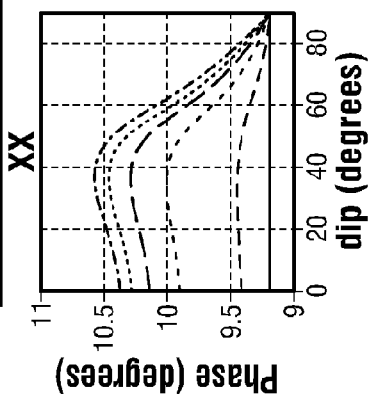
FIG. 17 shows a tensor phase response of a 36 inch T1 and a R12 spacing of 12 inches versus dip and anisotropy with frequency of 400 kHz, in accordance with the present disclosure.
Figure 17B:
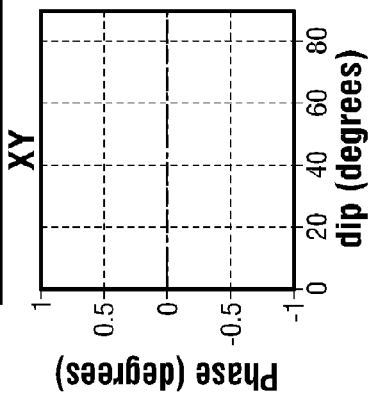
Figure 17C:
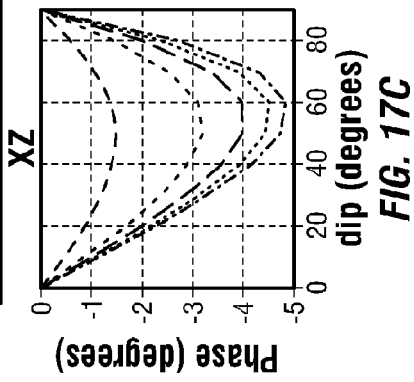
Figure 17D:
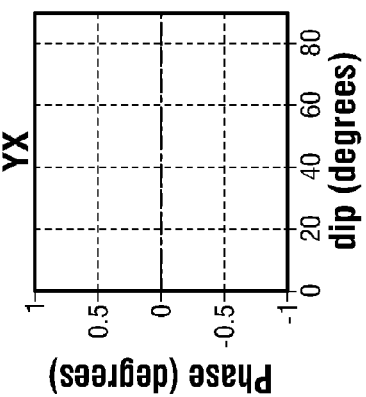
Figure 17E:
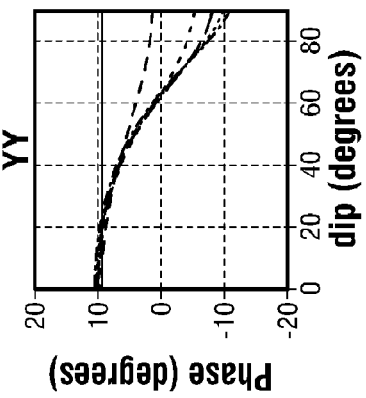
Figure 17F:
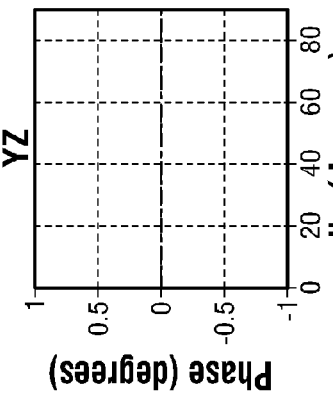
Figure 17G:
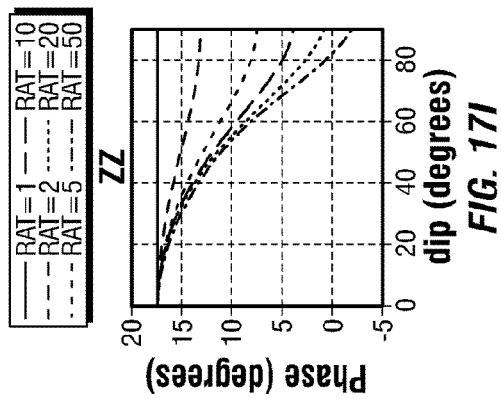
Figure 17H:
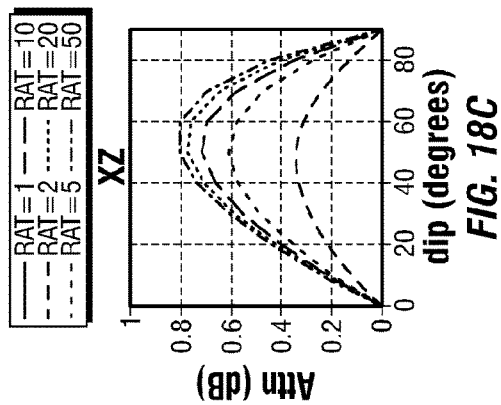
Figure 17I:
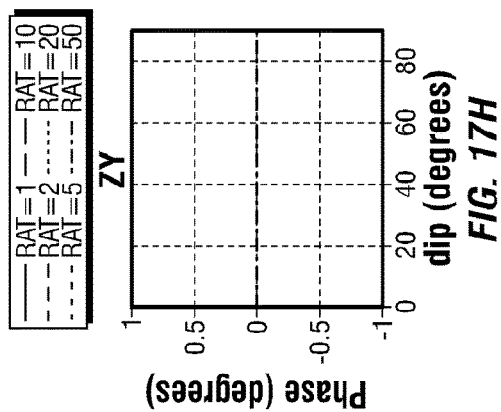
Figure 18A:
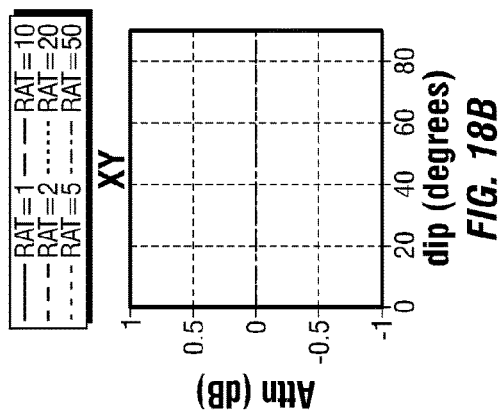
FIG. 18 shows a tensor attenuation response of a 36 inch T1 and a R12 spacing of 12 inches versus dip and anisotropy with frequency of 400 kHz, in accordance with the present disclosure.
Figure 18B:
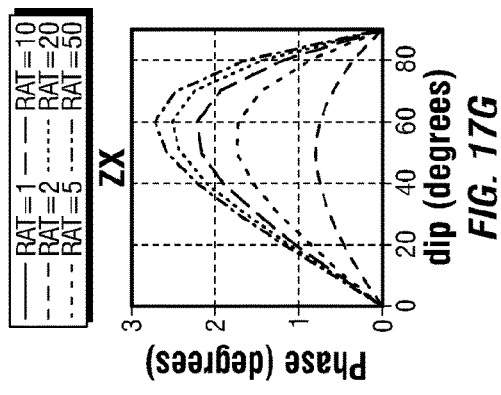
Figure 18C:
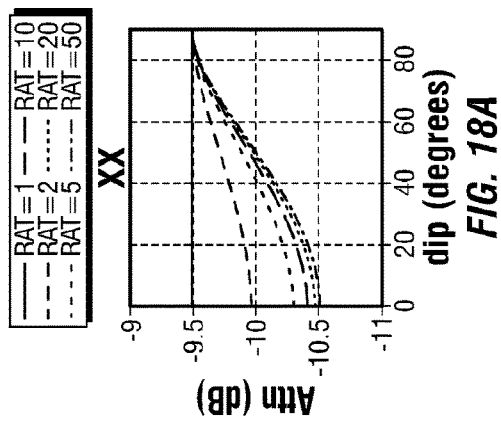
Figure 18D:
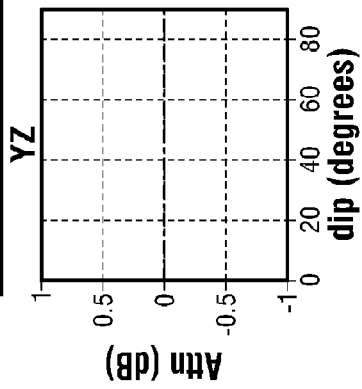
Figure 18E:
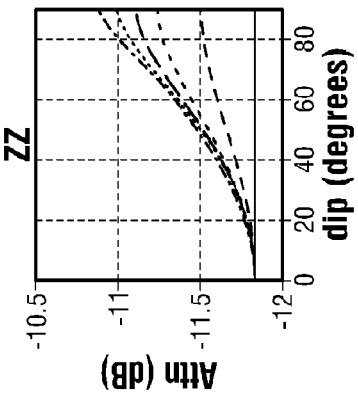
Figure 18F:
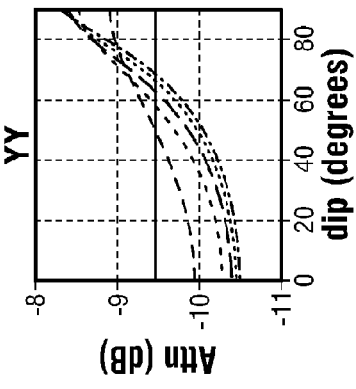
Figure 18G:
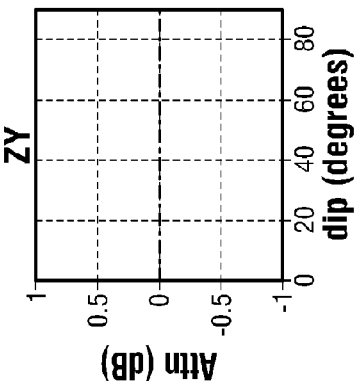
Figure 18H:
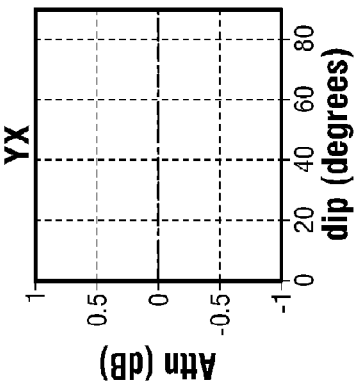
Figure 18I:
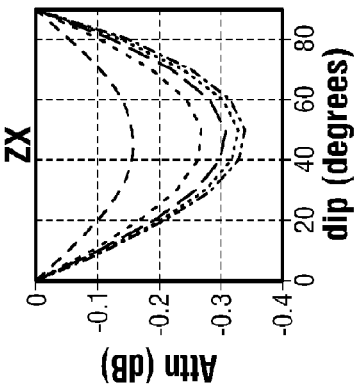
Figure 19A:
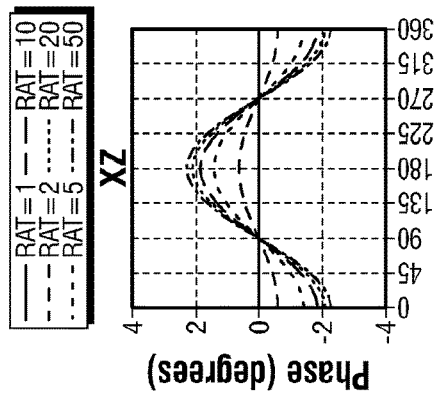
FIG. 19 shows a tensor phase response of a 36 inch T1 and a R12 spacing of 12 inches versus azimuth and anisotropy with frequency of 400 kHz, in accordance with the present disclosure.
Figure 19D:
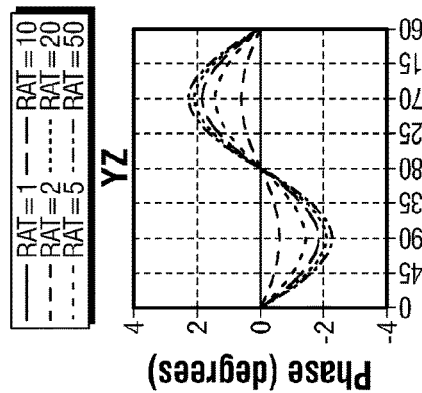
Figure 19B:
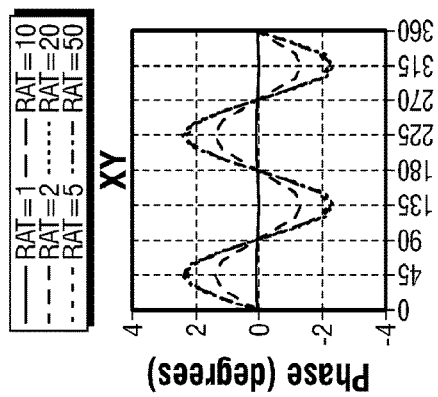
Figure 19E:
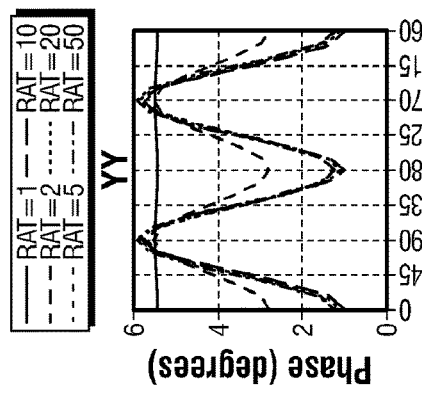
Figure 19C:
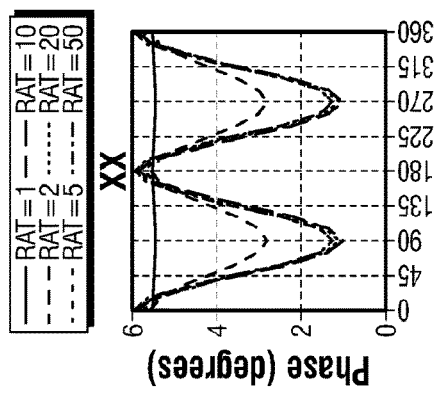
Figure 19F:
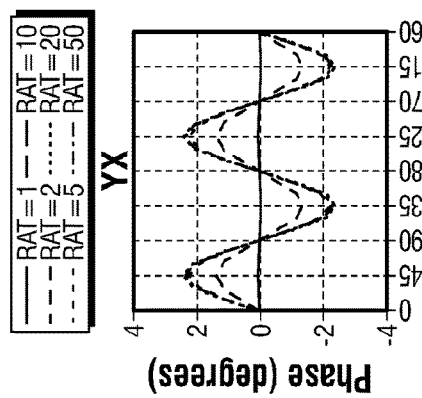
Figure 20D:
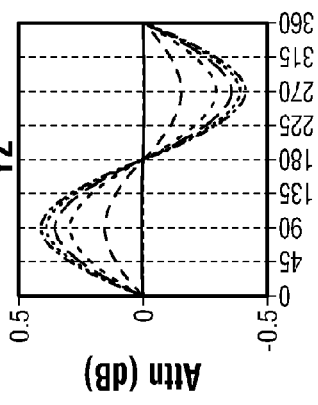
FIG. 20 shows a tensor attenuation response of a 36 inch T1 and a R12 spacing of 12 inches versus azimuth and anisotropy with frequency of 400 kHz, in accordance with the present disclosure.
Figure 20E:
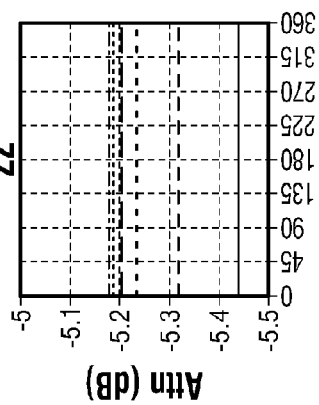
Figure 20F:
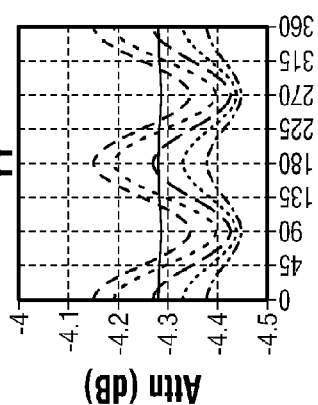
Figure 20G:
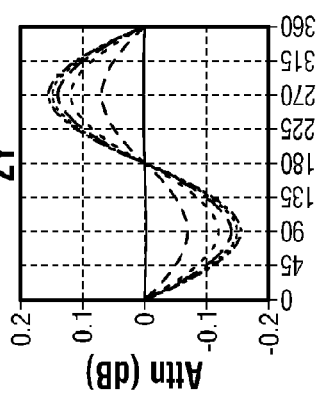
Figure 20H:
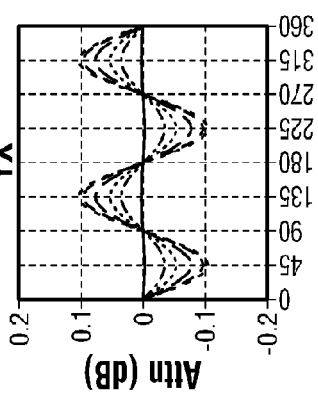
Figure 20I:
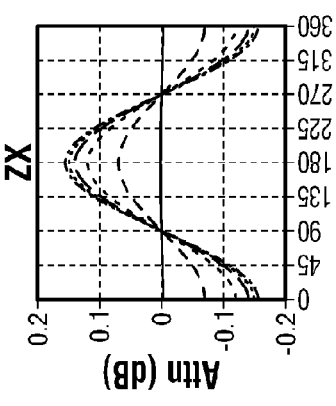
Figure 21G:
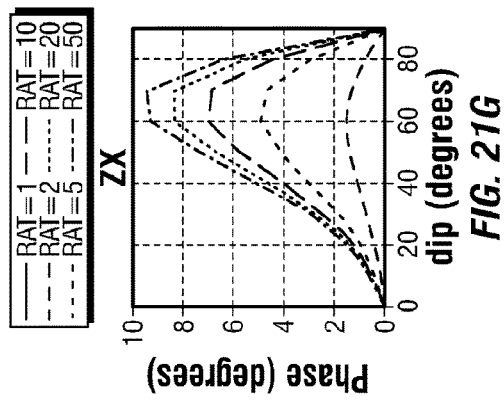
FIG. 21 shows a tensor phase response of a 36 inch T1 and a R12 spacing of 12 inches versus dip and anisotropy with frequency of 2 MHz, in accordance with the present disclosure.
Figure 21H:
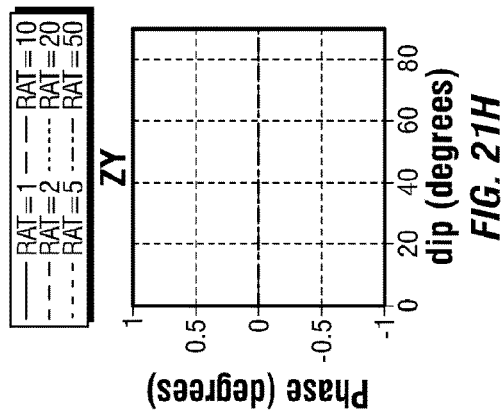
Figure 21I:
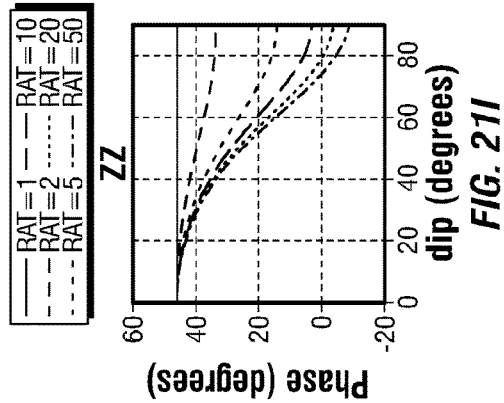
Figure 22A:
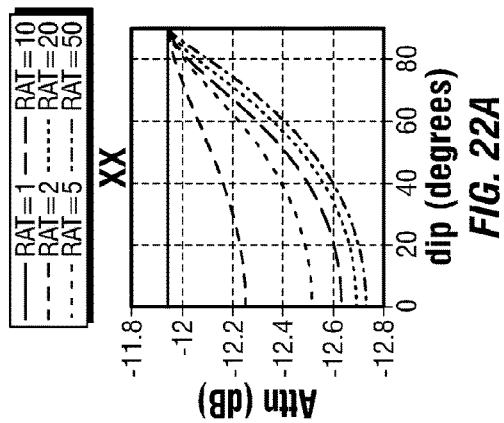
FIG. 22 shows a tensor attenuation response of a 36 inch T1 and a R12 spacing of 12 inches versus dip and anisotropy with frequency of 2 MHz, in accordance with the present disclosure.
Figure 22B:
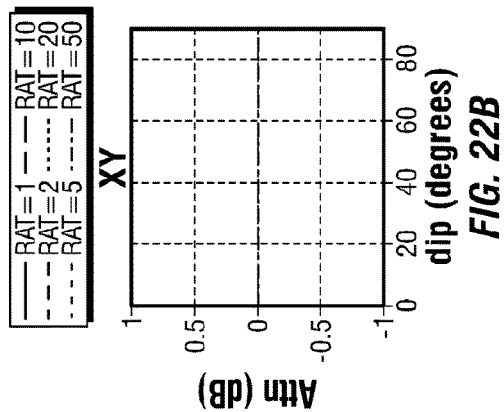
Figure 22C:
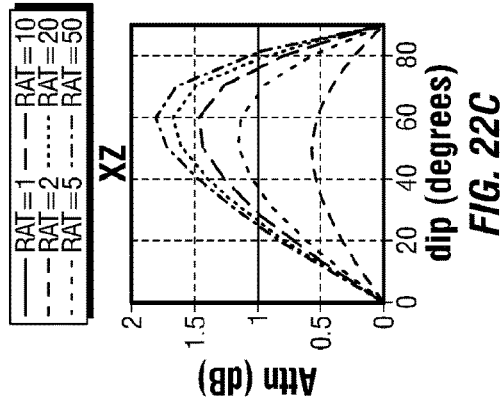
Figure 22D:
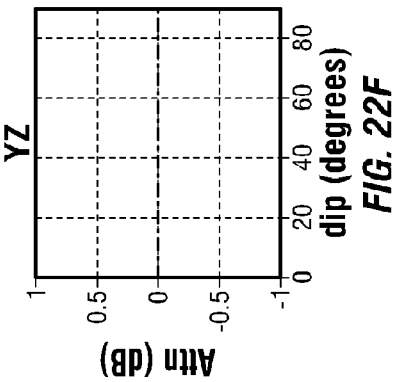
Figure 22E:
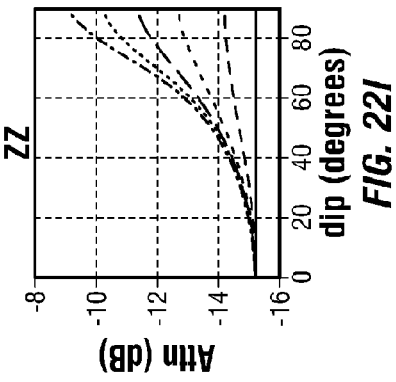
Figure 22F:
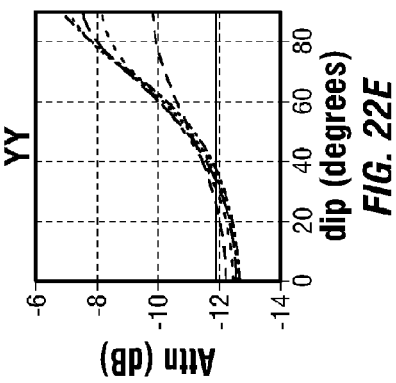
Figure 22G:
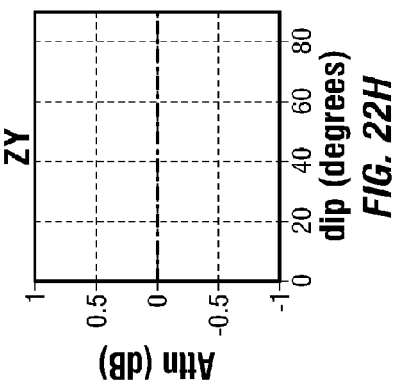
Figure 22H:
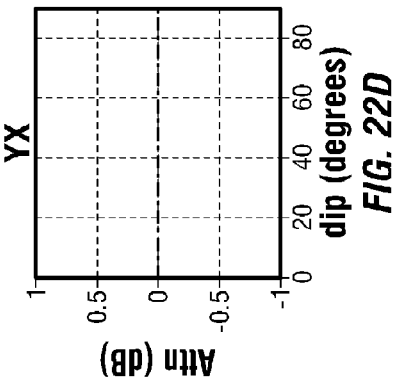
Figure 22I:
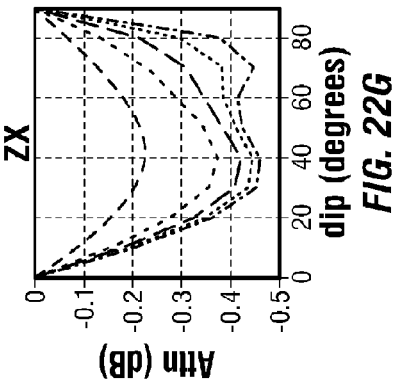
Figure 23G:
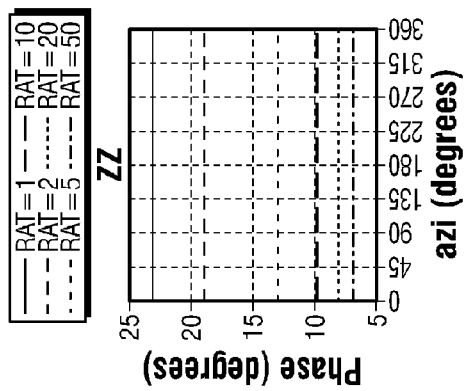
FIG. 23 show shows a tensor phase response of a 36 inch T1 and a R12 spacing of 12 inches versus azimuth and anisotropy with frequency of 2 MHz, in accordance with the present disclosure.
Figure 24A:
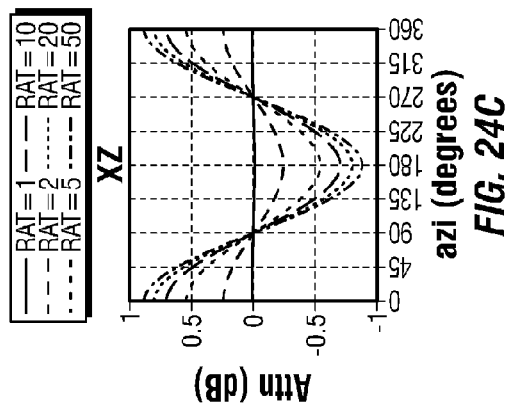
FIG. 24 shows a tensor attenuation response of a 36 inch T1 and a R12 spacing of 12 inches versus azimuth and anisotropy with frequency of 2 MHz, in accordance with the present disclosure.
Figure 23H:
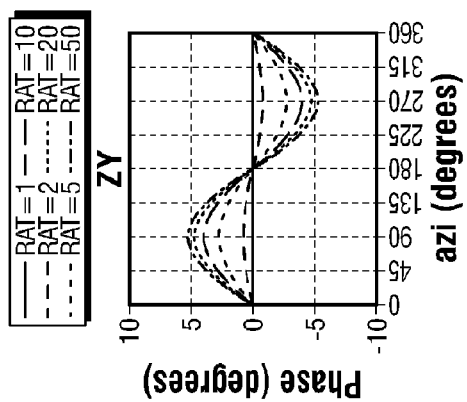
Figure 24B:
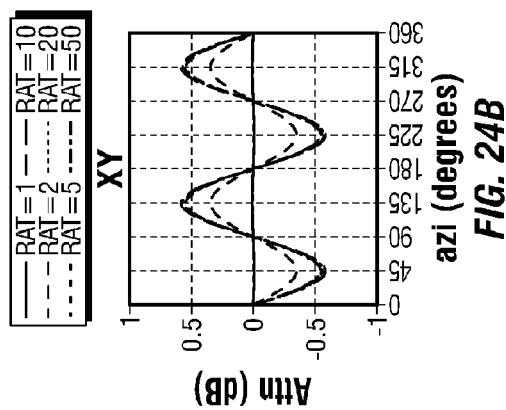
Figure 23I:
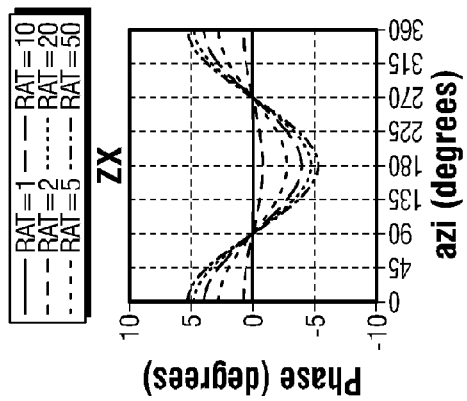
Figure 24C:
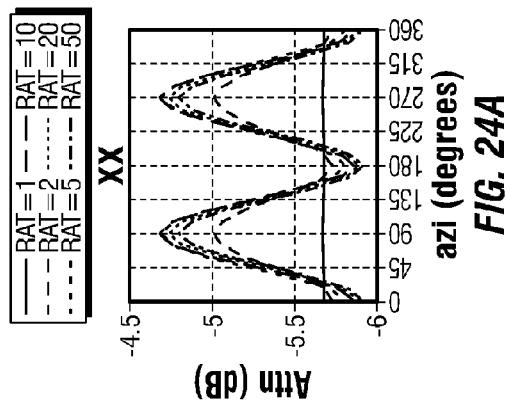
Figure 24D:
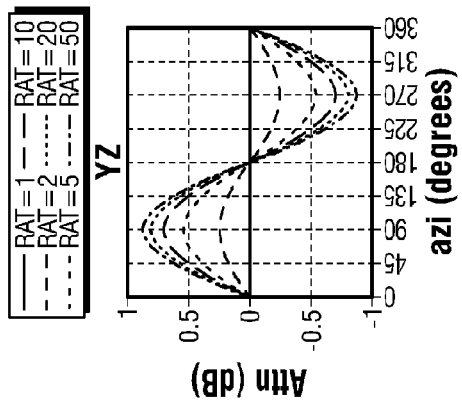
Figure 24E:
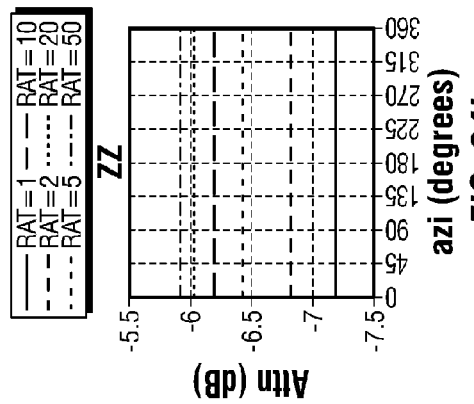
Figure 24F:
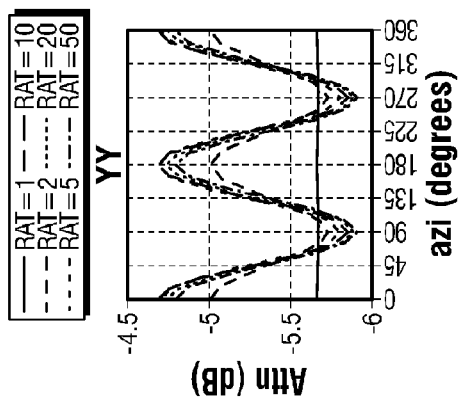
Figure 24G:
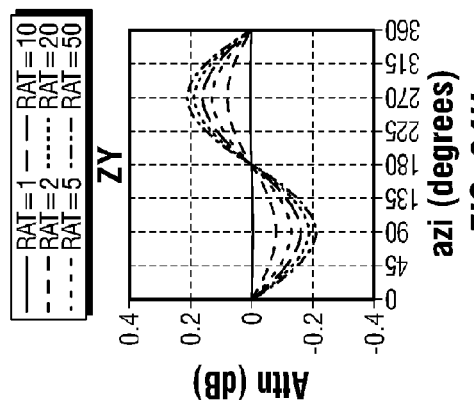
Figure 24H:
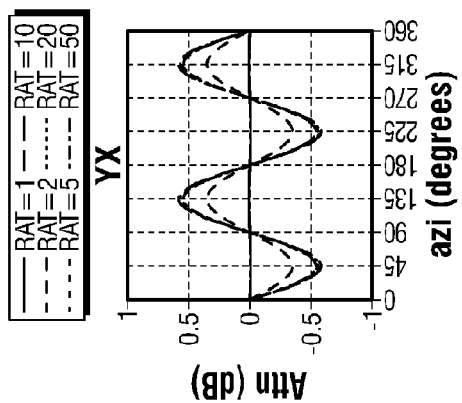
Figure 24I:
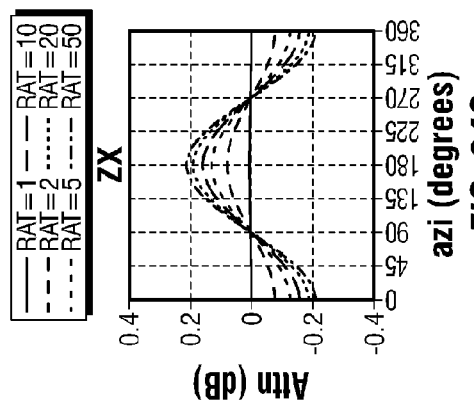

FIG. 15 is another example of a shield slot pattern. In this embodiment, each coil is tilted 45 degrees with respect to the tool axis. The three co-located antennas are azimuthally rotated by 120 degrees relative to each other although the offset angle is not limited to 120 degrees. Note that the vertical extent of this shield is less than that of FIG. 12a or 14a. This is due to the tilt angle.

It was noted above that a preferred antenna configuration is one in which three co-located antenna coils are azimuthally rotated by 120 degrees and tilted at an angle of arctan √2 (which is approximately 54.74 degrees). In that case, the vector potential of the magnetic field of a tilted coil at a point sufficiently far away, i.e., at a distance r, from the magnetic source can be expanded into an infinite series involving inverse powers of that distance r. Higher power terms are generally neglected. If the first three terms of the expansion are kept, the third term is found to be zero at the particular angle arctan √2. Thus, dipole coils tilted at that angle can produce a cleaner dipole field.

As alluded to above, alternative embodiments for measuring the LWD triaxial resistivity tool response are possible. Certain tool configurations allow for the generation of one or more combinations of tool responses that remove the gains of the receivers and the transmitters. One such tool, a triaxial propagation tool, preferably operates at multiple frequencies, in the MHz range, to cover the conductivity range from 0.1 ohm-m to 1000 ohm-m. However, such a tool potentially has a limited depth of investigation and limited conductivity range per frequency. This is not an ideal configuration for geo-steering, but may be adequate for formation evaluation near the tool. This response may be inverted for Rh, Rv, dip, azimuth, and bed thickness. This information may be used to build a formation model for inputs to the lower frequency, longer spacing tool described above. Each measurement spacing will involve two receiver antennas and two transmitters.

An alternative tool configuration comprises a triaxial induction tool. The triaxial induction tool generally comprises multiple main (transmitters and receivers) coils and bucking coils, all spaced along the tool's longitudinal axis, and generally operates at a single frequency, typically around 25 kHz. The induction tool typically has one or more arrays, wherein each array comprises a transmitter, a receiver, and a buck, and wherein the signal received by the receiver is subtracted from the signal received by the buck or vice versa. In an LWD environment borehole corrections and invasion information are not needed to correct the raw measurements of the deeper measurements, thus one would need less spacing. The resistivity range of operation for an induction measurement is generally from 0.1 to 500 ohm-m, and the depth of investigation will be on the order of the spacing. This measurement is ideal for geo-steering, formation geology, and formation evaluation. Each measurement spacing will involve two receiver antennas and a single transmitter antenna. This yields a net decrease in the number of antennas compared to the propagation measurements since only one triaxial transmitter will be needed for all the triaxial receiver spacings.

Various techniques exist for making measurements using magnetic dipole moment transmitters and receivers for a transverse anisotropic medium with plane-parallel layers that are transversely isotropic (TI anisotropy). Preferably, to make such measurements, the thickness of the bed is greater than the transmitter-receiver spacing for a given transmitter-receiver pair. For example, for a transmitter carrying a current I, the voltage V measured at the receiver can be expressed in terms of tensor-transfer impedance $\bar{\bar{Z}}_{RT}$:

$$V = I u_R \cdot \bar{\bar{Z}}_{RT} \cdot u_T, \quad \text{Eq 2}$$

where $u_R$ and $u_T$ are a unit vectors along the receiver and transmitter coil axes, respectively. The transfer impedance $\bar{\bar{Z}}_{RT}$ has the following symmetry property:

$$\bar{\bar{Z}}_{RT} = \bar{\bar{Z}}_{TR}^T,$$

where the superscript $T$ denotes the transpose.

Two sets of orthogonal unit vectors are introduced $u_x$, $u_y$, $u_z$, for the formation, and $u_X$, $u_Y$, $u_Z$, for the tool coordinates, with $u_Z$ along the axis of symmetry of the tool. The z-axis is perpendicular to the layers, oriented upward. The tool axis is confined to the x-z plane (i.e., the formation azimuth is zero). The formation dip angle is denoted by α, so that the formation system with respect to the tool system is given by:

$$u_X = u_x \cos \alpha + u_z \sin \alpha$$

$$u_Y = u_y$$

$$u_Z = -u_x \sin \alpha + u_z \cos \alpha \quad \text{Eq. 3}$$

The symmetrized measurement in the tool coordinates can be transformed or rotated to formation coordinates as follows:

$$V_{XX} = I_X u_X \cdot \bar{\bar{Z}}_{RT} \cdot u_X \quad \text{Eq. 4}$$
$$V_{XY} = I_X u_X \cdot \bar{\bar{Z}}_{RT} \cdot u_Y$$
$$V_{XZ} = I_X u_X \cdot \bar{\bar{Z}}_{RT} \cdot u_Z$$

$$V_{YX} = I_Y u_Y \cdot \bar{\bar{Z}}_{RT} \cdot u_X \quad \text{Eq. 5}$$
$$\ldots$$
$$V_{ZZ} = I_Z u_Z \cdot \bar{\bar{Z}}_{RT} \cdot u_Z$$

Note that all the off-diagonal terms with the subscript $_Y$ are zero due to the tool being confined to the xz-plane. Now we can express the voltage in the formation coordinates for all nine terms of the tensor:

$$V_{XX} = I_X(u_x\cos\alpha + u_z\sin\alpha) \cdot \overline{\overline{Z}}_{RT} \cdot (u_x\cos\alpha + u_z\sin\alpha) \quad \text{Eq. 6}$$

$$V_{XY} = I_X(u_x\cos\alpha + u_z\sin\alpha) \cdot \overline{\overline{Z}}_{RT} \cdot u_y = 0$$

$$V_{XZ} = I_X(u_x\cos\alpha + u_z\sin\alpha) \cdot \overline{\overline{Z}}_{RT} \cdot (-u_x\sin\alpha + u_z\cos\alpha)$$

...

$$V_{ZZ} = I_X(-u_x\sin\alpha + u_z\cos\alpha) \cdot \overline{\overline{Z}}_{RT} \cdot (-u_x\sin\alpha + u_z\cos\alpha)$$

For the triaxial co-located tool configuration shown in FIG. 16, which has two transmitters and two receivers placed symmetrical about the tool origin and along its axis, we can express the transfer impedance for the uphole transmitter $T_1$ and uphole receiver $R_1$ as:

$$\overline{\overline{z}}_{11} = \overline{\overline{G}}_{T1}\overline{\overline{Z}}_{11}\overline{\overline{G}}_{R1}, \quad \text{Eq. 7}$$

where $\overline{\overline{G}}_{T1}$ and $\overline{\overline{G}}_{R1}$ are the diagonal complex gain matrices for $T_1$ and $R_1$, respectively, and $\overline{\overline{Z}}_{11}$ is the transfer impedance for $T_1$ and $R_1$, respectively. Similarly, we can express the transfer impedance for other possible combinations:

$$\overline{\overline{z}}_{12} = \overline{\overline{G}}_{T1}\overline{\overline{Z}}_{12}\overline{\overline{G}}_{R2},$$

$$\overline{\overline{z}}_{21} = \overline{\overline{G}}_{T2}\overline{\overline{Z}}_{21}\overline{\overline{G}}_{R1}, \text{ and}$$

$$\overline{\overline{z}}_{22} = \overline{\overline{G}}_{T2}\overline{\overline{Z}}_{22}\overline{\overline{G}}_{R2}.$$

Next, we can combine these measurements as the product of the near, inverse transfer impedance and the far transfer impedance for a downwardly propagating wave:

$$T_d = (\overline{\overline{z}}_{11})^{-1}\overline{\overline{z}}_{12}$$

and for an upwardly propagating wave:

$$T_u = (\overline{\overline{z}}_{22})^{-1}\overline{\overline{z}}_{21}.$$

To remove the sensor gains resulting from sensor geometry and electronic variation, we can combine $T_d$ and the transpose of $T_u$ term by term:

$$M_1(\alpha) = T_d * T_u^T = (\overline{\overline{z}}_{11})^{-1}\overline{\overline{z}}_{12} * [(\overline{\overline{z}}_{22})^{-1}\overline{\overline{z}}_{21}]^T \quad \text{Eq. 8}$$

For the special case of Eq. 8 when the relative dip is zero or where $\alpha = 0$ in Eq 6, we have:

$$M_1(\alpha = 0) = \begin{pmatrix} \frac{Z_{x_1x_2}Z_{x_2x_1}}{Z_{x_1x_1}Z_{x_2x_2}} & 0 & 0 \\ 0 & \frac{Z_{y_1y_2}Z_{y_2y_1}}{Z_{y_1y_1}Z_{y_2y_2}} & 0 \\ 0 & 0 & \frac{Z_{z_1z_2}Z_{z_2z_1}}{Z_{z_1z_1}Z_{z_2y_2}} \end{pmatrix}.$$

Note that the ZZ-term is just the usual axial response upon taking the logarithm. Likewise, the other diagonal terms could be handled in the same fashion to remove the undesired gains. For the special case of Eq. 8 when the relative dip is non-zero in Eq. 6, we have:

$$\begin{pmatrix} \frac{(Z_{x_1x_2}Z_{z_1z_1} - Z_{x_1z_1}Z_{z_1x_2})}{(Z_{x_2x_1}Z_{z_2z_2} - Z_{x_2z_2}Z_{z_2x_1})} & 0 & \frac{(Z_{x_2x_1}Z_{z_2z_2} - Z_{x_2x_2}Z_{z_2x_1})}{(Z_{x_1x_1}Z_{z_1z_1} - Z_{x_1z_1}Z_{z_1x_1})} \\ \frac{(Z_{x_2x_2}Z_{z_2z_2} - Z_{x_2z_2}Z_{z_2x_2})}{0} & \frac{Z_{y_1y_2}Z_{y_2y_1}}{Z_{y_1y_1}Z_{y_2y_2}} & \frac{(Z_{x_1z_1}Z_{z_1z_2} - Z_{x_1z_2}Z_{z_1z_1})}{(Z_{x_1x_1}Z_{z_1z_1} - Z_{x_1z_1}Z_{z_1x_1})} \\ \frac{(Z_{x_1x_1}Z_{z_1z_2} - Z_{x_1z_2}Z_{z_1x_1})}{(Z_{x_2x_2}Z_{z_2z_2} - Z_{x_2z_2}Z_{z_2x_1})} & 0 & \frac{(Z_{x_2x_2}Z_{z_2z_1} - Z_{x_2z_1}Z_{z_2x_2})}{(Z_{x_1x_1}Z_{z_1z_1} - Z_{x_1z_1}Z_{z_1x_1})} \\ & & \frac{(Z_{x_2x_2}Z_{z_2z_2} - Z_{x_2z_2}Z_{z_2x_2})}{(Z_{x_2x_2}Z_{z_2z_2} - Z_{x_2z_2}Z_{z_2x_2})} \end{pmatrix}.$$

In this case, the XX and ZZ terms are more complex, but the attenuation and phase responses of these terms are as expected. The XZ and ZX terms do not behave quite as expected since we multiplied by the transpose of the $T_u$ term, however those terms do have large responses when approaching a horizontal bed at high dip.

There are many ways to manipulate these tensors and another option is to matrix multiply $T_d$ and $T_u$:

$$M_2 = T_d * T_u = (\overline{\overline{z}}_{11})^{-1}\overline{\overline{z}}_{12} * (\overline{\overline{z}}_{22})^{-1}\overline{\overline{z}}_{21} \quad \text{Eq. 9}$$

For the special case of Eq. 8 when the relative dip is non-zero in Eq. 6, we have:

$$M_2(\alpha \neq 0) = \begin{pmatrix} A & 0 & D\frac{gz_1}{gx_1} \\ 0 & B & 0 \\ E\frac{gx_1}{gz_1} & 0 & C \end{pmatrix}.$$

There we see that the off-diagonal terms have a receiver gain ratio that can be measured using the fact that the tool rotates. Thus, every 90 degree rotation of the tool, the gain ratio of gx/gz is equal to gy/gz and so on. Alternatively, we can multiply the xz-term by the zx-term.

We can calculate the attenuation and phase from the formulation:

$$\ln\sqrt{M_2} = \quad \text{Eq. 10}$$

$$\ln\left(\sqrt{\overline{\overline{z}}_{1,2}(\overline{\overline{z}}_{11})^{-1} * \overline{\overline{z}}_{21}(\overline{\overline{z}}_{22})^{-1}}\right) = \frac{\ln[(\overline{\overline{z}}_{11})^{-1}\overline{\overline{z}}_{12}]}{2} + \frac{\ln[(\overline{\overline{z}}_{22})^{-1}\overline{\overline{z}}_{21}]}{2}$$

This is obtained by taking the matrix natural log of the square root of Eq. 9 To do that, we first perform the element multiplication in Eq. 8. Then we take the element square root, and finally the matrix natural logarithm to determine a harmonic average for borehole compensation.

We modeled the triaxial tool shown in FIG. 16. Plots of the elements of Eq. 10 and the tensor with azimuth set to zero with varying Rh, Rv, and dip were studied using a point dipole formulation for transfer impedance for a formation with dip, azimuth, Rh, and Rv. See FIGS. 17-24 for some characteristic responses of Td. The attenuation and phase of tensor Td was modeled for the case of azimuth=0 degrees. The tool was modeled for frequencies of 400 kHz and 2 MHz with transmitter-center receiver spacing of 30 (36) inches and a receiver to receiver spacing of 12 (6) inches. The attenuation and phase have good sensitivity versus anisotropy and dip, but these are shallow measurements due to the high frequencies in skin effect contribution to the voltage.

Figure 25:
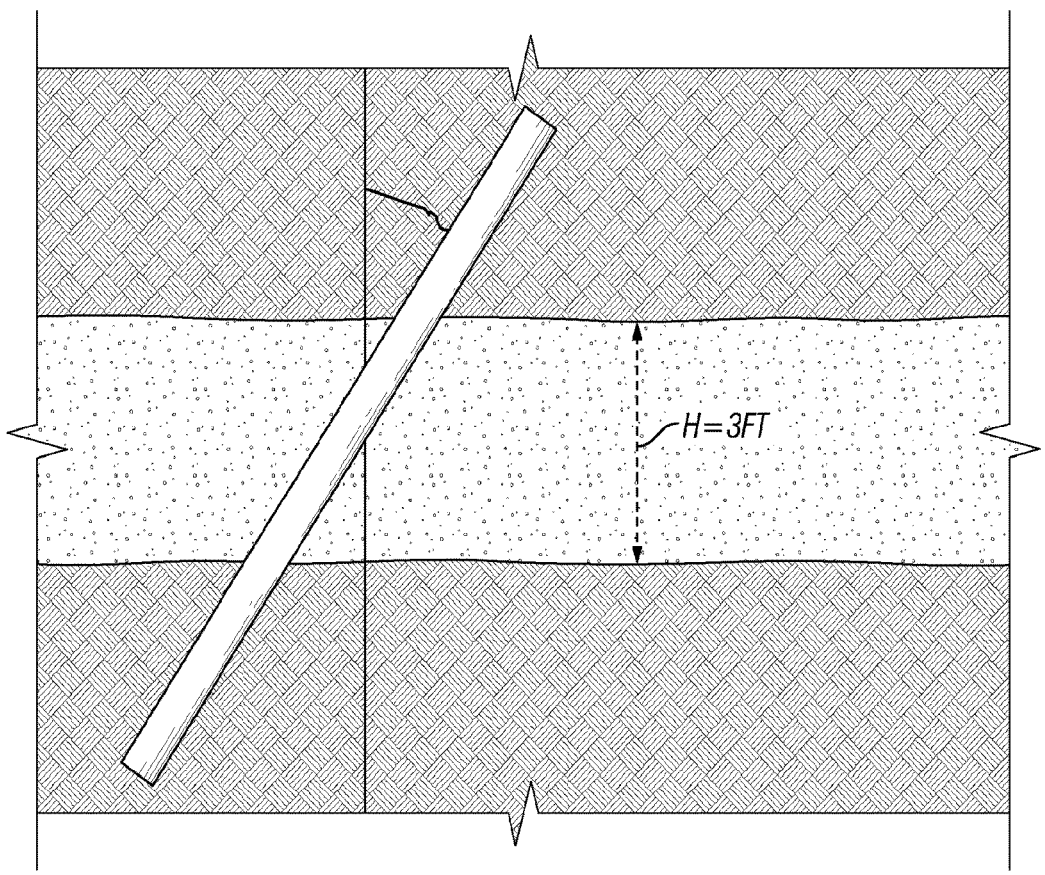
FIG. 25 shows a three layer anisotropic formation model, in accordance with the present disclosure.
Figure 26A:
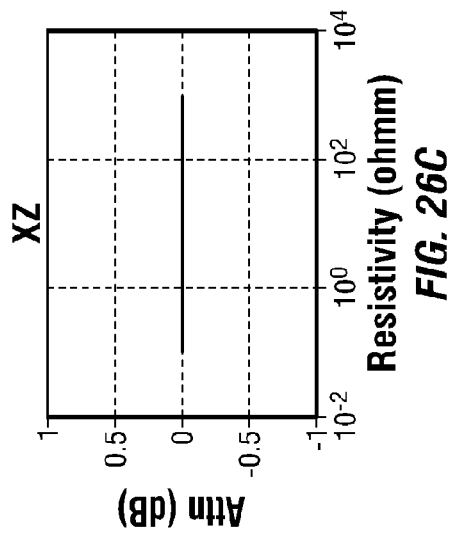
FIG. 26 shows a 400 kHz attenuation response to an infinite homogeneous formation, in accordance with the present disclosure.
Figure 26B:
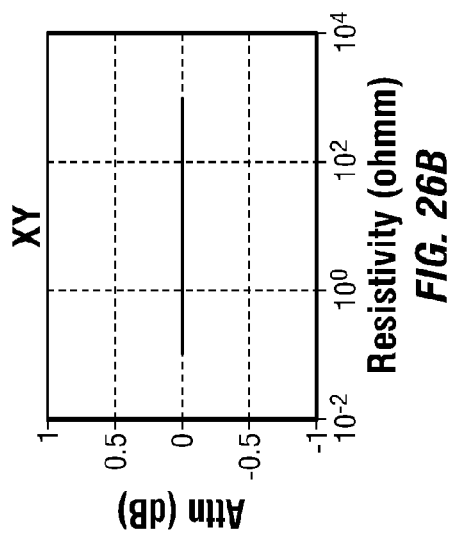
Figure 26C:
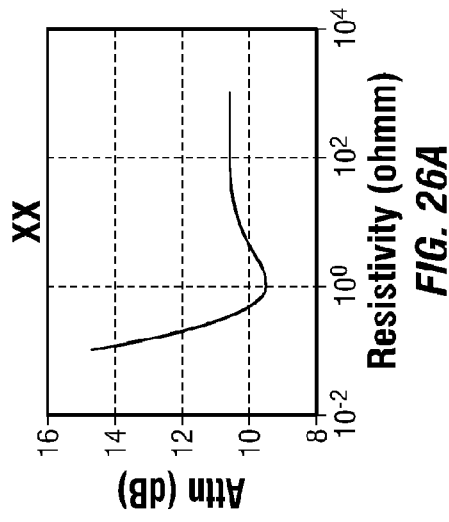
Figure 26D:
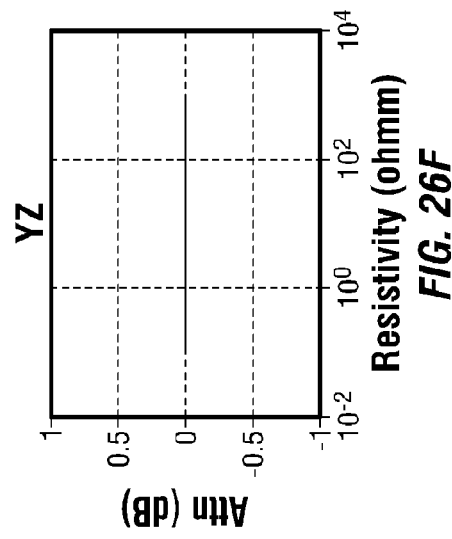
Figure 26E:
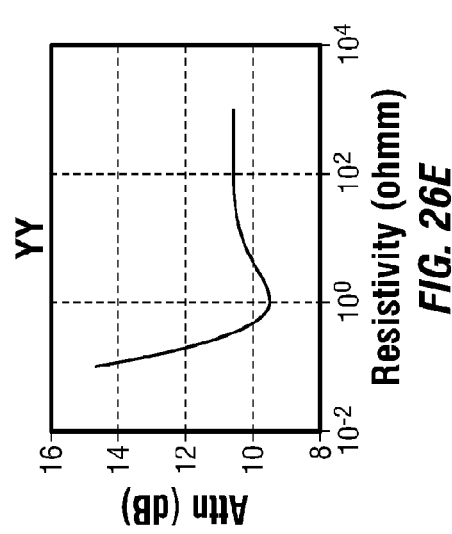
Figure 26F:
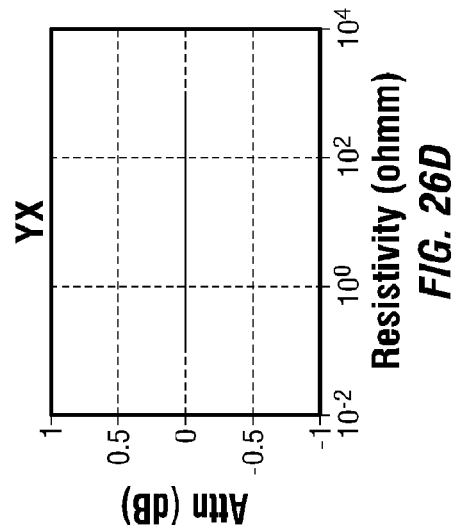
Figures 31D, 31E, 31F, 31G, 31H, 31I:
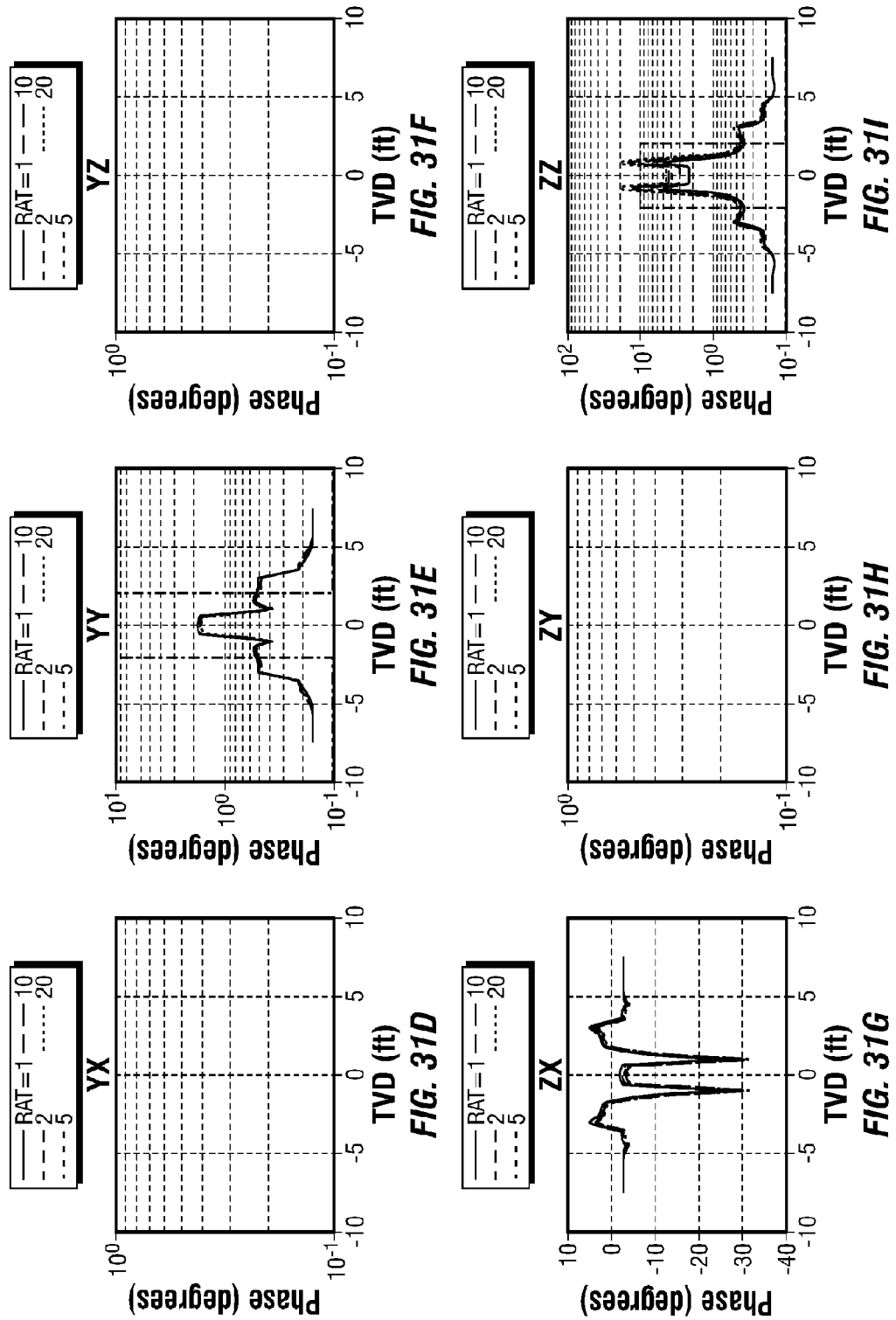
FIG. 31 shows the phase response versus anisotropy ratio operating at 400 kHz in 60° dipping three-layer formation, in accordance with the present disclosure.
Figures 33D, 33E, 33F, 33G, 33H, 33I:
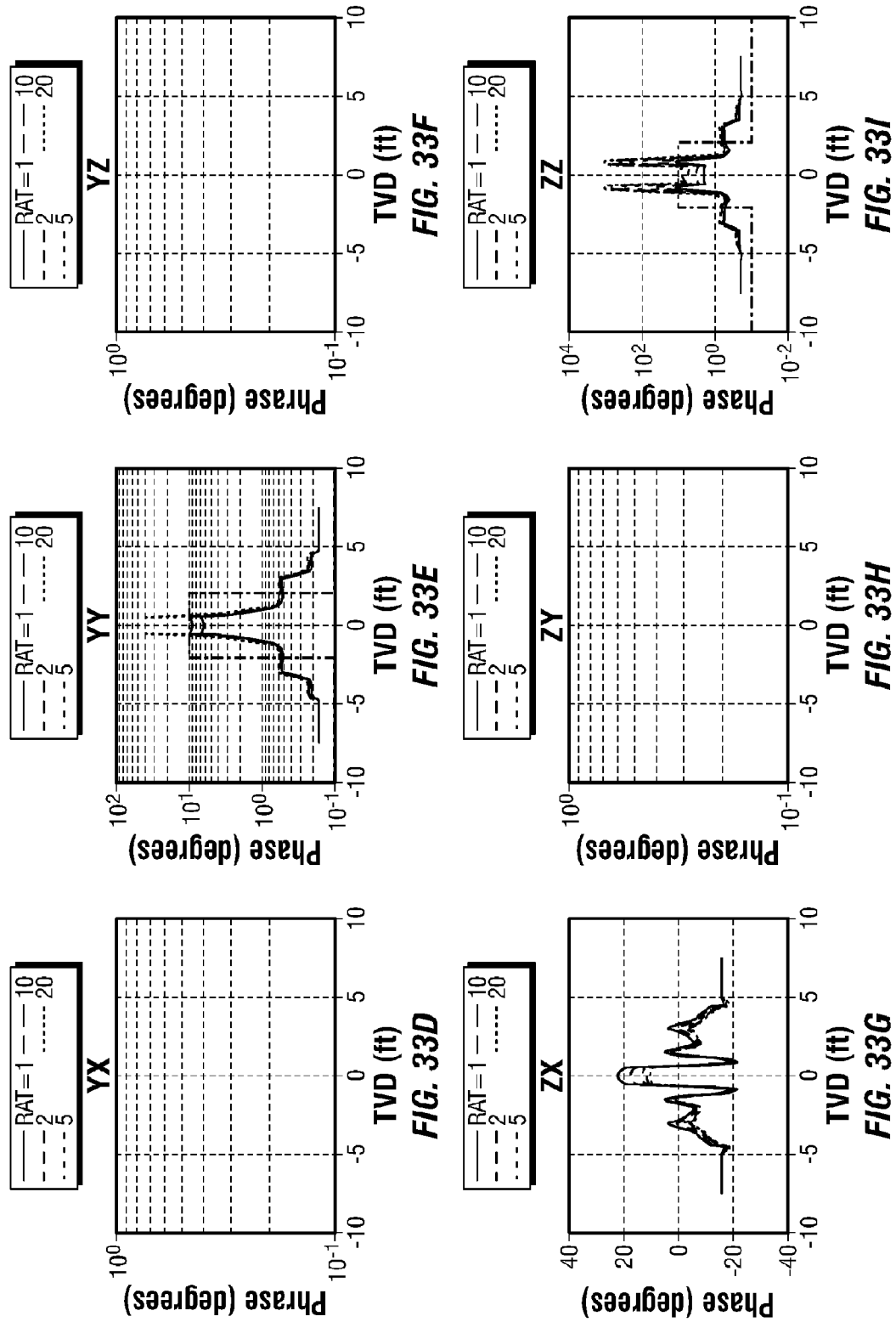
FIG. 33 shows the phase response versus anisotropy ratio operating at 2 MHz in 60° dipping three-layer formation, in accordance with the present disclosure.
Figure 38A:
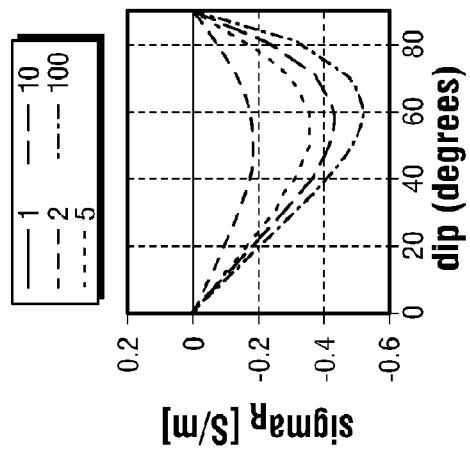
FIG. 38 shows the 72 inch tri-axial induction response to an azi=0, Rh=1 ohm-m formation, in accordance with the present disclosure.
Figure 38C:
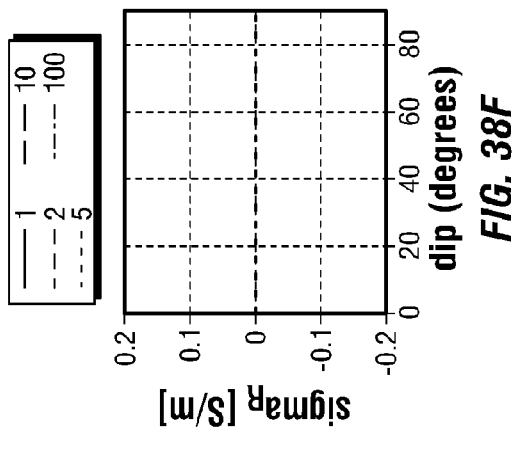
Figure 38B:
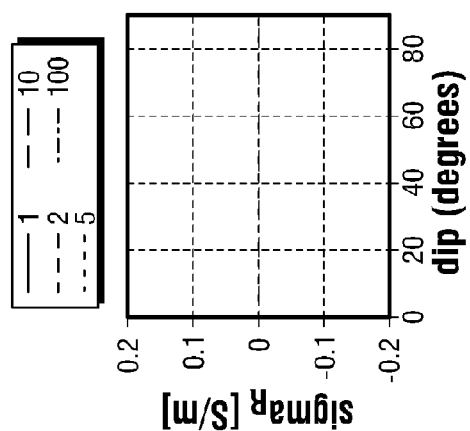
Figure 38E:
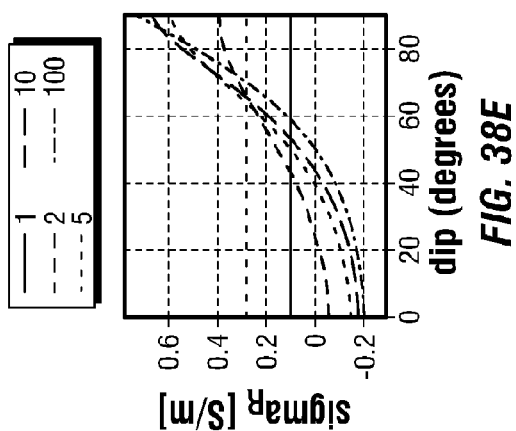
Figure 38D:
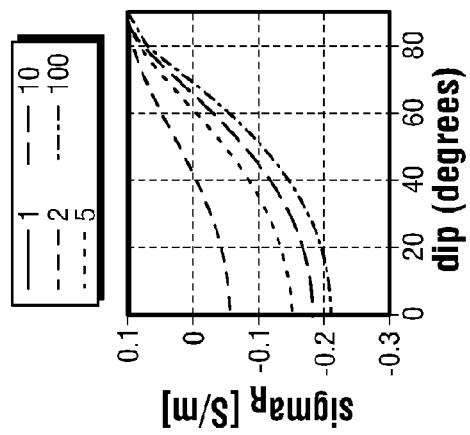
Figure 38F:
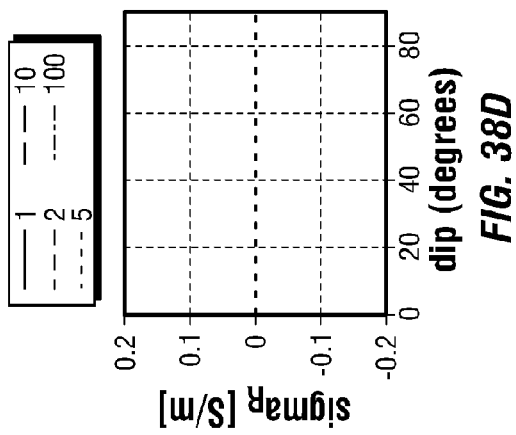
Figure 38I:
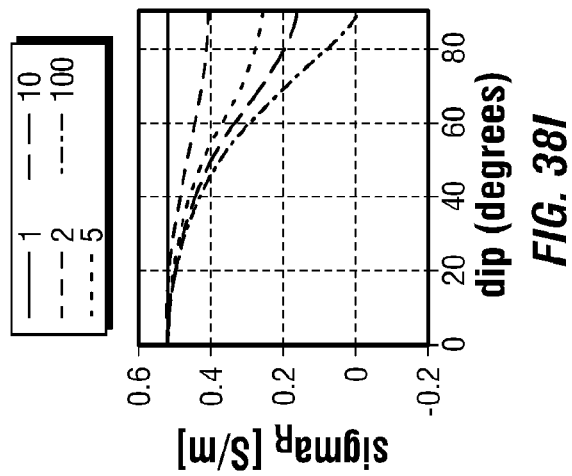
Figure 38H:
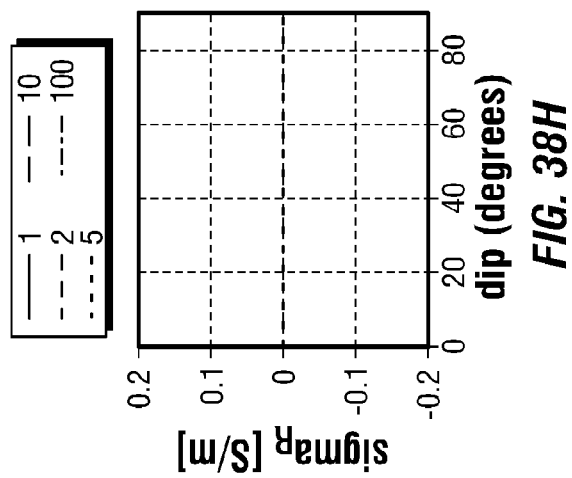
Figure 38G:
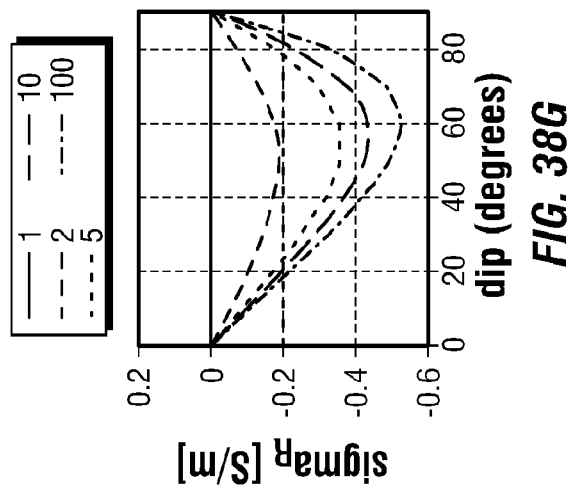

The tool attenuation and phase shift response using $\ln\sqrt{M_2}$ while logging through a three-bed formation having varying dip and anisotropy can be modeled. A simple exemplary formation model is shown in FIG. 25. The resistivity attenuation and phase transformations are plotted for the tool operating at 400 kHz and 2 MHz in an infinite homogeneous formation in FIGS. 26-29. Note that the XX resistivity transforms are doubled valued, therefore we will only make the transforms from the low resistivity to the minimums.

Next we plot the responses of the tool logging through three beds at a dip of 60 degrees and as a function of anisotropy ratios of 1, 2, 5, 10, and 20. The diagonal terms XX, YY, and ZZ are in units of resistivity or ohm-m, while the XZ and ZX terms are in units of dB. The resistivity responses are shown in FIGS. 30-33.

Next we plot the responses of the tool logging through three beds as a function of dip for an anisotropy ratio of two. The diagonal terms XX, YY, and ZZ are in units of resistivity or ohm-m, while the XZ and ZX terms are in units of dB. The resistivity responses are shown in FIGS. 34-37.

The tensor responses for the triaxial induction tool in wireline are well known. We can also measure the apparent conductivity tensor $\sigma_{app}^k$ for the k-th spacing and invert a 1D-dipping layered earth model for the Rh_k, Rv_k, dip_k, azi_k, and bed thickness:

$$\sigma_{app}^k = \begin{pmatrix} \sigma_{xx} & \sigma_{xy} & \sigma_{xz} \\ \sigma_{yx} & \sigma_{yy} & \sigma_{yz} \\ \sigma_{zx} & \sigma_{zy} & \sigma_{zz} \end{pmatrix} \rightarrow Inversion(R_h, R_v, dip, azi, h)$$

The calibration of the triaxial or tensor resistivity tool on the LWD platform for i-th transmitter and the j-th receiver and the k-th spacing cab be functionally expressed as:

$$\sigma_{ijk}^{app} = g^{elec}(T_e) g_{ijk}^{TTL}(\sigma_{ijk}^{meas} - \sigma_{ijk}^{SEC}(T_a))$$

where $\sigma_{ijk}^{app}$ is the calibrated complex apparent conductivity and $g_{ijk}^{TTL}$ is the gain correction defined for a modeled reference tilted test loop as:

$$g_{ij}^{TTL} = \frac{|\sigma_{ijk}^{TTL_{Ref}}|}{|\sigma_{ijk}^{TTL_{Meas}}|}.$$

Figure 40:
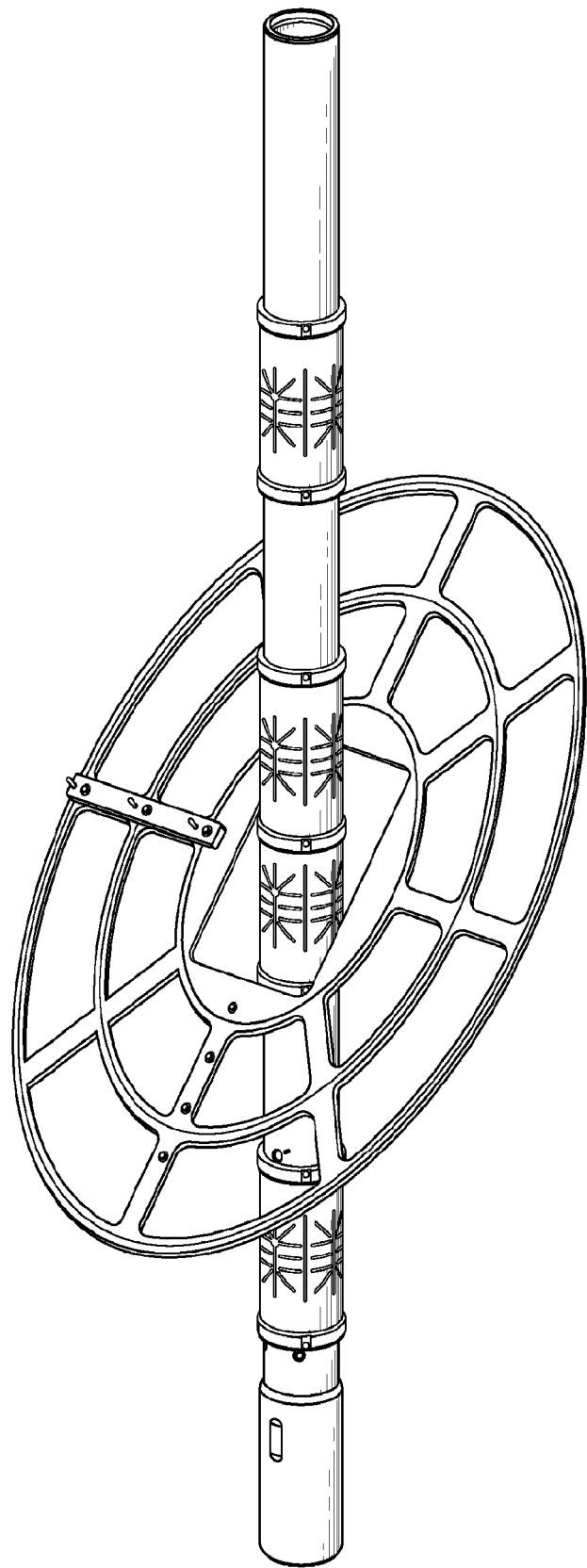
FIG. 40 shows an exemplary tilted test coil on an LWD tensor resistivity tool with antenna spacings, in accordance with the present disclosure.

The modeled tilted test loop response is given by $\sigma_{ijk}^{TTL_{Ref}}$ and the measured tilted test loop response is given by $\sigma_{ijk}^{TTL_{Meas}}$. The tilted test loop is shown in FIG. 40 as it is logged over a triaxial induction LWD tool or put at specified axial and azimuthal positions.

The phase correction is:

$$\Delta\varphi = \mathrm{atan}\left(\frac{\Delta\mathrm{Im}(\sigma_{ij}^{TTL_{Ref}})}{\Delta\mathrm{Re}(\sigma_{ij}^{TTL_{Ref}})}\right) - \mathrm{atan}\left(\frac{\Delta\mathrm{Im}(\sigma_{ij}^{TTL_{Meas}})}{\Delta\mathrm{Re}(\sigma_{ij}^{TTL_{Meas}})}\right)$$

The raw measurement is scaled as:

$$\sigma_{ijk}^{meas} = \frac{\eta_{jk}}{K_{ijk}} \frac{V_{R_{jk}}}{I_{T_i}}$$

where $\eta_{jk}$ is the electronics gain/phase correction, $K_{ijk}$ is a sensitivity factor, $V_{R_{jk}}$ is the voltage on the receiver, and $I_{T_i}$ is the transmitter current. The background correction, $\sigma_{ijk}^{SEC}(T)$, is given by:

$$\sigma_{ijk}^{SEC}(T) = \frac{\eta_{jk}}{K_{ijk}} \frac{V_{jk}^{SEC}(T)}{I_i(T)}.$$

Figures 39A, 39B:
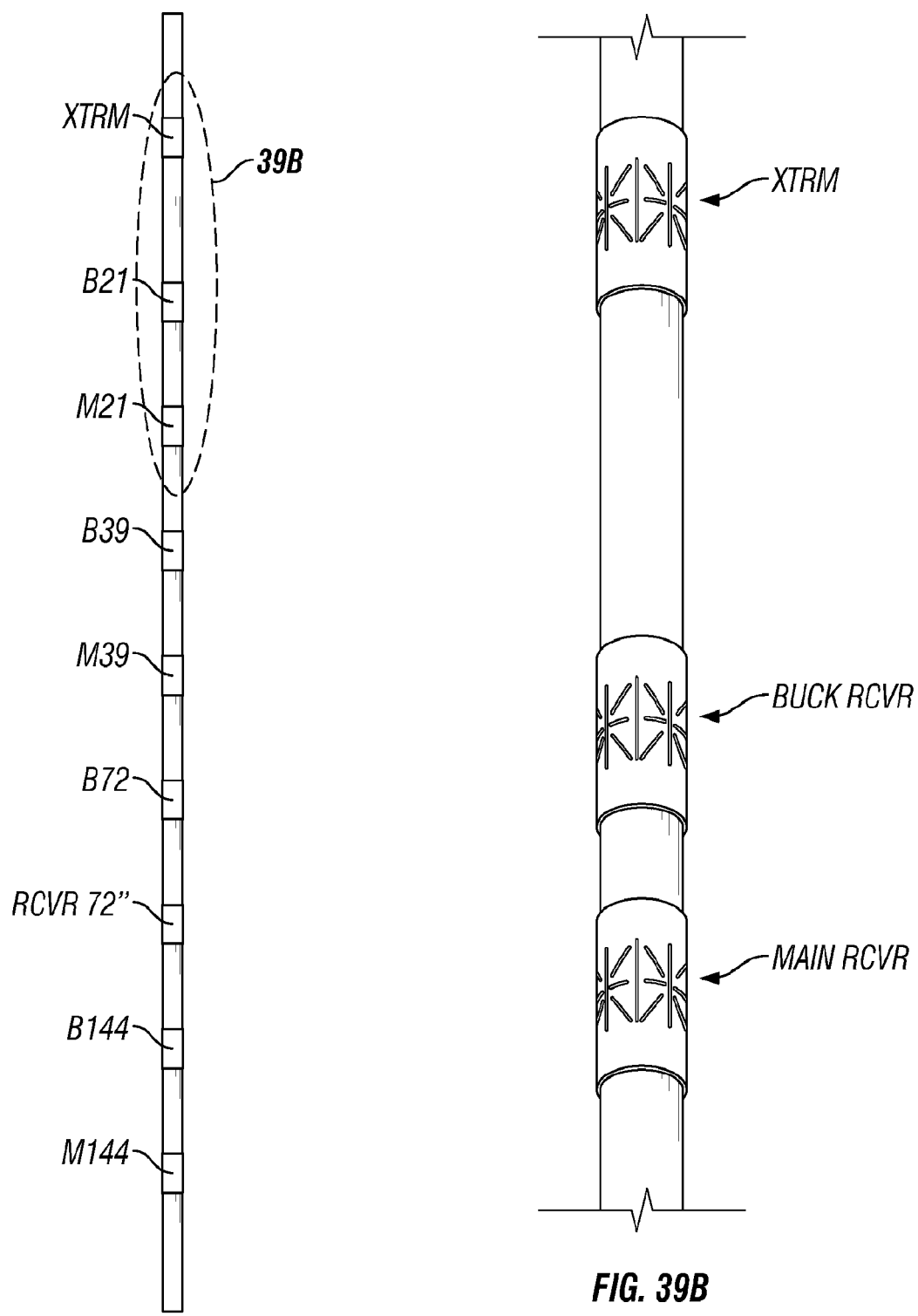
FIG. 39 shows an exemplary LWD tensor resistivity tool with antenna spacings, in accordance with the present disclosure.

A test loop is used to either transmit or receive a test signal for each transmitter, receiver, and bucking coil on an LWD induction tool. The gain can then be determined for each of those antennas. The temperature offset is acquired by slowly heating the tool and then fitting the tool response to a nth-order polynomial fit. The coefficients are then stored downhole, as are the gains, to correct or calibrate the tool's raw measurements. Thus, the gain-corrected receiver signal and the gain-corrected buck signal can be subtracted one from the other to provide an LWD induction measurement. The suggested LWD tenser resistivity tool with three spacings is shown below in FIG. 39. A typical tool response to a zero azimuth formation versus dip and anisotropy is shown in FIG. 38. Again, there is good sensitivity to anisotropy and dip.

It should be appreciated that while the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An electromagnetic logging while drilling method to compute a property of a subterranean formation, the method comprising:
   (a) rotating an electromagnetic logging tool in a borehole penetrating the subterranean formation, the electromagnetic logging tool including one or more arrays, wherein the arrays comprise first and second co-located triaxial transmitters and first and second co-located triaxial receivers spaced apart from one another along a longitudinal axis of the electromagnetic logging tool;
   (b) applying an alternating electrical current to each of the transmitter antenna coils in each of the triaxial transmitters to transmit corresponding electromagnetic energy into the subterranean formation while rotating in (a);
   (c) causing each of the receiver antenna coils in each of the triaxial receivers to measure a voltage corresponding to the electromagnetic energy transmitted in (b) to obtain electromagnetic measurements of the subterranean formation;
   (d) forming impedance matrices from the voltages measured in (c), the impedance matrices including a first transfer impedance matrix $\bar{z}_{11}$ for the first transmitter and the first receiver, a second transfer impedance matrix $\bar{z}_{12}$ for the first transmitter and the second receiver, a third transfer impedance matrix $\bar{z}_{21}$ for the second transmitter and the first receiver, and a fourth transfer impedance matrix $\bar{z}_{22}$ for the second transmitter and the second receiver;
   (e) combining the impedance matrices formed in (d) to compute a matrix of gain-corrected measurements, wherein combining the impedance matrices comprises (i) computing a first product of an inverse of the first transfer impedance and the second transfer impedance and a second product of an inverse of the fourth transfer impedance and the third transfer impedance; and (ii) combining the first product with a transpose of the second product to compute the matrix of gain-corrected measurements; and (f) inverting the matrix of gain-corrected measurements computed in (e) to compute the property of the subterranean formation, wherein the property includes at least one of a horizontal resistivity, a vertical resistivity, a dip, an azimuth, and a bed thickness of the subterranean formation.

2. The method of claim 1, wherein the electromagnetic logging tool is rotated with a drill string or a wired drill pipe in (a).

3. The method of claim 1, wherein the first and second triaxial receivers are located between the first and second triaxial transmitters and the distance from one of the transmitters to one of the receivers is substantially equal to the distance from the other transmitter to the other receiver.

4. The method of claim 1, wherein the first and second triaxial transmitters are located between the first and second triaxial receivers and the distance from one of the transmitters to one of the receivers is substantially equal to the distance from the other transmitter to the other receiver.

5. The method of claim 1, wherein the electromagnetic energy is transmitted in (b) at a plurality of different frequencies.

6. The method of claim 1, wherein thirty-six measurements are obtained in (c).

7. The method of claim 1, wherein one of the one or more triaxial transmitters has antennas that are azimuthally offset from antennas comprising one or more of the other triaxial transmitters and/or receivers.

8. The method of claim 1, wherein one or more of the two or more triaxial transmitters and/or one or more of the two or more triaxial receivers each have antennas that are azimuthally separated by 120 degrees and tilted relative to a longitudinal axis of the measurement tool.

9. The method of claim 8, wherein the tilted antennas are tilted at an angle of approximately $\arctan\sqrt{2}$.

10. The method of claim 1, wherein (e) further comprises constructing calibrated measurements using the gain-corrected measurements.

11. The method of claim 1, wherein the forming impedance matrices further comprises arranging the measurements in three-by-three matrices.

12. The method of claim 11, wherein thirty-six measurements are arranged into four matrices.

13. The method of claim 1, wherein the combining the impedance matrices comprises matrix multiplication.

14. The method of claim 1, wherein the first and second products are computed term by term in (e)(i) and wherein the first and second products are combined term by term in (e)(ii) to compute the matrix of gain-corrected measurements.

15. The method of claim 1, further comprising:
(g) geosteering the borehole based on the property of the subterranean formation computed in (f).

16. The method of claim 1, wherein at least one of the first and second triaxial transmitters and/or the first and second triaxial receivers are deployed in a corresponding shield, the shield comprising a cylindrical body having slots therein and one or more island elements bordered by the slots.

17. The method of claim 16, wherein the shield further includes a material disposed in the slots and wherein the shield body is non-conductive and the material disposed in the slots is conductive.

18. The method of claim 16, wherein the shield further includes a material disposed in the slots and wherein the shield body is conductive and the material disposed in the slots is non-conductive.

* * * * *